(12) United States Patent
Gilbert et al.

(10) Patent No.: US 8,609,593 B2
(45) Date of Patent: *Dec. 17, 2013

(54) EXTREMELY LOW RESISTANCE FILMS AND METHODS FOR MODIFYING AND CREATING SAME

(75) Inventors: Douglas J. Gilbert, Flagstaff, AZ (US); Timothy S. Cale, Phoenix, AZ (US)

(73) Assignee: Ambature, Inc., Phoenix, AZ (US)

( * ) Notice: Subject to any disclaimer, the term of this patent is extended or adjusted under 35 U.S.C. 154(b) by 395 days.

This patent is subject to a terminal disclaimer.

(21) Appl. No.: 12/896,873

(22) Filed: Oct. 2, 2010

(65) Prior Publication Data

US 2011/0082042 A1 Apr. 7, 2011

Related U.S. Application Data

(60) Provisional application No. 61/248,130, filed on Oct. 2, 2009.

(51) Int. Cl.
*H01L 39/24* (2006.01)

(52) U.S. Cl.
USPC .......................................... 505/470; 505/434

(58) Field of Classification Search
USPC ................. 505/430, 434, 440, 445, 446, 447, 505/470–477, 410–413; 427/62; 438/2
See application file for complete search history.

(56) References Cited

U.S. PATENT DOCUMENTS

| | | | |
|---|---|---|---|
| 3,119,236 A | 1/1964 | Lutes | |
| 3,421,330 A | 1/1969 | Otter et al. | |
| 3,765,186 A | 10/1973 | Vassilev | |
| 4,843,059 A | 6/1989 | Deslandes et al. | |
| 5,087,605 A | 2/1992 | Hegde et al. | |
| 5,120,707 A | 6/1992 | Maxfield et al. | |
| 5,266,815 A | 11/1993 | Sunami et al. | |

(Continued)

FOREIGN PATENT DOCUMENTS

| | | |
|---|---|---|
| EP | 0301985 | 2/1989 |
| WO | WO 2010/038196 | 4/2010 |

OTHER PUBLICATIONS

International Search Report and Written Opinion dated Jul. 17, 2011 issued in related International Application No. PCT/US2011/031789.

(Continued)

*Primary Examiner* — Colleen Dunn
(74) *Attorney, Agent, or Firm* — Toering Patents PLLC

(57) ABSTRACT

Operational characteristics of an extremely low resistance ("ELR") film comprised of an ELR material may be improved by depositing a modifying material onto appropriate surfaces of the ELR film to create a modified ELR film. In some implementations of the invention, the ELR film may be in the form of a "c-film." In some implementations of the invention, the ELR film may be in the form of an "a-b film," an "a-film" or a "b-film." The modified ELR film has improved operational characteristics over the ELR film alone or without the modifying material. Such operational characteristics may include operating in an ELR state at increased temperatures, carrying additional electrical charge, operating with improved magnetic properties, operating with improved mechanic properties or other improved operational characteristics. In some implementations of the invention, the ELR material is a mixed-valence copper-oxide perovskite, such as, but not limited to YBCO. In some implementations of the invention, the modifying material is a conductive material that bonds easily to oxygen, such as, but not limited to, chromium.

31 Claims, 54 Drawing Sheets

(56) References Cited

U.S. PATENT DOCUMENTS

| | | | |
|---|---|---|---|
| 5,276,398 | A | 1/1994 | Withers et al. |
| 5,280,013 | A | 1/1994 | Newman et al. |
| 5,426,094 | A | 6/1995 | Hull et al. |
| 5,602,079 | A | 2/1997 | Takenaka et al. |
| 5,612,292 | A | 3/1997 | Gupta |
| 5,958,843 | A | 9/1999 | Sakai et al. |
| 6,383,989 | B2 | 5/2002 | Jia et al. |
| 6,516,208 | B1 | 2/2003 | Eden |
| 6,930,875 | B2 * | 8/2005 | Sakashita .................. 361/306.3 |
| 2002/0006877 | A1 | 1/2002 | Chu et al. |
| 2002/0163399 | A1 | 11/2002 | Kang et al. |
| 2003/0099871 | A1 | 5/2003 | Finnemore et al. |
| 2003/0199395 | A1 | 10/2003 | Zhou |
| 2003/0207767 | A1 | 11/2003 | Kim et al. |
| 2004/0033904 | A1 | 2/2004 | Moore et al. |
| 2004/0152599 | A1 | 8/2004 | Rosencwaig |
| 2005/0258548 | A1 | 11/2005 | Ogawa et al. |
| 2006/0108619 | A1 | 5/2006 | Yoshida et al. |
| 2008/0153709 | A1 | 6/2008 | Rupich et al. |
| 2009/0131262 | A1 | 5/2009 | Zhang et al. |
| 2009/0181441 | A1 | 7/2009 | Jin et al. |
| 2010/0066368 | A1 | 3/2010 | Gao et al. |
| 2011/0002832 | A1 | 1/2011 | Hosono et al. |
| 2011/0268918 | A1 | 11/2011 | Gilbert et al. |

OTHER PUBLICATIONS

Aharonovich et al, "Ferromagnetic transition of STRu03 in nanometer thick bilayers with $YBa_2Cu_3O_y$, $La_{1.88}Sr_{0.12}CuO_{4-y}$, Au, and Cr: Signature of injected carders in the pseudogap regime" *Physical Review B 76*, 224514 2007, Dec. 13, 2007.

Norman, "High-temperature superconductivity in the iron pnictides", *Physics* 1, 21 (2008).

Stavrev, "Modelling of High Temperature Superconductors for ACPower Applications", Thesis No. 2579 (2002) [online], Dec. 2002.

International Search Report dated Aug. 6, 2010 issued in corresponding application No. PCT/US2010/037531 filed Jun. 4, 2010.

International Search Report dated Mar. 18, 2011 issued in corresponding application No. PCT/US2010/051238 filed Oct. 2, 2010.

International Search Report dated Mar. 18, 2011 issued in corresponding application No. PCT/US2010/051239 filed Oct. 2, 2010.

International Search Report dated Feb. 1, 2011 issued in corresponding application No. PCT/US2010/051240 filed Oct. 2, 2010.

International Search Report dated Dec. 30, 2010 issued in corresponding application No. PCT/US2010/051241 filed Oct. 2, 2010.

Abramova, G.M. et al "Electrical properties of chromium films", Physics of the Solid State, vol. 41, No. 3, Mar. 1999, p. 341.

Antognazza, L. et al, "Simulation of the behavior of superconducting YBCO lines at high current densities", Physica C 372-376 (2002) 1684-1687.

Atkinson, W. et al, "a-b Plane Anisotropy in YBCO*" Department of Physics & Astronomy, McMaster University Hamilton, Ontario, Canada L8S 4M1; arXiv:cond-mat/9604104v1, Apr. 1996, pp. 1-16.

Bando, Y. et al, "Microstructure and Transport Properties of One-Unit-Cell YBCO Layer" Chinese Journal of Physics, vol. 31, No. 6-11, Dec. 1993, pp. 903-911.

Bando, Yoshichika et al, "Effect of adjacent insulating oxide layers on superconductivity of one unit cell thick $YBa_2Cu_3O_{7-\delta}$ layers in $PrBa_2Cu_3O_{7-\delta}/YBa_2Cu_3O_{7-\delta}$/insulating oxide trilayers", *Journal of Crystal Growth* 150 (1995) pp. 1074-1079.

Barner, J.B. et al, "All a-axis oriented $YBa_2Cu_3O_{7-y}$-$PrBa_2Cu_3O_{7-z}$-$YBa_2Cu_3O_{7-y}$ Josephson devices operating at 80 K" *Appl. Phys. Lett.*, Aug. 5, 1991, vol. 59, No. 6, pp. 742-744.

Bonn, D.A. et al, "Surface Impedance Studies of YBCO", *Czechoslovak Journal of Physics*, vol. 46, Supplement 6, (1996) pp. 3195-3202, 1996.

Bozovic, Ivan "Atomic-Layer Engineering of Superconducting Oxides: Yesterday, Today, Tomorrow" IEEE Transactions on Applied Superconductivity, vol. 11, No. I, Mar. 2001, pp. 2686-2695.

Bozovic, I. et al "Superconductivity in epitaxial $Bi_2Sr_2CuO_6$/$Bi_2Sr_2CaCu_2O_8$ superlattices: The superconducting behavior of ultrathin cuprate slabs" *Journal of Superconductivity*, vol. 5, No. 1, 19-23, (1992).

Bozovic, I et al, "Atomic-Layer Engineering of Cuprate Superconductors", *Journal of Superconductivity*, vol. 7, No. 1, 1994, pp. 187-195.

Bozovic, Ivan et al "Superconducting Oxide Mulfilayers and Superlatlices: Physics, Chemistry, and Nanoengineering" Physica C 235-240 (1994) 178-181.

Bozovic, Ivan et al, "Rheed Studies of a-Axis Oriented $DyBa_2Cu_3O_7$ Films Grown by All-MBE" *Mat. Res. Soc. Symp. Proc.* vol. 502 © 1998 Materials Research Society, pp. 221-226.

Bozovic, Ivan et al, "Reflection High-Energy Electron Diffraction as a Tool for Real-Time Characterization of Growth of Complex Oxides", In: "In Situ Process Diagnostics and Intelligent Materials Processing", edited by O. Auciello and A.R. Krauss (Wiley Science, 2000). pp. 29-56.

Bozovic, I. et al, "Epitaxial Strain and Superconductivity in $La_{2-x}Sr_xCuO_4$ Thin Films" *Physical Review Letters*, 89(10), Sep. 2, 2002, 107001 pp. 1-4.

Bozovic, I. et al "Giant Proximity Effect in Cuprate Superconductors", *Physical Review Letters*, 93(15), Oct. 18, 2004, 157002 pp. 1-4.

Bozovic, I. et al "Experiments with atomically smooth thin films of cuprate superconductors: strong electron—phonon coupling and other surprises" Conferences and symposia, *Physics—Uspekhi* 51 (2), Feb. 2008, pp. 170-180.

Browning, N.D. et al "The atomic origins of reduced critical currents at [001] tilt grain boundaries in $YBa_2Cu_3O_{7-\delta}$ thin films" *Physica C* 294 (1998)183-193.

Butilenko, A. K. et al, "Structural and electrical properties of cathodic sputtered thin chromium films", Surface and Coatings Technology 107 (1998) 197-199.

Cantoni, C. et al, "Anisotropic, non-monotonic behavior of the superconducting critical current in thin $YBa_2Cu_3O_{7-\delta}$ films on vicinal $SrTiO_3$ surfaces", PACS: 74.78.Bz74.25.Qt 68.55.-a 74.25.Sv; Oak RidgeNational Laboratory, Condensed Matter Sciences Division; pp. 1-33.

Chaudhari, P. et al "Critical-Current Measurements in Epitaxial Films of $YBa_2Cu_3O_{7-x}$ Compound" *Physical Review Letters*, vol. 58, No. 25 (Jun. 22, 1987) pp. 2684-2686.

Chen, C.H. et al "Microstructures of $YBa_2Cu_3O_{7-x}$ superconducting thin films grown on a $SrTiO_3$ (100) substrate" *Appl. Phys. Lett.*, vol. 52, No. 10, Mar. 7, 1988, pp. 841-843.

Chen, Y. et al, "Surface structures and energy gap of $YBa_2Cu_3O_y$/$PrBa_2Cu_3O_y$ superlattices and $YBa_2Cu_3O_y$ thin films probed with a scanning tunneling microscope and a scanning force microscope", *Physica C* 255 (1995) 30-36.

Chen, C.H. et al, "Fabrication of high-temperature superconducting Josephson junctions on substrates patterned by focused ion beam" Applied Physics Letters, 73(12), Sep. 21, 1998, pp. 1730-1732.

Chen, Kuen-Lin et al, "Off-axis pulsed laser deposited $YBa_2Cu_3O_{7-\delta}$ thin films for device applications" *Physica C* 372-376 (2002) 1078-1081.

Chen, Z. et al, "Influence of growth temperature on the vortex pinning properties of pulsed laser deposited $YBa_2Cu_3O_{7-x}$ thin films" *Journal of Applied Physics*, 103, 043913 (2008) pp. 1-7.

Cheriet, L. et al, "Internal stresses and antiferromagnetism in evaporated Cr films" *J. Appl. Phys.* 67 (9), May 1, 1990, pp. 5672-5673.

Chin, C.C. et al, "Oxygen content and disorder of a-axis YBaCuO films with very high crystallinity studied by resonant Rutherford backscattering", Physica C 243 (1995) 373-380.

Chopdekar, Rajesh et al, "Transport properties of Cr-patterned $YBa_2Cu_3O_7$ thin films" *Mat. Res. Soc. Symp. Proc.* vol. 689 © 2002 Materials Research Society, E7.5. pp. 1-6.

Christiansen, S. et al, "Structural characterization of superconducting Y-Ba-Cu-O thin films, prepared by pulsed electron beam evaporation" *Journal of Crystal Growth* 166 (1996) 848-853.

Cukauskas, Edward J. et al "Critical current characteristics of $YBa_2Cu_3O_7$ thin films on (110) SrTiO3", *IEEE Transactions on Applied Superconductivity*, vol. 10, No. 3, Sep. 2000, pp. 1649-1656.

(56) References Cited

OTHER PUBLICATIONS

Davidson, Bruce et al, "Broken Particle-Hole Symmetry at Atomically Flat a-Axis $YBa_2Cu_3O_{7-\delta}$ Interfaces", Phys. Rev. Lett. 93, (2004) pp. 1-16.
Deymier, P.A. "Atomistic model of orthorhombic $YBa_2Cu_3O_7$", Phys. Rev. B, vol. 38, No. 10, pp. 6596-6603 (Oct. 1, 1988).
Dimos, D. et al, "Superconducting transport properties of grain boundaries in $YBa_2Cu_3O_7$ bicrystals" *Physical Review B*, vol. 41, No. 7, Mar. 1, 1990, pp. 4038-4049.
Eckstein, J.N. et al "High-Temperature Superconducting Multilayers and Heterostructures Grown by Atomic Layer-By-Layer Molecular Beam Epitaxy", Annu. Rev. Mater. Sci. 1995, 25:679-709.
Edwards, H.L. et al "Energy gap and surface structure of $YBa_2Cu_3O_{7-x}$ probed by scanning tunneling microscopy", Physical Review Letters, vol. 69, 2967-2970 (1992).
Edwards, H.L. et al, "Spatially Varying Energy Gap in the CuO Chains of $YBa_2Cu_3O_{7-x}$ Detected by Scanning Tunneling Spectroscopy", *Physical Review Letters*, Vo. 75, No. 7, Aug. 14, 1995, pp. 1387-1390.
Endo, Tamio et al, "Low-temperature process and growth enhancement of a-oriented $YBa_2Cu_3O_x$ thin films by oxygen plasma" *Physica C* 333 (2000)181-186.
Endo, K. et al "Preparation of YBCO superconducting films by MOMBE", *Physica C* 372-376(2002)pp. 604-607.
Endo, T. et al, "Oxygen partial pressure dependences of α—c phase ratio, crystallinity, surface roughness and in-plane orientation in YBCO thin film depositions by IBS", *Supercond. Sci. Technol.* 16 (2003) pp. 110-119.
Eom, C.B. et al, "Orientation Dependent Resistive Transition Broadening in Magnetic Field of $YBa_2Cu_3O_{7-x}$ Thin Films", *Physica C* 162-164(1989) pp. 605-606.
Eom, C.B. et al, "Epitaxial and Smooth Films of a-Axis $YBa_2Cu_3O_7$" *Science*, New Series, vol. 249, No. 4976 (Sep. 28, 1990), pp. 1549-1552.
Eom, C.B. et al, "Magnetic relaxation, current-voltage characteristics, and possible dissipation mechanisms for high Tc superconducting thin films of Y—Ba—Cu—O", *Physical Review B*, vol. 43, No. 4, Feb. 1, 1991, pp. 3002-3008.
Feng, Y. et al, "Preparation and properties of PMP YBCO bulk with submicrometre $Y_2BaCuO_5$ particles" *Supercond. Sci. Technol.* 13 (2000) 703-708.
Frello, Thomas, "Structural and Superconducting Properties of High-Tc Superconductors" Risø National Laboratory, Roskilde, Denmark, Jan. 2000.
Fuchs, D et al "Growth and characterization of α-axis oriented $YBa_2Cu_3O_{7-x}$ thin films on (100) $LaSrGaO_4$, substrates" *Physica C* 280 (1997) 167-177.
Goldman, Allen M. "High Temperature Superconducting Compounds", Final Report, AFOSR Grant No. 87/0372, Nov. 30, 1992.
Goldman, A.M. "Oxide heterostructures grown by molecular beam epitaxy: Spin injection in superconductors and magnetic coupling phenomena", Applied Surface Science 252 (2006) 3928-3932.
Goldman, A.M. et al "Cuprate/manganite heterostructures" *Journal of Magnetism and Magnetic Materials* 200 (1999) 69-82.
Gomes, M.S. et al, "Investigation of the magnetic phase transition in chromium alloy using electrochemical techniques", J. Phys.: Condens. Matter 10 (1998) 3427-3432.
Goto, T. et al, "Growth of a-axis Oriented $YBa_2Cu_3O_{7-\delta}$ on Ion-Beam Cleaned $LaSrGaO_4$ Substrates" *Physcia C* 341-348 (2000) 2373-2374.
Gozar, A. et al "High-temperature interface superconductivity between metallic and insulating cuprates" Nature, 455, 782-5 (2008)pp. 1-30.
Granozio, F.M. et al "Gibbs energy and growth habits of YBCO" *Journal of Alloys and Compounds* 251 (1997) 56-64.
Hamet, J.F. et al "α-Axis oriented superconductive YBCO thin films Growth mechanism on MgO substrate", *Physica C* 198 (1992) 293-302.

Han et al, "Fabrication of YBCO Coated Conductors on Biaxial Textured Metal Substrate by All-Sputterin", *Journal of Electronic Science and Technology of China*, vol. 6, No. 2, Jun. 2008, pp. 143-146.
Harriott, L.R. et al "High-resolution patterning of high $T_c$ superconductors" *Appl. Phys. Lett.* 55 (5). Jul. 31, 1989, pp. 495-497.
Hockertz, J. et al,"Surface studies on polycrystalline $YB_2Cu_3O_{7-\delta}$ with Auger electron energy-loss spectroscopy", *Z. Phys. B* 90, (1993) pp. 331-339.
Hontsu, S. et al, "$LaSrGaO_4$ substrate gives oriented crystalline $YBa_2Cu_3O_{7-y}$ films" *Appl. Phys. Lett.*, vol. 59, No. 22, Nov. 25, 1991, pp. 2886-2888.
Hontsu, S. et al "a-axis oriented growth of $YBa_2Cu_3O_{7-y}$ films on $LaSrGaO_4$(100) substrates"; *Appl. Phys. Lett.*, Aug. 31, 1992, 61 (9), pp. 1134-1136.
Hontsu, S. et al "Epitaxial growth and properties of $YBa_2Cu_3O_{7-y/LaSrGaO4}$/$YBa_2Cu_3O_{7-y}$ trilayer structures" *Appl. Phys. Lett.* 64 (6), Feb. 7, 1994, pp. 779-781.
Hossian, M.A. et al, "In situ doping control of the surface of high-temperature superconductors", Nature Physics, vol. 4, Jul. 2008; www.nature.com/naturephysics 527-531.
Hua, J. et al, "Vortex pinning by compound defects in $YBa_2Cu_3O_{7-\delta}$", *Physical Review B* 82, 024505 (2010) pp. 1-4.
Isber, S. et al "Superconducting properties of chromium Cr-YBCO grown by Pulsed Laser Deposition" *Journal of Physics: Conference Series* 97 (2008) 012130, pp. 1-4.
Ito, W et al "Influence of Crystal Strain on Superconductivity of α-Axis Oriented $YBa_2Cu_3O_x$ Films" *Jpn. J. Appl. Phys.*, vol. 33 (1994) pp. 5701-5707.
Jin, I. et al "Fabrication of HTS Josephson Junctions on substrates Prepared by Focused Ion Beam system", *IEEE Transactions on Applied Superconductivity*, vol. 9, No. 2, Jun. 1999, pp. 2894-2897.
Jo, W. "Thickness Dependence of Transport Properties of High Rate In-situ Grown $YBa_2Cu_3O_{7-x}$ Coated Conductors" *Journal of the Korean Physical Society*, vol. 45, No. 1, Jul. 2004, pp. 13~17.
Karmanenko, S.F. et al, "Formation and Raman spectroscopic I study of YBCO/STO/YBCO heteroepitaxial structures", *Superwnd. Sci. Techno*, 7 (1994) 727-733.
Kern, et al "High resolution patterning of high $T_c$ superconductors", *J. Vac. Sci. Technol.* B 9 (6), Nov./Dec. 1991, pp. 2874-2878.
Kim, In-Seon et al "Epitaxial growth of YBCO thin films on $Al_2O_3$ substrates by pulsed laser deposition" *IEEE Transactions on Applied Superconductivity*, vol. 9, No. 2, Jun. 1999, pp. 1649-1652.
Kim, S.J. et al "High-quality [1 0 0] and [1 1 0] $YBa_2Cu_3O_{7-\delta}$ films for Josephson tunneling", *Journal of Crystal Growth* 249 (2003) pp. 186-190.
Kim, Min Jae et al "Determination of Maximum Permissible Temperature Rise Considering Repetitive Over-Current Characteristics of YBCO Coated Conductors", *Transactions on Applied Superconductivity*, vol. 18, No. 2, Jun. 2008, pp. 660-663.
King, L.L.H. et al, "In situ deposition of superconducting $YBa_2Cu_3O_{7-x}$ and $DyBa_2Cu_3O_{7-x}$ thin films by organometallic molecular-beam epitaxy" *Appl. Phys. Lett.*, vol. 59, No. 23, Dec. 2, 1991, 3045-3047.
Klemenz, et al "Flat $YBa_2Cu_3O_{7-x}$ layers for planar tunnel-device technology", *Physica C* 265 (1996) 126-134.
Klemenz, C. et al "Film orientation, growth parameters and growth modes in epitaxy of $YBa_2Cu_3O_x$," *Journal of Crystal Growth* 204 (1999) 62-68.
Konishi, M. et al "Homoepitaxial growth of α-axis oriented $YBa_2Cu_3O_{7-\delta}$ thin films on single crystals" *Journal of Crystal Growth* 179 (1997)451-458.
Koyanagi, M. et al, "Study of Electronic States in PBCO Thin Film on A-Axis Oriented YBCO Film", *Physica B* 194-196 (1994) 2155-2156.
Kühle, A. et al, "Smooth $Yba_2Cu_3O_{7-x}$ thin films prepared by pulsed laser deposition in $O_2$/Ar atmosphere" *Appl. Phys. Lett.* 64 (23), Jun. 6, 1994, pp. 3178-3180.
Kuhn, M. et al, "Patterning of YBCO thin films by ion implantation and magneto-optical investigations". *Physica C* 294 (1998) 1-6.
Kummamuru, Ravi K. et al, "Electrical effects of spin density wave quantization and magnetic domain walls in chromium", Nature, vol. 452, Apr. 17, 2008, pp. 859-864.

(56) References Cited

OTHER PUBLICATIONS

Kuzmichev, N.D. et al "YBCO single crystals I-V characteristics nonlinearity and Nelson-Kosterlitz jump" *Physica C* 460-462(2007) 849-850.

Lesueur, J. et al, "Properties of thin and ultra-thin YBCO films grown by a Co-evaporation technique", *Journal of Alloys and Compounds* 251 (1997) 156-160.

Lew, D.J. et al "Transport through 90°[OIO] basal-plane-faced tilt and twist grain boundaries in $YBa_2Cu_3O_{7-x}$ thin films" *Appl. Phys. Lett.* 65 (W), Sep. 19, 1994, pp. 1584-1586.

Li, Y.H. et al, "Microstructural investigation of the growth of $YBa_2Cu_3O_{7-x}/Nd_2CuO_4/YBa_2Cu_3O_{7-x}$ trilayered films on $LaSrGaO_4$ substrates" *Physica C* 265 (1996) 328-334.

Liang, Ruixing. et al, "Preparation and Characterization of Homogeneous YBCO Single Crystals with Doping Level near the SC-AFM Boundary", PACS: 74.72Bk; 74.62bf; 64.60Cn; pp. 1-6.

Liang, Ruixing et al, "Growth and properties of superconducting YBCO single crystals" *Physica C*, 195 (1992)51-58.

Liang, Ruixing et al, "Growth of High Quality YBCO Single Crystals Using $BaZrO_3$ Crucibles" *Physica C: Superconductivity*, vol. 304, Issues 1-2, Aug. 1998, pp. 105-111.

Lintymer, J. et al, "Glancing angle deposition to modify microstructure and properties of sputter deposited chromium thin films", *Surface and Coatings Technology* 174-175 (2003) 316-323.

Logvenov, G. et al "Artificial superlattices grown by MBE: could we design novel superconductors?" *Physica C—Superconductivity and its Applications* 468, 100 (2008) pp. 1-14.

Logvenov, G. et al "Comprehensive study of high-$T_c$ interface superconductivity" *Journal of Physics and Chemistry of Solids* (2009).

Logvenov, G. et al "High-Temperature Superconductivity in a Single Copper-Oxygen Plane" *Science*, vol. 326, Oct. 30, 2009, pp. 699-702.

Lopez-Morales, M.E. et al "Role of oxygen in $PrBa_2Cu_3O_{7-y}$: Effect on structural and physical properties", *Physical Review B*, vol. 41, No. 10, Apr. 1, 1990, pp. 6654-6667.

Lourens, J.A.J. et al, "The electrical resistance of Cr films" *J. Appl. Phys.* 63(8), Apr. 15, 1988, pp. 4282-4284.

Lu, Jain et al, "Characterize the $R_s$—$J_s$ dependence of HTS films" *Physica C* 322 (1999) 186-192.

Luo, C.W. et al, "Anisotropic Characteristics of In-plane Aligned a-axis $YBa_2Cu_3O_{7-\delta}$ Thin Films" *Journal of Low Temperature Physics*, May 2003, vol. 131, Nos. 3/4, pp. 545-549.

Luo, C.W. et al, "Photoexcited carrier relaxation in α-axis oriented $YBa_2Cu_3O_{7-\delta}$ thin films measured by femtosecond time-resolved spectroscopy", *Physica C* 388-389(2003) 477-478.

Ma, Q.Y et al, "Novel method of patterning YBaCuO superconducting thin films" *Appl. Phys. Lett.* 55 (9). Aug. 28, 1989, pp. 896-898.

Ma et al "A planar method for patterning of high-temperature superconducting films and multilayers", *Appl. Phys. Lett.*, Jul. 11, 1994, vol. 65, No. 2, pp. 240-242.

Mahajan, S. et al "Comparison of crystalline and superconducting properties of sputtered a-axis oriented YBCO films on MgO and SrTiO3 substrates" Physica C 225 (1994) 353-357.

Mahajan, S. et al, "Growth and superconductivity of c-axis in-plane aligned $YBa_2Cu_3O_{7-x}$ films fabricated by the self-template method", *Appl. Phys. Lett.*, vol. 65, No. 24, Dec. 12, 1994, pp. 3129-3131.

Marcinkowski, M.J. et al "Electrical Resistivity of Chromium in the Vicinity of the Néel Temperature", *Journal of Applied Physics*, 32(7), Jul. 1961, pp. 1238-1240.

Maruyama, M. et al "Improvement of the Sandwich Junction Properties by Planarization of YBCO Films" *IEEE Transactions on Applied Superconductivity*, vol. 9, No. 2, Jun. 1999, pp. 3456-3459.

Mattson, J. et al "Magnetotransport studies of epitaxial Cr thin films" *J. Appl. Phys.*, vol. 67, No. 9, May 1, 1990, pp. 4889-4891.

Mehanna, El Sayed A. et al "Electrical conduction in thin chromium films" *J. Appl. Phys.*, vol. 61, No. 8, Apr. 15, 1987, pp. 4273-4274.

Meyers, K.E. "Development of High Temperature Superconducting Josephson Junction Device Technology" Final Report (Jan. 1996-Jan. 1998) DuPont Superconductivity SF 298 / SPIE vol. 2697, pp. 160-171.

Misat, S. et al, "Investigation of the electrical dissipation properties of in-plane aligned α-axis YBCO films grown on (100) $LaSrGaO_4$ substrates" *Physica C* 331 (2000) 241-253.

Mishra, S.K. et al, "Lithographic Patterning of Superconducting YBCO Films", Journal of Superconductivity, vol. 5, No. 5, 1992, pp. 445-449.

Misra, A. et al "Electrical resistivity of sputtered Cu/Cr multilayered thin films", *Journal of Applied Physics*, vol. 85, No. 1 (Jan. 1, 1999), pp. 302-309.

Miyazawa, Shintaro et al "Atomic graphoepitaxy: A growth model for c-axis in-plane-aligned, a-axis oriented $YBa_2Cu_3O_x$ thin films", *Appt. Phys. Lett.*, vol. 64, No. 16, Apr. 18, 1994, pp. 2160-2162.

Muir, W.B. et al, "Electrical Resistance of Single-Crystal Single-Domain Chromium from 77 to 325° K", *Phys. Rev. B* 4, (1971) pp. 988-991.

Mukaida, Masashi et al "In-plane alignment of a-axis oriented YBa2Cu3Ox thin films" Appl. Phys. Lett. 63 (7), Aug. 16, 1993, pp. 999-1001.

Nagano, T. et al, "α-axis oriented $YBa_2Cu_3O_y$ thin films grown on novel buffer layers", *Physica C* 265 (1996) 214-227.

Nilsson, P.Å. et al, "Planarized Patterning of Y—Ba—Cu—O Thin Films for Multilayer Technology", *IEEE Transactions on Applied Superconductivity*, vol. 5, No. 2, Jun. 1995, pp. 1653-1656.

Oda, S. et al, "Atomic Layer-by-Layer MOCVD of Oxide Superconductors" *Journal De Physique IV*, Colloque C5, supplkment au Journal de Physique 11, vol. 5, Jun. 1995, C5-379-390.

Oh, B. et al "Critical current densities and transport in superconducting $YBa_2Cu_3O_{7-\delta}$ films made by electron beam coevaporation", *Appl. Phys. Lett.*, vol. 51. No. 11, Sep. 14, 1987, pp. 852-854.

Park, Yong Ki et al, "Growth of a-axis Oriented $YBa_2Cu_3O_{7-x}$ Thin Films on $LaSrGaO_4$ and $SrTiO_3$ Single Crystal Substrates by Off-axis rf Sputtering", *Physica C* 235-240 (1994) 603-604.

Parker, I.D. et al, "Spin-density-wave pinning in chromium" *Physical Review B*, vol. 44, No. 10, Sep. 1, 1991—II, pp. 5313-5315.

Pedarnig, J.D. et al, "Patterning of $YBa_2Cu_3O_{7-\delta}$ films using a near-field optical configuration", *Appl. Phys. A* 67 (1998) pp. 403-405.

Pedarnig, J.D. et al, "Electrical properties, texture, and microstructure of vicinal $YBa_2Cu_3O_{7-\delta}$ thin films", *Applied Physics Letters*, 81(14), Sep. 30, 2002, pp. 2587-2589.

Prouteau,C. et al, "Microstructure of a-axis oriented YBCO films on $SrTiO_3$ substrates using a new template layer $La_4BaCu_5O_{13}$" *Physica C* 288(1997)231-242.

Proyer, S. et al "Patterning of YBCO Films by Exeimer-Laser Ablation", Appl. Phys. A 58 (1994) pp. 471-474.

Ramesh, R. et al, "Microstructure studies of α-axis oriented YBa2Cu3O7-x-PrBa2Cu3O7-y heterostructures" *Physica C* 170(1990) 325-332.

Riabkina-Fishman, M. et al "In situ preparation of silver ohmic contacts on superconducting YBCO Films" *Journal of Materials Science Letters* 12 (1993) 35-36.

Riabkina-Fishman, M. et al, "Patterning of superconducting YBCO films" *Journal of Materials Science Letters* 13 (1994) 1337-1339.

Saito, A. et al, "Temperature and dc magnetic field dependence of the surface resistance in HTS films", *Physica C* 426-431 (2005) 1606-1610.

Scheuermann, M. et al "Magnetron sputtering and laser patterning of high transition temperature eu oxide films", *Appl. Phys. Lett* 51 (23),Dec. 7, 1987, pp. 1951-1953.

Selvan, K. Arul et al "Effect of anisotropy on dislocations at YBa2Cu3O7-x-PrBa2Cu3O7-x epitaxial interfaces", *Supercand. Sci. Technot.* 7 (1994) 805-811.

Seong, Daejin et al, "Measurements of I-V characteristics 1n high TC superconducting triple layer $Y_1Ba_2Cu_3O_{7-\delta}$ / $Pr_1Ba_2Cu_3O_{7-\delta}$ / $Y_1Ba_2Cu_3O_{7-\delta}$", *Solid State Communications*, (1990)vol. 76, No. 12, pp. 1341-1345.

Shapoval, T. et al "Study of pinning mechanisms in YBCO thin films by means of magnetic force microscopy", *Physica C* 460-462 (2007) 732-733.

Shi, D.Q. et al "Effects of deposition rate and thickness on the properties of YBCO films deposited by pulsed laser deposition", Supercond. Sci. Technol. 17 (2004) S42-S45.

(56) References Cited

OTHER PUBLICATIONS

Shingai, Y. et al,"Selective preferred orientation control of $YBa_2Cu_3O_{7-\delta}$ films on a substrate", *Physica C* 412-414 (2004) pp. 1296-1300.
Singh, Rajiv et al, "Pulsed laser deposition and characterization of High-Tc $YBa_2Cu_3O_{7-x}$ superconducting thin films" *Materials Science and Engineering*, R22 (1998) 113-I 85.
Sodtke, E. et al, "Preparation of a-axis oriented $YBa_2Cu_3O_7$ and $PrBa_2Cu_{3-x}Ga_xO_7$ thin films", *Physica C* 180 (1991) 50-53.
Sodtke, Erik et al, "Oxygen content and disorder in a-axis oriented $YBa_2Cu_3O_{7-\delta}$ thin films", *Appl. Phys. Lett.* 60 (13), Mar. 30, 1992, pp. 1630-1632.
Sodtke, E. et al "The influence of the template growth method on the properties of $\alpha$-axis oriented $YBa_2Cu_3O_{7-\delta}$ thin films" Physica C 204 (1993) 375-383.
Soutome, Yoshihisa et al "A YBCO Multilayer Process Using Surface-Modified Junction Technology", IEEE *Transactions on Applied Superconductivity*, Jun. 2003, vol. 13, No. 2, pp. 591-594.
Stebler, Bengt "The Resistivity Anomaly in Chromium Near the Néel Temperature" Physica Scripta., vol. 2, 53-56, 1970.
Stepantsov, E.A. et al "Growth of $YBa_2Cu_3O_7$ films with [100] tilt of CuO planes to the surface on $SrTiO_3$ crystals" ISSN 1063-7745, *Crystallography Reports*, 2011, vol. 56, No. 1, pp. 152-156.
Sung, Gun Yong et al, "Superconducting and structural properties of in-plane aligned a-axis oriented $YBa_2Cu_3O_{7-x}$ thin films" *Appl. Phys. Lett.* 67 (8), Aug. 21, 1995, pp. 1145-1147.
Sung, Gun Yong et al, "Nucleation and Growth of b-Axis Oriented. $PrBa_2Cu_3O_{7-x}$ Thin Films on $LaSrGaO_4$ (100) Substrates" *ETRI Journal*, vol. 18, No. 4, Jan. 1997, pp. 339-346.
Suzuki, Yuri "Structure and Anisotropic Transport in $YBa_2Cu_3O_7$ and $PrBa_2Cu_3O_7$ Thin Films and Superlattices" Dissertation, Oct. 1994.
Takeuchi, Ichiro "In-plane Aligned a-axis Oriented $YBa_2Cu_3O_{7-x}$ Heterostructures and Josephson Junctions" Dissertation 1996.
Takeuchi, I. et al, "Fabrication of in-plane aligned a-axis oriented $YBa_2Cu_3O_{7-x}$ trilayer Josephson junctions" *Appl. Phys. Lett.* 69(1) Jul. 1, 1996, pp. 112-114.
Terashima, T. et al Epitaxial growth of $YBa_2Cu_3O_{7-x}$ thin films on (110) SrTiO3 single crystals by activated reactive evaporation *Appl. Phys. Lett.* 53(22), Nov. 28, 1988, pp. 2232-2234.
Trajanovic, Zoran "Studies of Anisotropic In-Plane Aligned a-Axis Oriented $YBa_2Cu_3O_{7-x}$ Thin Films" Dissertation, 1997 (225 pages).
Trajanovic, Z et al, "Oxygen pressure dependence of the grain size and surface morphology in $YBa_2Cu_3O_{7-x}$ a-axis films", *Appl. Phys. Lett.* 66 (12), Mar. 20, 1995, pp. 1536-1538.
Trajanovic, Z. et al "Growth Optimization and Characterization of a-axis Oriented Y—Ba—Cu—O Thin Films on (100) $LaSrGaO_4$ Substrates" *IEEE Transactions on Applied Superconductivity*, vol. 5, No. 2, Jun. 1995, pp. 1237-1240.
Trajanovic, Z. et al "Grain growth and grain boundaries in in-plane aligned a-axis oriented $YBa_2Cu_3O_{7-x}$ films on(100) $LaSrGaO_4$", *Physica C* 265 (1996) 79-88.
Trajanovic, Z. et al, "Resistivity and Critical Current Anisotropy of Untwinned a-axis YBCO Thin Films", *IEEE Transactions on Applied Superconductivity*, vol. 7, No. 2, Jun. 1997, pp. 1636-1641.
Usui, Toshio et al, "Resistivity measurement of an a-axis-oriented $YBa_2Cu_3O_{7-\delta}$ thin film at 450-650° C.", *J. Mater. Res.*, vol. 8, No. 4, Apr. 1993 pp. 705-708.
Van Der Harg, A.J.M. et al, "Template Patterning of $YBa_2Cu_3O_7$" *Microelectronic Engineering* 30 (1996) 369-372.
Vassenden, F. et al, "Growth direction control in YBCO thin films", *Physica C* 175 ( 1991 ) 566-572.
Venkatesan, T. et al "High-temperature superconductivity in ultrathin films of $Y1Ba_2Cu_3O_{7-x}$," *Appl. Phys. Lett.* 54 (6), Feb. 6, 1989, pp. 581-583.
Virshup, G.F. et al, "Hysteretic, high Tc Josephson junctions using heterostructure trilayer films grown by molecular beam epitaxy" *Appl. Phys. Lett.* 60 (18). May 4, 1992, pp. 2288-2290.
Wang, Z.H. et al, "Pinning by planar defects along the c-axis in epitaxial $YBa_2Cu_3O_{7-\delta}$ thin films", *Physica C* 312 (1999) 85-90.
Wang, Z.H. et al, "Field and temperature dependencies of the current-induced dissipation in an epitaxial YBCO thin films", *Physica C* 386 (2003) 370-373.
Weiss, F. et al "HTS thin films by innovative MOCVD processes" *Journal of Alloys and Compounds* 251 (1997) 264-269.
Wen, J.G. et al, "Full coverage of ultra-thin $SrTiO_3$ layer in $\alpha$-$YBa_2Cu_3O_{7-x}$/$SrTiO_3$/$\alpha$-$YBa_2Cu_3O_{7-x}$ sandwiched thin film" *Physica C* 266 (1996) 320-328.
Wen, J.G. et al, "Study of the growth mechanism of highly in-plane aligned $\alpha$-axis $YBa_2Cu_3O_{7-x}$ thin films on $LaSrGaO_4$ substrate by high resolution electron microscopy" *J. Mater. Res.*, vol. 11, No. 12, Dec. 1996, pp. 2951-2954.
Wichern, Ronald G. et al, "$YBa_2Cu_3O_{7-\delta}$ $\alpha$-axis films and planar junctions", *IEEE Transactions on Applied Superconductivity*, vol. 5, No. 2, Jun. 1995, pp. 2361-2364.
Worthington, T.K. et al, "Anisotropic Nature of High-Temperature Superconductivity in Single-Crystal $Y1Ba_2Cu_3O_{7-x}$", *Physical Review Letters*, Sep. 7, 1987, vol. 59, No. 10, pp. 1160-1163.
Wu, X.D. et al, "Preparation of High Quality $YBa_2Cu_3O_{7-\delta}$ Thick Films on Flexible Ni-based Alloy Substrates with Textured Buffer Layers" *IEEE Transactions on Applied Superconducitvity*, vol. 5, No. 2, Jun. 1995, pp. 2001-2006.
Wu, Z.P. et al, "Growth mode and dielectric properties in laser MBE grown multilayer of $SrTiO_3$ and $YBa_2Cu_3O_y$,", *Vacuum* 85 (2010) 639-642.
Ye, Zu-Xin et al, "Enhanced flux pinning in $YBa_2Cu_3O_{7-\delta}$ films by nanoscaled substrate surface roughness" *Applied Physics Letters* , 87, 122502 (2005) pp. 1-3.
Zhang, L. et al, "Growth conditions and superconductive properties of a-axis oriented $YBa_2Cu_3O_{7-\delta}$ films on $LaSrGaO_4$ substrates", *IEEE Transactions on Applied Superconductivity*, vol. 11, No. 1, Mar. 2001—Abstract only.
Zhong, Q et al "High-rate growth of purely $\alpha$-axis oriented YBCO high-$T_c$ thin films by photo-assisted MOCVD" *Physica C* 246(1995)288-296.

* cited by examiner

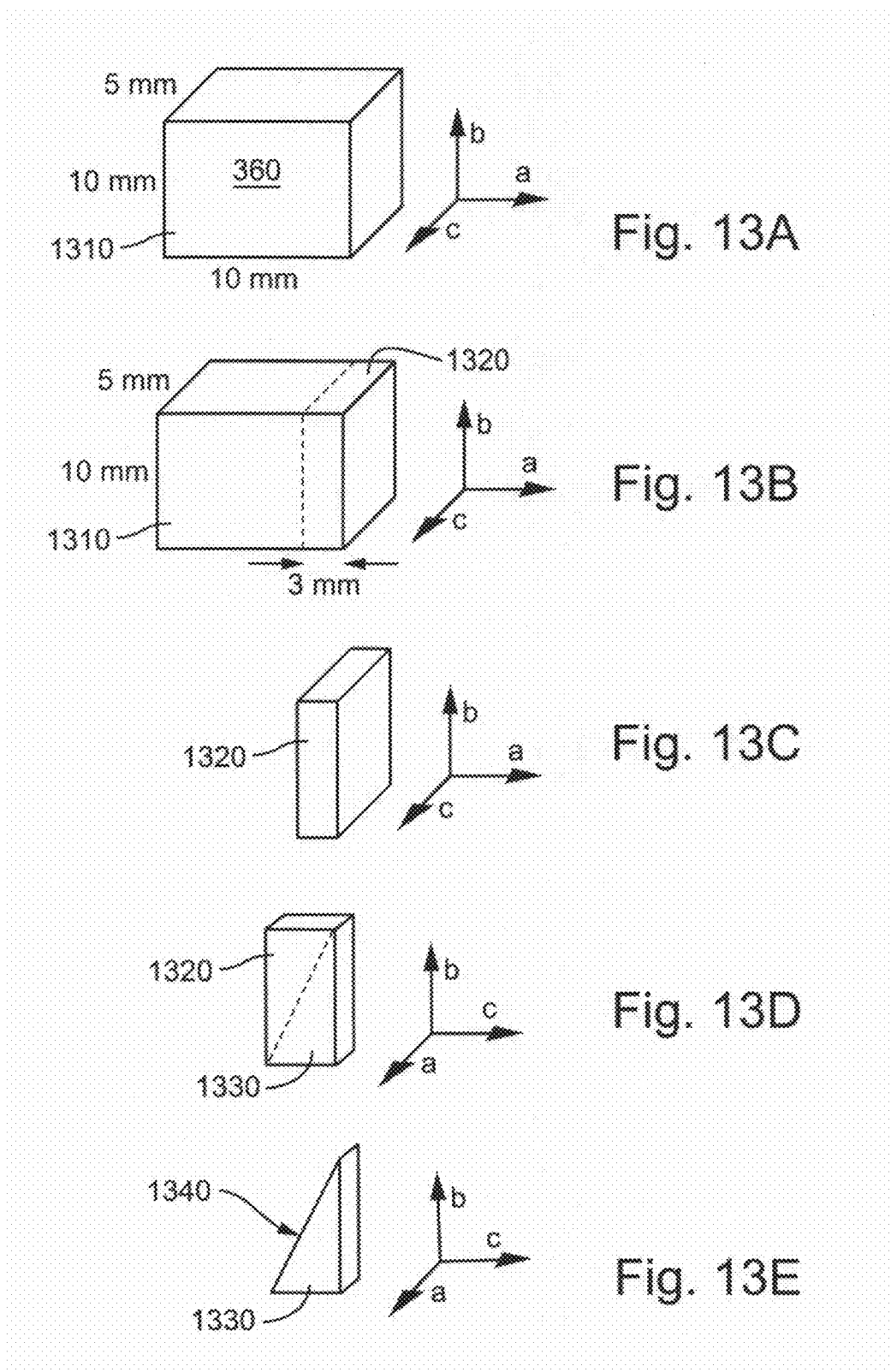

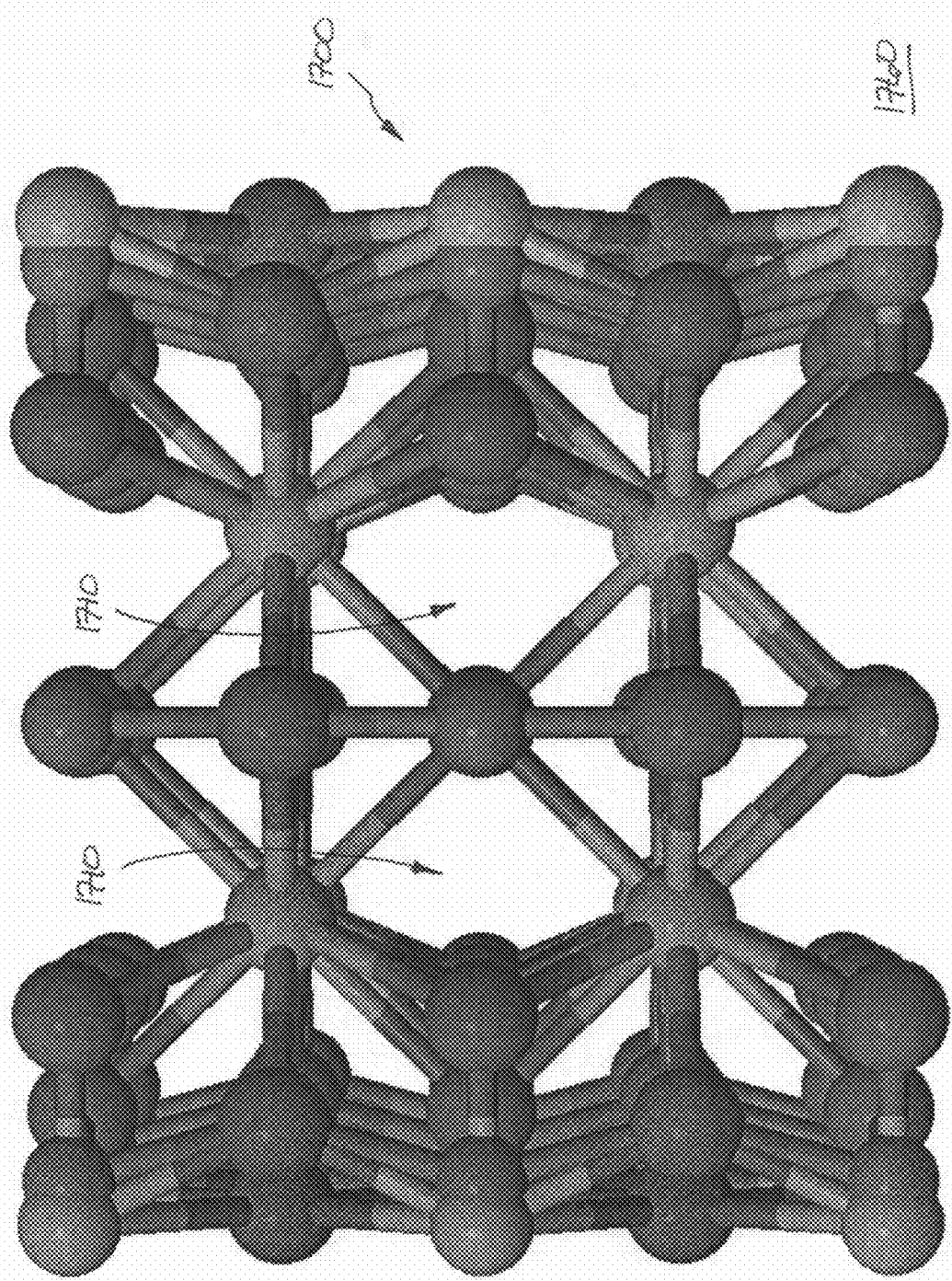

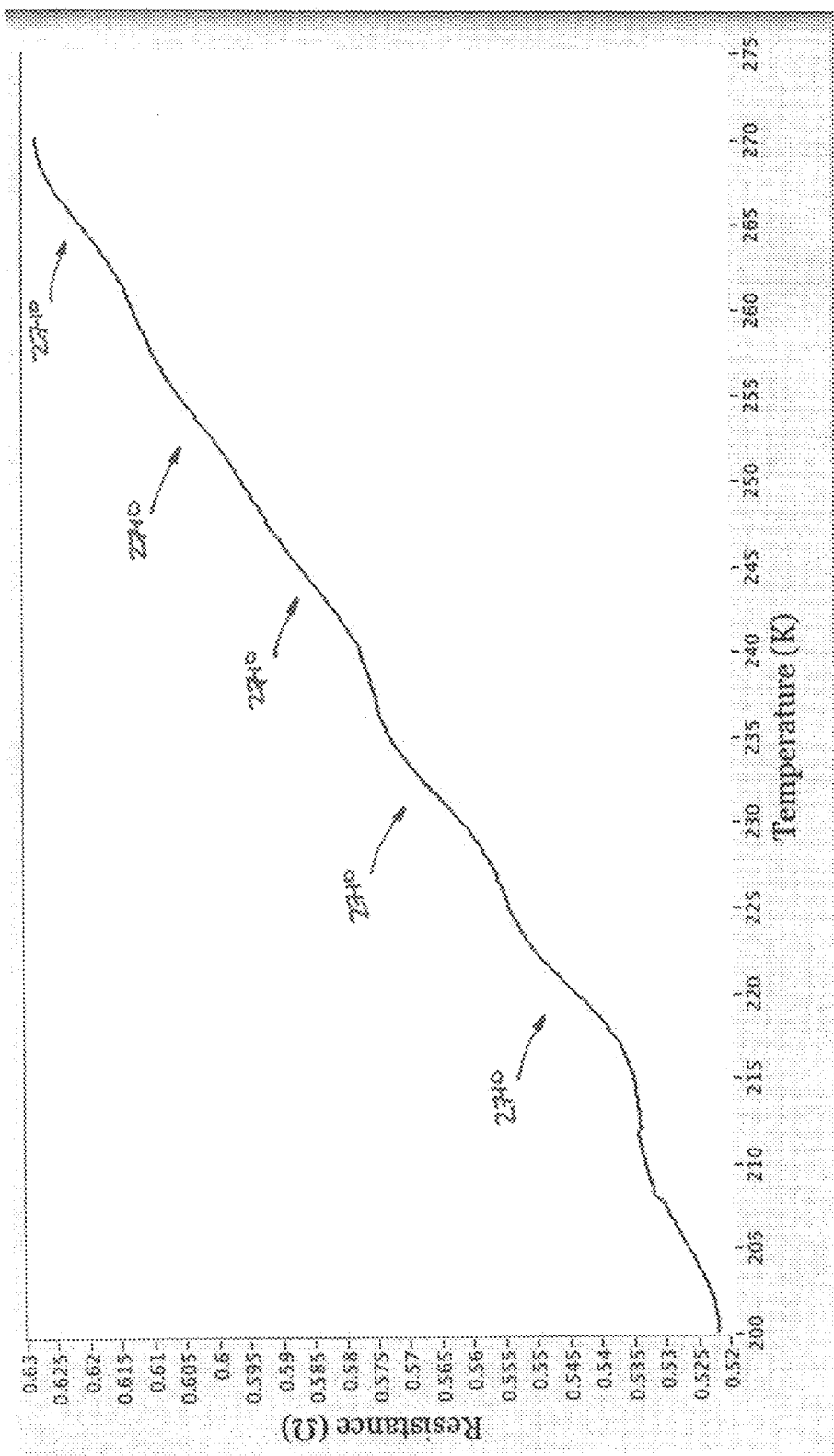

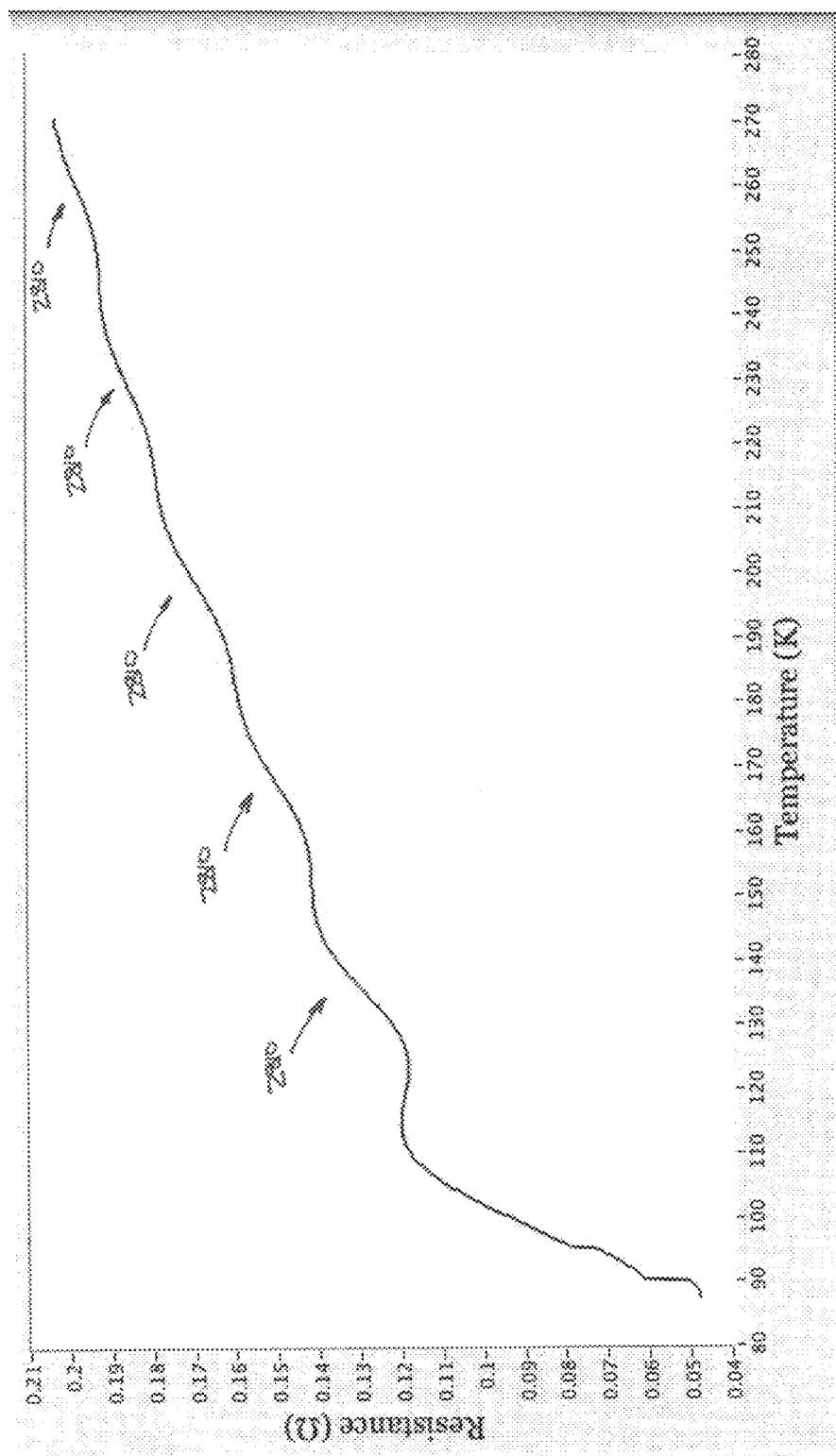

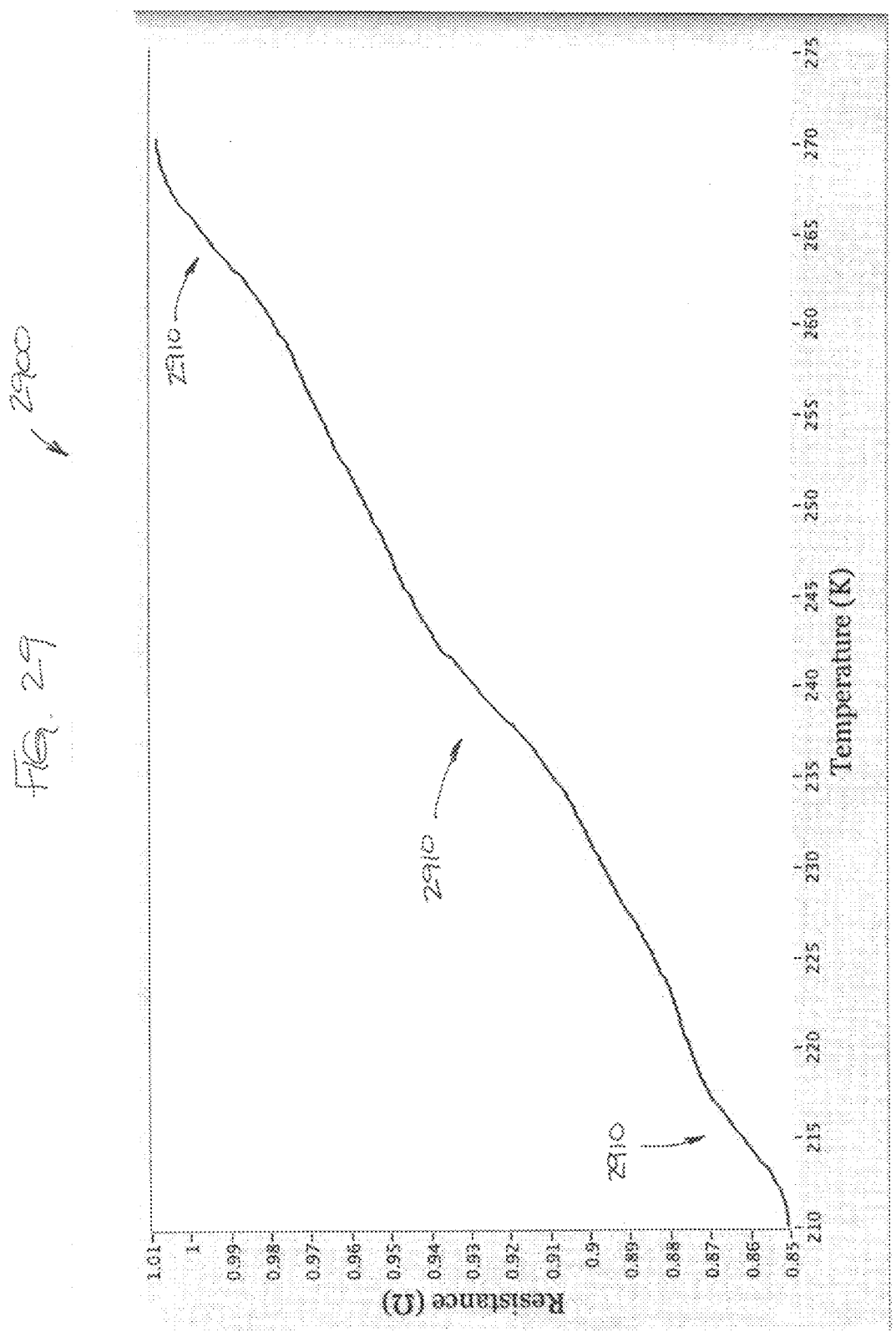

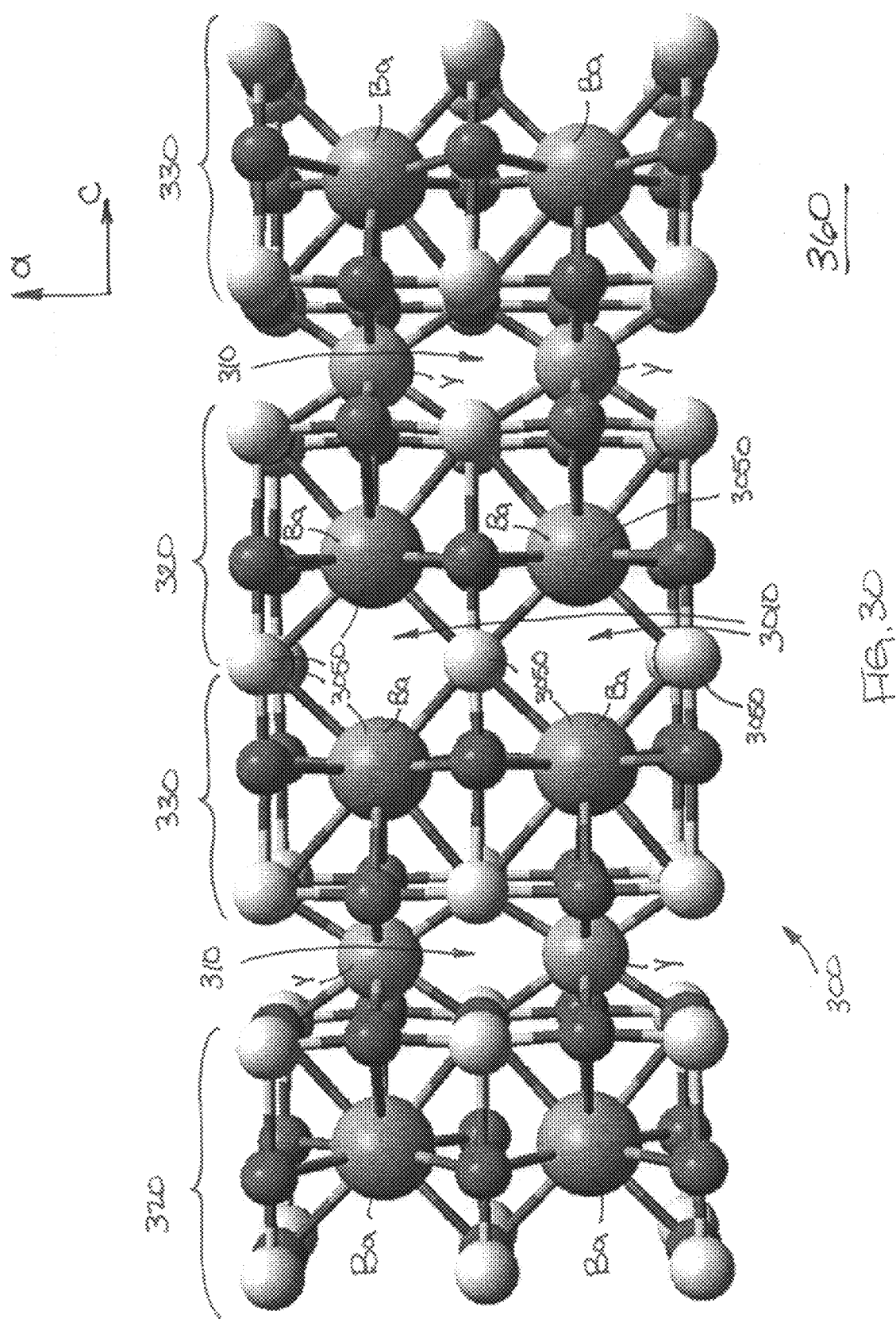

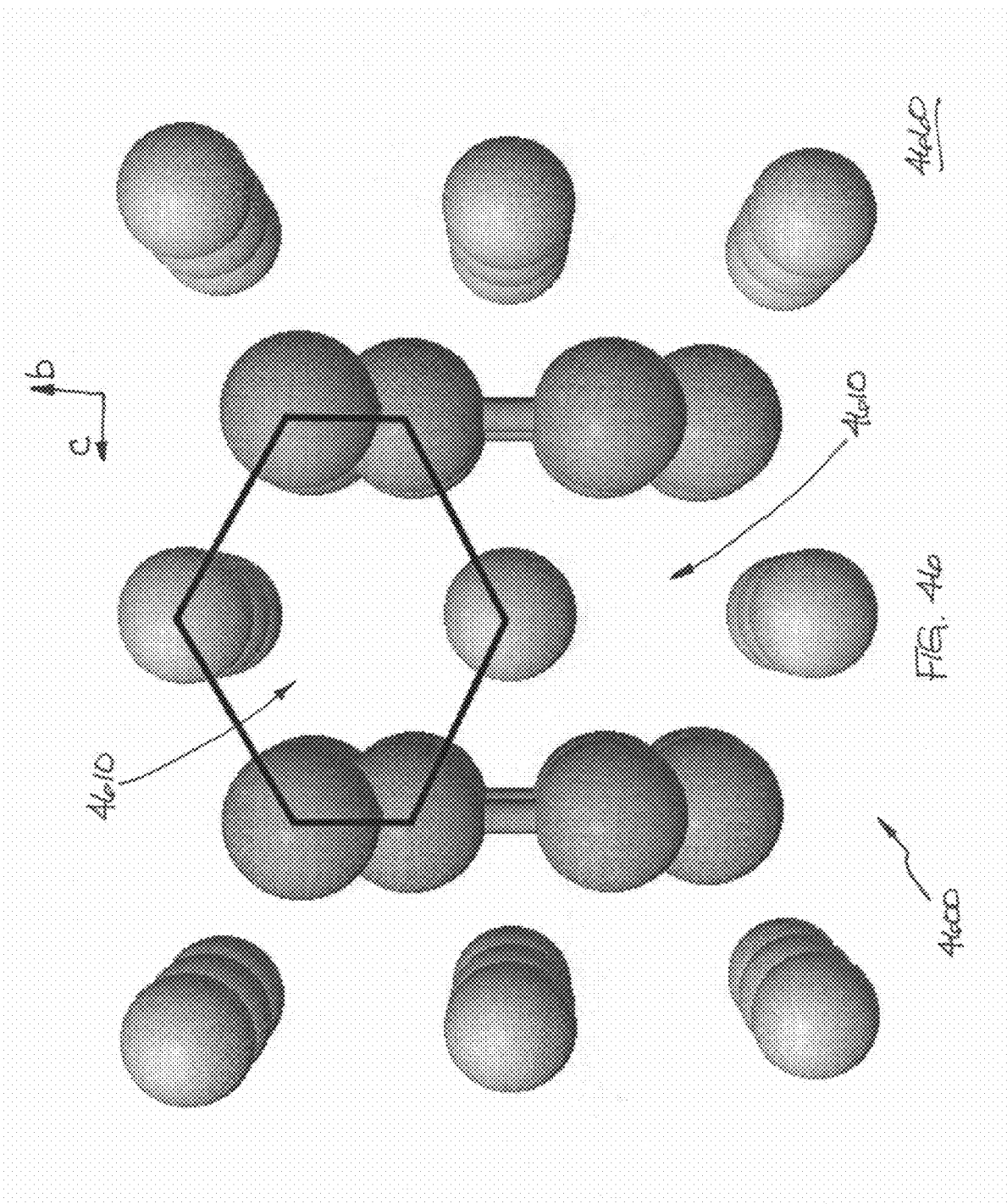

EXTREMELY LOW RESISTANCE FILMS AND METHODS FOR MODIFYING AND CREATING SAME

CROSS-REFERENCE TO RELATED APPLICATIONS

This application claims priority to U.S. Provisional Application No. 61/248,130, entitled "High Temperature Extremely Low Resistance Materials and Methods for Modifying or Creating Same," filed on Oct. 2, 2009, which is incorporated herein by reference in its entirety.

FIELD OF THE INVENTION

The invention is generally related to films or tapes with extremely low resistance ("ELR films" or "ELR tapes") at high temperatures, and more particularly to modifying existing ELR films and/or creating new ELR films that operate with improved operating characteristics.

BACKGROUND OF THE INVENTION

Ongoing research attempts to achieve new materials with improved operational characteristics, for example, reduced electrical resistance at higher temperatures over existing materials, including superconducting materials. Scientists have theorized a possible existence of a "perfect conductor," or a material that operates with extremely low resistance, but that may not necessarily demonstrate all the conventionally accepted characteristics of a superconducting material.

Notwithstanding their name, conventional high temperature superconducting ("HTS") materials still operate at very low temperatures. In fact, most commonly used HTS materials still require use of a cooling system that uses liquids with very low boiling points (e.g., liquid nitrogen). Such cooling systems increase implementation costs and discourage widespread commercial and consumer use and/or application of such materials.

What is needed are ELR films with improved operating characteristics; mechanisms for modifying known ELR films so that the modified ELR films operate with improved operating characteristics; and/or techniques for designing and fabricating new ELR films.

BRIEF DESCRIPTION OF THE DRAWINGS

The accompanying drawings, which are included to provide a further understanding of the invention and are incorporated in and constitute a part of this specification, illustrate various exemplary implementations of the invention and together with the detailed description serve to explain various principles and/or aspects of the invention.

FIGS. 13A-13J illustrate preparing a modified ELR material according to various implementations of the invention.

FIG. 17 illustrates a crystalline structure of an exemplary ELR material as viewed from a second perspective.

FIG. 26 illustrates test results demonstrating various operational characteristics of a modified ELR material, namely with bismuth as a modifying material and YBCO as an ELR material, in accordance with various implementations of the invention.

FIG. 27 illustrates test results demonstrating various operational characteristics of a modified ELR material, namely with copper as a modifying material and YBCO as an ELR material, in accordance with various implementations of the invention.

FIG. 28 illustrates test results demonstrating various operational characteristics of a modified ELR material, namely with cobalt as a modifying material and YBCO as an ELR material, in accordance with various implementations of the invention.

FIG. 29 illustrates test results demonstrating various operational characteristics of a modified ELR material, namely with titanium as a modifying material and YBCO as an ELR material, in accordance with various implementations of the invention.

FIG. 30 illustrates a crystalline structure of an exemplary ELR material as viewed from a third perspective.

FIG. 46 illustrates a crystalline structure of an exemplary ELR material as viewed from a second perspective.

SUMMARY OF THE INVENTION

Figure 1:
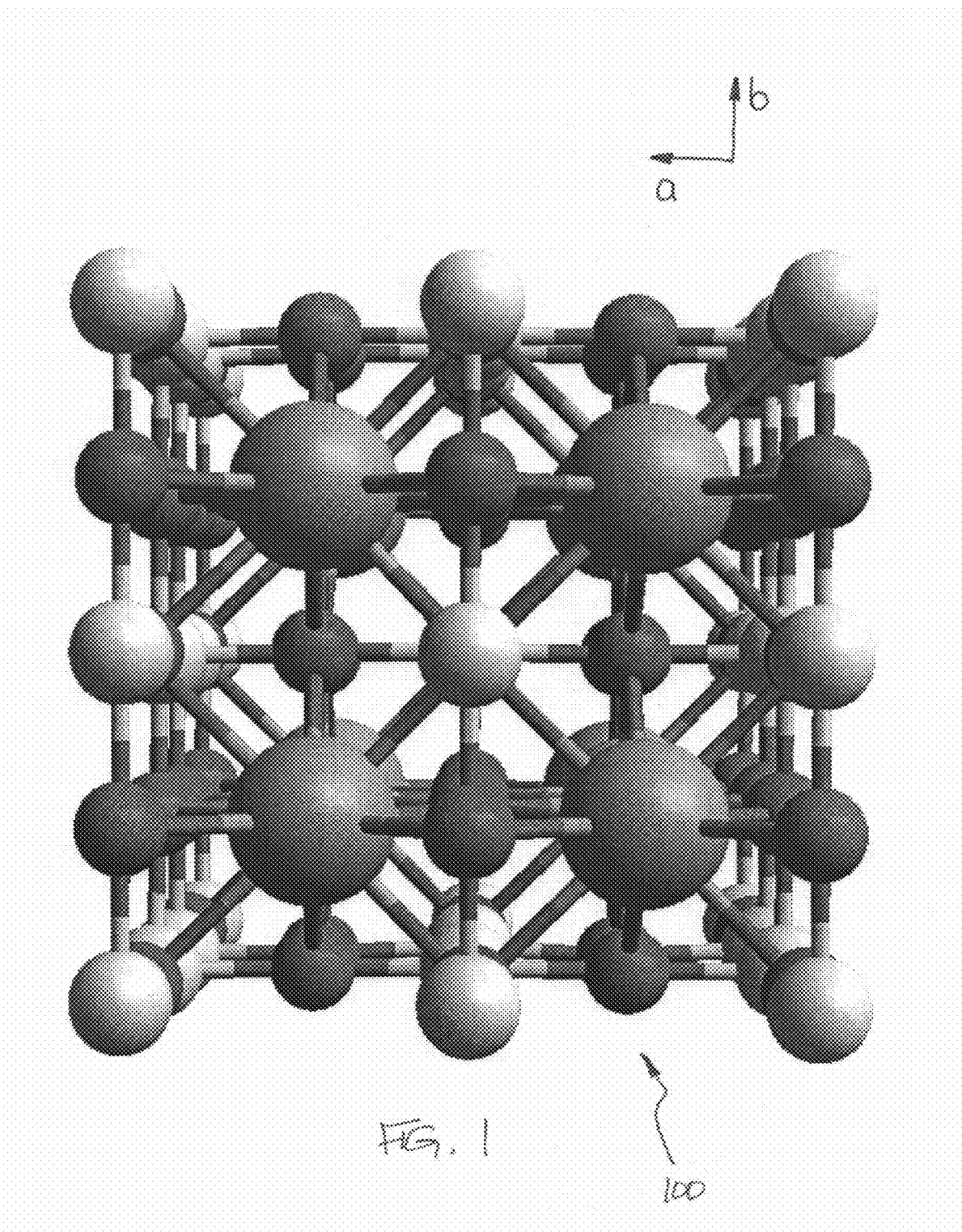
FIG. 1 illustrates a crystalline structure of an exemplary ELR material as viewed from a first perspective.

Generally speaking, various implementations of the invention relate to modifying existing ELR materials and/or processes for creating new ELR materials. In some implementations of the invention, existing ELR materials are modified to create modified ELR materials with improved operating characteristics. These operating characteristics may include, but are not limited to, operating in an ELR state (including, for example, a superconducting state) at higher temperatures, operating with increased charge carrying capacity at the same (or higher) temperatures, operating with improved magnetic properties, operating with improved mechanical properties, and/or other improved operating characteristics. As will be described in further detail below, for purposes of this description, ELR materials comprise: superconducting materials, including HTS materials; perfectly conducting materials (e.g., perfect conductors); and other conductive materials with extremely low resistance.

In some implementations of the invention, a method comprises layering a modifying material onto an appropriate surface of an ELR film to create a modified ELR film, where the modified ELR film has improved operational characteristics over those of the ELR film without the modifying material.

In some implementations of the invention, a method comprises forming an appropriate surface on or within an ELR film and layering a modifying material onto the appropriate surface of the ELR film to create a modified ELR film, where the modified ELR film has improved operational characteristics over those of the ELR film alone or without the modifying material. In further implementations of in the invention, the appropriate surface is not substantially parallel to a c-plane of the ELR film.

In various implementations of the invention, the improved operational characteristics include operating in an ELR state at higher temperatures, operating with increased charge carrying capacity at the same or higher temperatures, operating with improved magnetic properties, or operating with improved mechanical properties.

In some implementations of the invention, layering a modifying material onto an appropriate surface of the ELR film comprises depositing the modifying material onto the appropriate surface of the ELR film. In further implementations of the invention, depositing the modifying material onto the appropriate surface of the ELR film comprises using MBE, PLD, or CVD.

In some implementations of the invention, layering a modifying material onto an appropriate surface of the ELR film comprises layering the modifying material onto a face of the ELR film that is not substantially parallel to a c-plane of a crystalline structure of an ELR material in the ELR film. In some implementations of the invention, layering a modifying material onto an appropriate surface of the ELR film comprises layering the modifying material onto a face of the ELR material that is parallel to an ab-plane of a crystalline structure of the ELR material. In some implementations of the invention, layering a modifying material onto appropriate surface of the ELR film comprises layering the modifying material onto a face of the ELR material that is parallel to an a-plane or a b-plane of a crystalline structure of the ELR material.

In some implementations of the invention, layering a modifying material onto an appropriate surface of the ELR film comprises layering chromium, copper, bismuth, cobalt, vanadium, titanium, rhodium, beryllium, gallium, or selenium onto the appropriate surface of the ELR film.

In some implementations of the invention, forming the appropriate surface on or within the ELR film comprises exposing the appropriate surface on or within the ELR film.

In some implementations of the invention, forming the appropriate surface on or within the ELR film comprises layering an ELR material onto a substrate in a manner that orients a particular axis of the crystalline structure of the ELR material along a principal axis of the substrate, wherein the particular axis is a line within the c-plane of the crystalline structure of the ELR material. In further implementations of the invention, the particular axis is the a-axis or the b-axis.

In some implementations of the invention, exposing the appropriate surface of the ELR film comprises etching a primary surface of the ELR film to increase a surface area of the primary surface.

In some implementations of the invention, exposing the appropriate surface of the ELR film comprises creating a pattern in a primary surface of the ELR film thereby exposing one or more appropriate surfaces of the ELR film.

In some implementations of the invention, creating a pattern in a primary surface of the ELR film comprises inscribing a groove in the ELR material of the ELR film. In some implementations of the invention, the groove is substantially in the direction of the principal axis of the ELR film. In some implementations of the invention, the groove has a depth substantially equal to a thickness of the ELR material. In some implementations of the invention, the groove has a depth less than a thickness of the ELR material. In some implementations of the invention, the width of the at least one groove is greater than 10 nm. In some implementations of the invention, a modifying material is deposited into the groove.

In some implementations of the invention, a method comprises creating at least one groove in the primary surface of an ELR film, thereby exposing a face of the ELR film, the exposed face being a face parallel to an ab-plane of the crystalline structure of an ELR material in the ELR film and depositing a modifying material onto the exposed face.

In some implementations of the invention, depositing a modifying material onto the exposed face comprises depositing a single unit layer of the modifying material onto the exposed face. In some implementations of the invention, depositing a modifying material onto the exposed face comprises depositing two or more unit layers of the modifying material onto the exposed face.

In some implementations of the invention, layering a modifying material onto an appropriate surface of the ELR film comprises layering the modifying material onto a face of the ELR film that is not substantially parallel to a c-plane of the ELR film.

In some implementations of the invention, a method comprises bonding a modifying material to an ELR material to form a modified ELR material, where the modified ELR material operates at a temperature greater than that of the ELR material alone or without the modifying material. In some implementations of the invention, the ELR material is a superconducting material.

In some implementations, a modifying material is layered onto an ELR material to form a modified ELR material that operates with an improved operating characteristic over that of the ELR material alone or without a modifying material. ELR materials may be selected from a family of ELR materials referred to as mixed-valence copper-oxide perovskites. In some implementations, modifying materials may be selected from any one or combination of the following: chromium (Cr), copper (Cu), bismuth (Bi), cobalt (Co), vanadium (V), titanium (Ti), rhodium (Rh), beryllium (Be), gallium (Ga), and/or selenium (Se).

In some implementations of the invention, a composite comprises an ELR material, and a modifying material bonded to the ELR material such that the composite operates in an ELR state at a temperature greater than that of the ELR material alone or without the modifying material.

In some implementations of the invention, a composite comprises a first layer comprising an ELR material, and a second layer comprising a modifying material, where the second layer is bonded to the first layer. In some implementations of the invention, a composite comprises a first layer comprising an ELR material, a second layer comprising a modifying material, where the second layer is bonded to the first layer, a third layer comprising the ELR material, and a fourth layer of the modifying material, where the third layer is bonded to the fourth layer. In some implementations of the invention, the second layer is deposited onto the first layer. In some implementations of the invention, the first layer is deposited onto the second layer. In some implementations of the invention, the ELR material of the first layer is formed on the second layer. In some implementations of the invention, the first layer has a thickness of at least a single crystalline unit cell of the ELR material. In some implementations of the invention, the first layer has a thickness of several crystalline unit cells of the ELR material. In some implementations of the invention, the second layer has a thickness of at least a single unit (e.g., atom, molecule, crystal, unit cell, or other unit) of the modifying material. In some implementations of the invention, the second layer has a thickness of several units of the modifying material.

In some implementations of the invention, a composite comprises a first layer comprising YBCO, and a second layer comprising a modifying material, wherein the modifying material of the second layer is bonded to the YBCO of the first layer, wherein the modifying material is an element selected as any one or more of the group including: chromium, copper, bismuth, cobalt, vanadium, titanium, rhodium, beryllium, gallium, or selenium. In some implementations of the invention, the modifying material of the second layer is bonded to a face of the YBCO of the first layer, where the face is substantially parallel to a c-axis of the YBCO. In some implementations of the invention, the modifying material of the second layer is bonded to a face of the YBCO of the first layer, where the face is substantially parallel to an ab-plane of the YBCO. In some implementations of the invention, the modifying material of the second layer is bonded to a face of the YBCO of the first layer, where the face is substantially perpendicular to a b-axis of the YBCO. In some implementations of the invention, the modifying material of the second layer is bonded to a face of the YBCO of the first layer, where the face is substantially perpendicular to an a-axis of the YBCO.

In some implementations of the invention, the ELR material comprises a superconducting material. In some implementations of the invention, the ELR material comprises a mixed-valence copper-oxide perovskite material. In some implementations of the invention, the mixed-valence copper-oxide perovskite material may be selected from the groups generically referred to as LaBaCuO, LSCO, YBCO, BSCCO, TBCCO, $HgBa_2Ca_2Cu_3O_x$, or other mixed-valence copper-oxide perovskite materials. In some implementations of the invention, the ELR material comprises an iron pnictide material. In some implementations of the invention, the ELR material comprises magnesium diboride. In some implementations of the invention, the modifying material may be a conductive material. In some implementations of the invention, the modifying material may be a material that bonds easily with oxygen. In some implementations of the invention, the modifying material may be a conductive material that bonds easily with oxygen ("oxygen bonding bonding conductive material"). In some implementations of the invention, the modifying material may be any one or combination of chromium, copper, bismuth, cobalt, vanadium, titanium, rhodium, beryllium, gallium, and/or selenium. In some implementations of the invention, various combinations of the ELR materials and the modifying materials may be used. In some implementations of the invention, the ELR material is YBCO and the modifying material is chromium.

In some implementations of the invention, the composite of the ELR material with the modifying material operates at a higher temperature than the ELR material alone or without the modifying material. In some implementations of the invention, the composite demonstrates ELR at a higher temperature than that of the ELR material alone or without the modifying material. In some implementations of the invention, the composite transitions from a non-ELR state to an ELR state at a temperature higher than that of the ELR material alone or without the modifying material. In some implementations of the invention, the composite has a transition temperature greater than that of the ELR material alone or without the modifying material. In some implementations of the invention, the composite carries a greater amount of current in an ELR state than that carried by the ELR material alone or without the modifying material.

In some implementations of the invention, the composite operates in an ELR state at a higher temperature than the ELR material alone or without the modifying material. In some implementations of the invention, the composite operates in an ELR state at temperatures greater than any one of the following temperatures: 200K, 210K, 220K, 230K, 240K, 250K, 260K, 270K, 280K, 290K, 300K, or 310K.

In some implementations of the invention where the ELR material is YBCO, the composite has improved operating characteristics over those of YBCO alone or without the modifying material. In some implementations of the invention where the ELR material is YBCO, the composite operates at a higher temperature than that of YBCO alone or without the modifying material. In some implementations of the invention where the ELR material is YBCO, the composite demonstrates extremely low resistance at a higher temperature than that of YBCO alone or without the modifying material. In some implementations of the invention where the ELR material is YBCO, the composite transitions from a non-ELR state to an ELR state at a temperature higher than that of YBCO alone or without the modifying material. In some implementations of the invention where the ELR material is YBCO, the composite has a transition temperature greater than that of YBCO alone or without the modifying material. In some implementations of the invention where the ELR material is YBCO, the composite carries a greater amount of current in an ELR state than that carried by YBCO in its ELR state alone or without the modifying material.

In some implementations of the invention, an ELR composite comprises a first layer comprised of an ELR material, and a second layer comprised of a modifying material bonded to the ELR material of the first layer, where the ELR composite has an improved operational characteristic over the operational characteristics of the ELR material without the modifying material.

DETAILED DESCRIPTION

Various features, advantages, and implementations of the invention may be set forth or be apparent from consideration of the following detailed description, the drawings, and the claims. It is to be understood that the detailed description and the drawings are exemplary and intended to provide further explanation without limiting the scope of the invention except as set forth in the claims.

Various implementations of the invention are related to ELR films (which include ELR materials), and more particularly to modifying existing ELR films and/or creating new ELR films that operate with improved operating characteristics. The novel ELR films can encompass, for example, composites, products, processes of manufacture, product-by-process, methods of making novel ELR films, for example, to obtain a new technical effect.

For purposes of this description, extremely low resistance ("ELR") materials may include: superconducting materials, including, but not limited to, HTS materials; perfectly conducting materials (e.g., perfect conductors); and other conductive materials with extremely low resistance. Further, for purposes of this description, operating characteristics with regard to ELR materials and/or various implementations of the invention may include, but are not limited to, a resistance of the ELR material in its ELR state (for example, with regard to superconductors, a superconducting state), a transition temperature of the ELR material to its ELR state, a charge propagating capacity of the ELR material in its ELR state, one or more magnetic properties of the ELR material, one or more mechanical properties of the ELR material, and/or other operating characteristics of the ELR material. Further, for purposes of this description, "extremely low resistance" is resistance similar in magnitude to the flux flow resistance of Type II superconducting materials in their superconducting state, and may generally be expressed in terms of resistivity in a range of zero Ohm-cm to one fiftieth (1/50) of the resistivity of substantially pure copper at 293K. For example, as used herein, substantially pure copper is 99.999% copper. In various implementations of the invention, portions of modified and/or new ELR materials have a resistivity in a range of zero Ohm-cm to $3.36 \times 10^{-8}$ Ohm-cm.

Incremental improvements in a transition temperature (sometimes also referred to as a critical temperature) of ELR materials, and in particular, superconducting materials, appear to be based on trial and error rather than an understanding of the mechanisms by which ELR materials operate. Without such an understanding, further improvements to a transition temperature (or other operating characteristic) of the known ELR materials (or classes thereof) as well as design of new ELR materials are limited. As generally understood, the transition temperature is a temperature below which the ELR material "operates" or exhibits (or begins exhibiting) extremely low resistance, and/or other phenomenon associated with ELR materials. When operating with extremely low resistance, the ELR material is referred to as being in an ELR state. At temperatures above the transition temperature, the ELR material ceases to exhibit extremely low resistance and the ELR material is referred to as being in its non-ELR state. In other words, the transition temperature corresponds to a temperature at which the ELR material changes between its non-ELR state and its ELR state. As would be appreciated, for some ELR materials, the transition temperature may be a range of temperatures over which the ELR material changes between its non-ELR state and its ELR state. As would also be appreciated, the ELR material may have hysteresis in its transition temperature with one transition temperature as the ELR material warms and another transition temperature as the ELR material cools.

Figure 31:
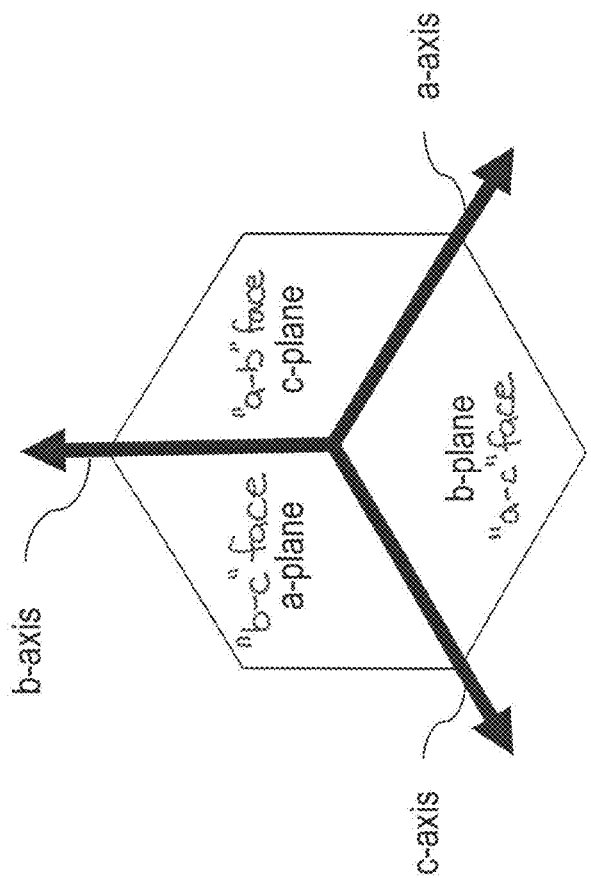
FIG. 31 illustrates a reference frame useful for describing various implementations of the invention.

FIG. 31 illustrates a reference frame 3100 which may be used to describe various implementations of the invention. Reference frame 3100 includes a set of axes referred to as an a-axis, a b-axis, and a c-axis. For purposes of this description: reference to the a-axis includes the a-axis and any other axis parallel thereto; reference to the b-axis includes the b-axis and any other axis parallel thereto; and reference to the c-axis includes the c-axis and any other axis parallel thereto. Various pairs of the axes form a set of planes in reference frame 3100 referred to as an a-plane, a b-plane, and a c-plane, where: the a-plane is formed by the b-axis and the c-axis and is perpendicular to the a-axis; the b-plane is formed by the a-axis and the c-axis and is perpendicular to the b-axis; and the c-plane is formed by the a-axis and the b-axis and is perpendicular to the c-axis. For purposes of this description: reference to the a-plane includes the a-plane and any plane parallel thereto; reference to the b-plane includes the b-plane and any plane parallel thereto; and reference to the c-plane includes the c-plane and any plane parallel thereto. Further, with regard to various "faces" or "surfaces" of the crystalline structures described herein, a face parallel to the a-plane may sometimes be referred to as a "b-c" face; a face parallel to the b-plane may sometimes be referred to as an "a-c" face; and a face parallel to the c-plane may sometimes be referred to as a "a-b" face.

Figure 2:
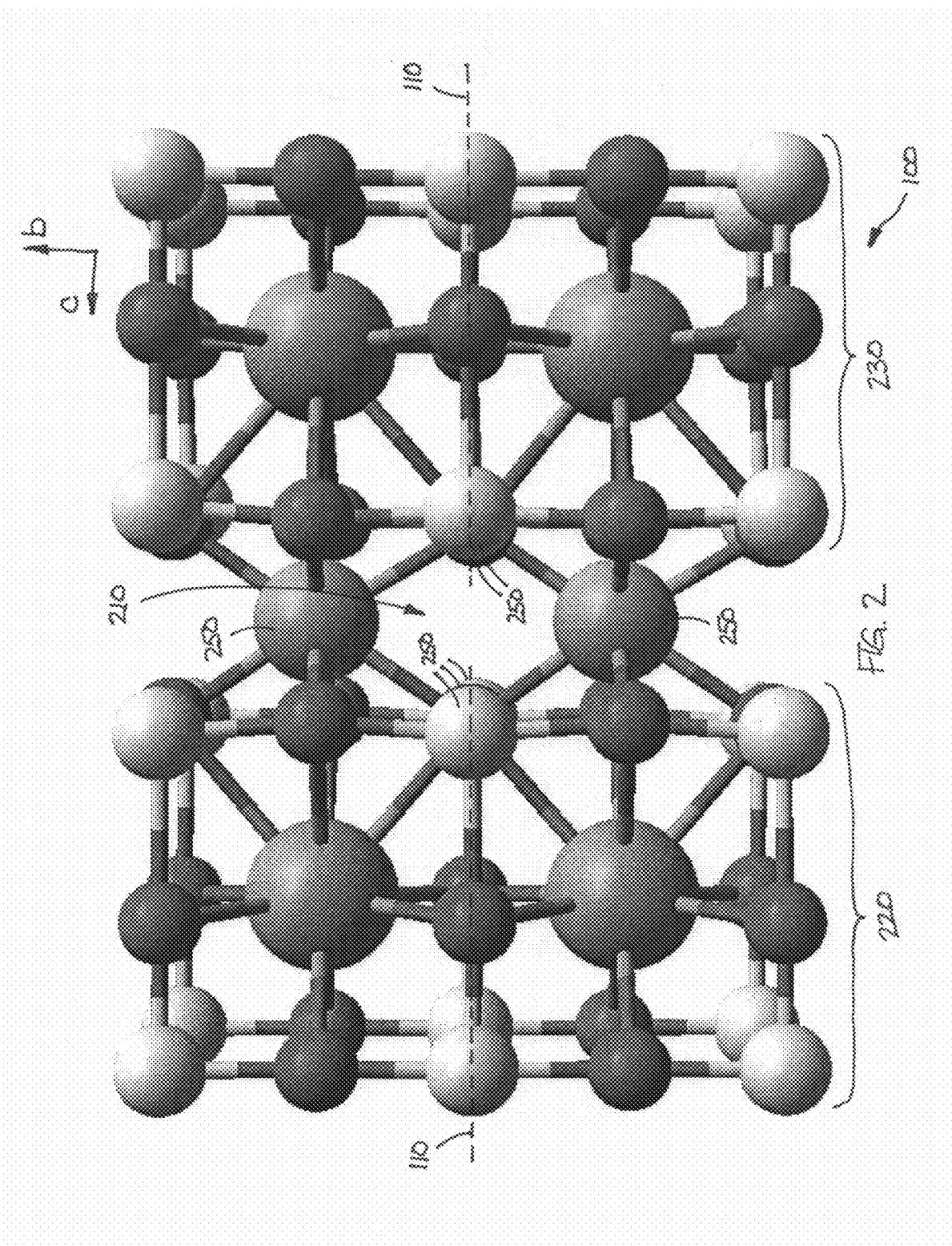
FIG. 2 illustrates a crystalline structure of an exemplary ELR material as viewed from a second perspective.
Figure 22:
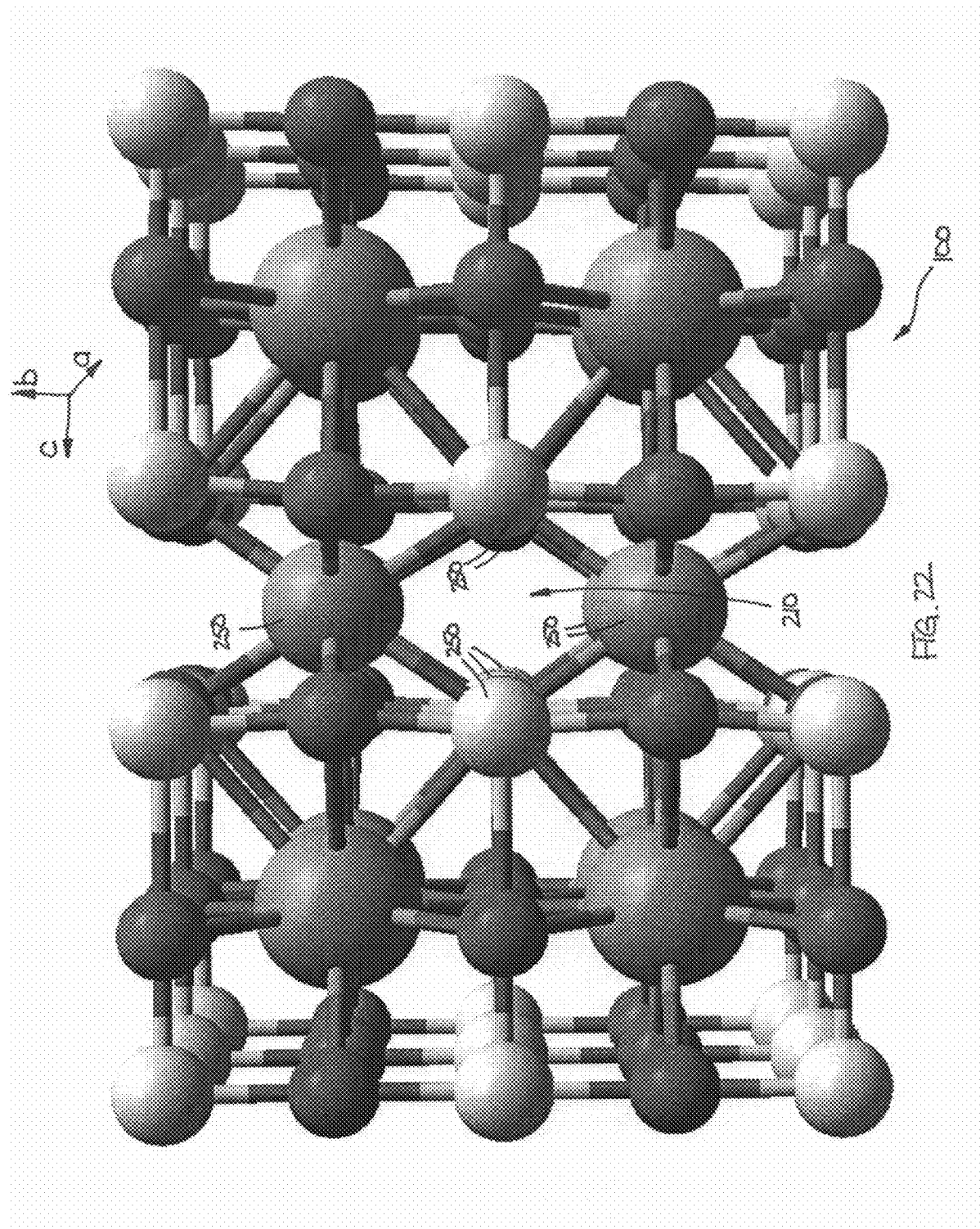
FIG. 22 illustrates a crystalline structure of an exemplary ELR material as viewed from a second perspective.

FIG. 1 illustrates a crystalline structure 100 of an exemplary ELR material as viewed from a first perspective, namely, a perspective perpendicular to an "a-b" face of crystalline structure 100 and parallel to the c-axis thereof. FIG. 2 illustrates crystalline structure 100 as viewed from a second perspective, namely, a perspective perpendicular to a "b-c" face of crystalline structure 100 and parallel to the a-axis thereof. FIG. 22 illustrates additional depth (i.e., into the page) for crystalline structure 100 of the exemplary ELR material. For purposes of this description, the exemplary ELR material illustrated in FIG. 1, FIG. 2 and FIG. 22 is generally representative of various ELR materials. In some implementations of the invention, the exemplary ELR material may be a representative of a family of superconducting materials referred to as mixed-valence copper-oxide perovskites. The mixed-valence copper-oxide perovskite materials include, but are not limited to, $LaBaCuo_x$, LSCO (e.g., $La_{2-x}Sr_xCuO_4$, etc.), YBCO (e.g., $YBa_2Cu_3O_7$, etc.), BSCCO (e.g., $Bi_2Sr_2Ca_2Cu_3O_{10}$, etc.), TBCCO (e.g., $Tl_2Ba_2Ca_2Cu_3O_{10}$ or $Tl_mBa_2Ca_{n-1}Cu_nO_{2n+m+2+\delta}$), $HgBa_2Ca_2Cu_3O_x$, and other mixed-valence copper-oxide perovskite materials. The other mixed-valence copper-oxide perovskite materials may include, but are not limited to, various substitutions of the cations as would be appreciated. As would also be appreciated, the aforementioned named mixed-valence copper-oxide perovskite materials may refer to generic classes of materials in which many different formulations exist. In some implementations of the invention, the exemplary ELR materials may include an HTS material outside of the family of mixed-valence copper-oxide perovskite materials ("non-perovskite materials"). Such non-perovskite materials may include, but are not limited to, iron pnictides, magnesium diboride ($MgB_2$), and other non-perovskites. In some implementations of the invention, the exemplary ELR materials may be other superconducting materials. Other materials having an aperture 210 may be exploited in accordance with various aspects of the invention as would be appreciated.

Figure 21:
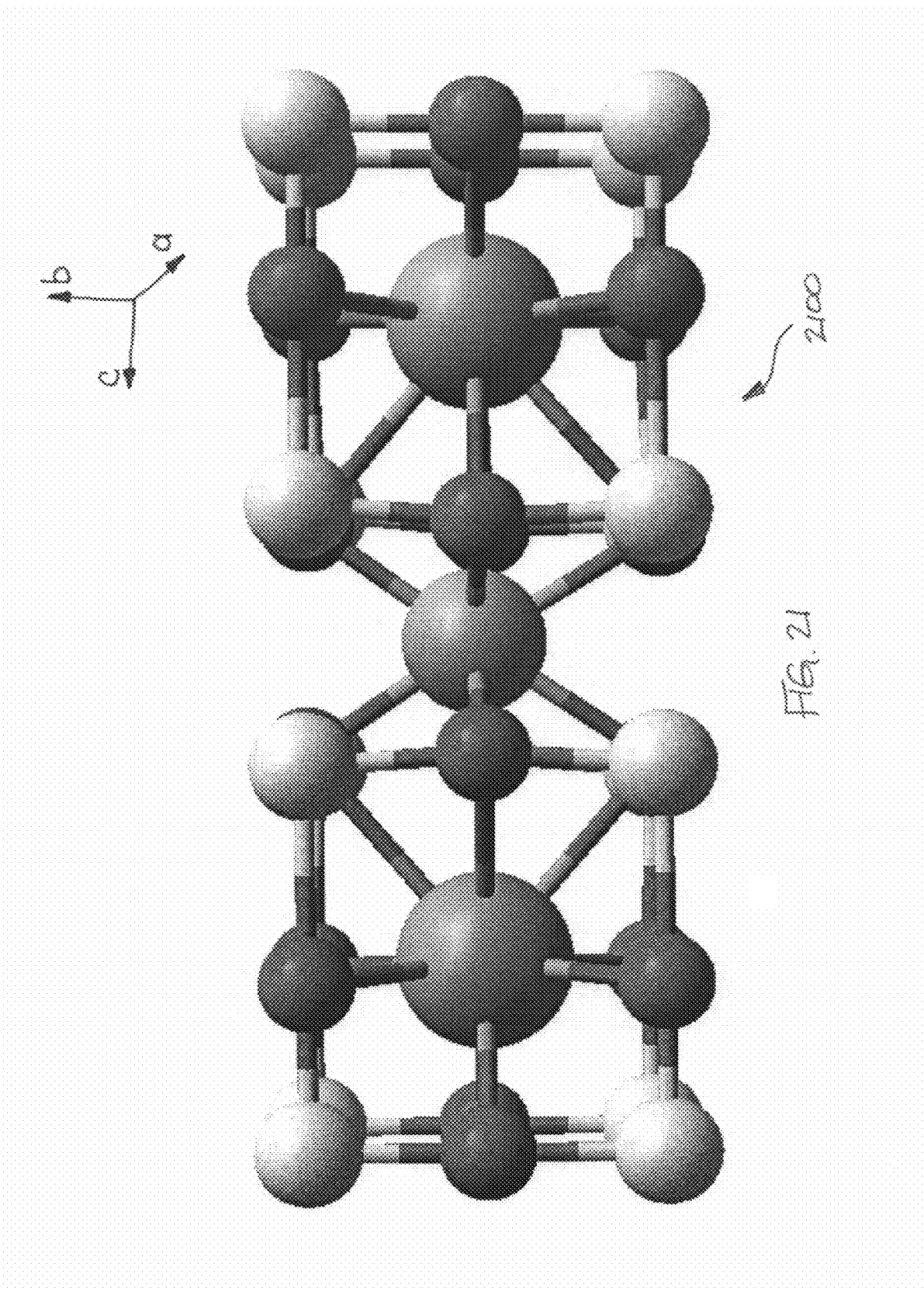
FIG. 21 illustrates a single unit cell of an exemplary ELR material.

Many ELR materials have a structure similar to (though not necessarily identical to) that of crystalline structure 100 with different atoms, combinations of atoms, and/or lattice arrangements as would be appreciated. As illustrated in FIG. 2, crystalline structure 100 is depicted with two complete unit cells of the exemplary ELR material, with one unit cell above reference line 110 and one unit cell below reference line 110. FIG. 21 illustrates a single unit cell 2100 of the exemplary ELR material.

Generally speaking and as would be appreciated, a unit cell 2100 of the exemplary ELR material includes six "faces": two "a-b" faces that are parallel to the c-plane; two "a-c" faces that are parallel to the b-plane; and two "b-c" faces that are parallel to the a-plane (see, e.g., FIG. 31). As would also be appreciated, a "surface" of ELR material in the macro sense may be comprised of multiple unit cells 2100 (e.g., hundreds, thousands or more). Reference in this description to a "surface" or "face" of the ELR material being parallel to a particular plane (e.g., the a-plane, the b-plane or the c-plane) indicates that the surface is formed predominately (i.e., a vast majority) of faces of unit cell 2100 that are substantially parallel to the particular plane. Furthermore, reference in this description to a "surface" or "face" of the ELR material being parallel to planes other than the a-plane, the b-plane, or the c-plane (e.g., an ab-plane as described below, etc.) indicates that the surface is formed from some mixture of faces of unit cell 2100 that, in the aggregate macro sense, form a surface substantially parallel to such other planes.

Studies indicate that some ELR materials demonstrate an anisotropic (i.e., directional) dependence of the resistance phenomenon. In other words, resistance at a given temperature and current density depends upon a direction in relation to crystalline structure 100. For example, in their ELR state, some ELR materials can carry significantly more current, at zero resistance, in the direction of the a-axis and/or in the direction of the b-axis than such materials do in the direction of the c-axis. As would be appreciated, various ELR materials exhibit anisotropy in various performance phenomenon, including the resistance phenomenon, in directions other than, in addition to, or as combinations of those described above. For purposes of this description, reference to a material that tends to exhibit the resistance phenomenon (and similar language) in a first direction indicates that the material supports such phenomenon in the first direction; and reference to a material that tends not to exhibit the resistance phenomenon (and similar language) in a second direction indicates that the material does not support such phenomenon in the second direction or does so in a reduced manner from other directions.

Figure 3:
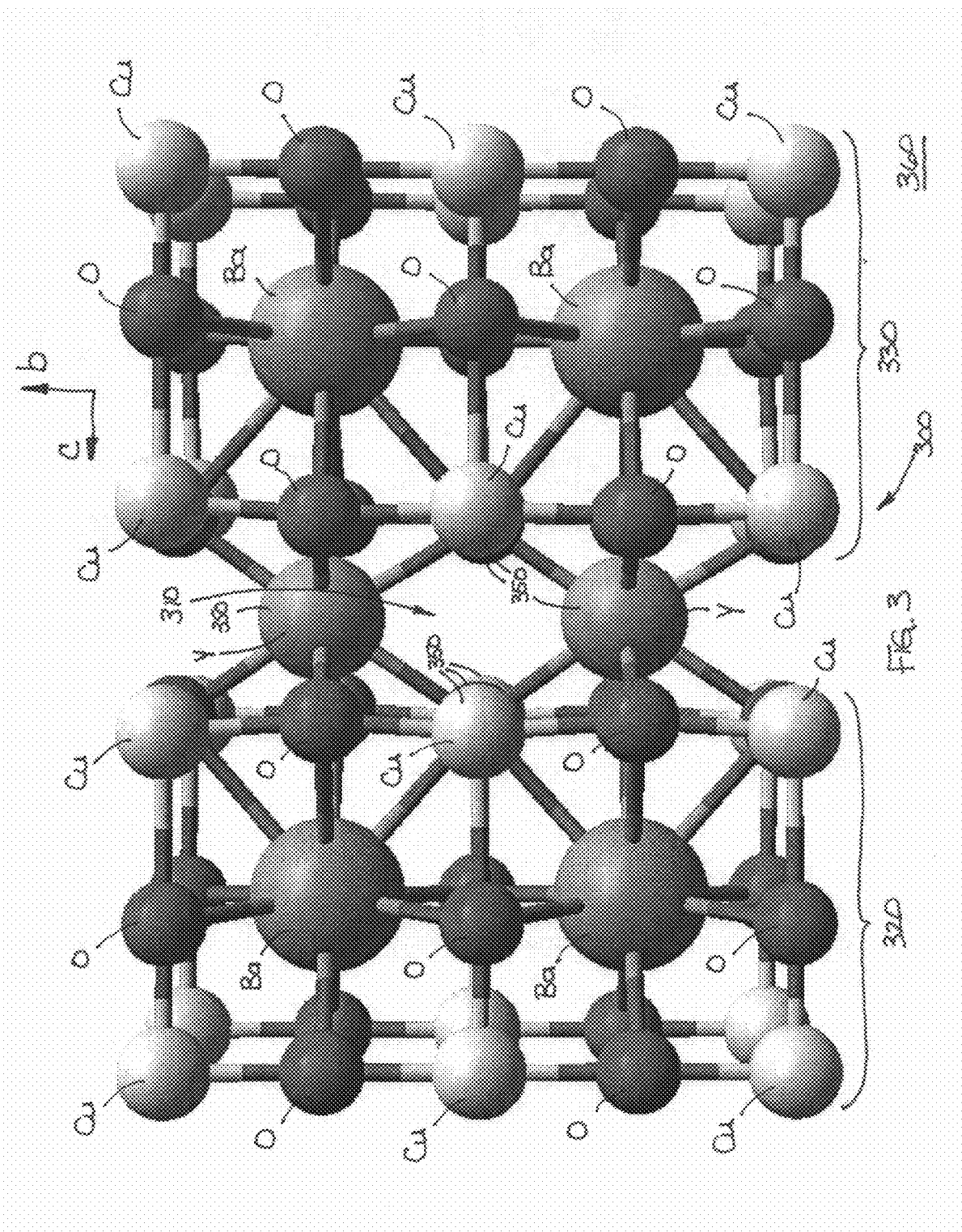
FIG. 3 illustrates a crystalline structure of an exemplary ELR material as viewed from a second perspective.

Conventional understanding of known ELR materials has thus far failed to appreciate an aperture 210 formed within crystalline structure 100 by a plurality of aperture atoms 250 as being responsible for the resistance phenomenon. (See e.g., FIG. 21, where aperture 210 is not readily apparent in a depiction of single unit cell 2100.) As will be further described below, aperture 210 exists in many known ELR materials. In some sense, aperture atoms 250 may be viewed as forming a discrete atomic "boundary" or "perimeter" around aperture 210. In some implementations of the invention and as illustrated in FIG. 2, aperture 210 appears between a first portion 220 and a second portion 230 of crystalline structure 100 although in some implementations of the invention, aperture 210 may appear in other portions of various other crystalline structures. While aperture 210, aperture 310, and other apertures are illustrated in FIG. 2, FIG. 3, and elsewhere in the drawings based on depictions of atoms as simple "spheres," it would be appreciated that such apertures are related to and shaped by, among other things, electrons and their associated electron densities (not otherwise illustrated) of various atoms in crystalline structure 100, including aperture atoms 250.

According to various aspects of the invention, aperture 210 facilitates propagation of electrical charge through crystalline structure 100 and when aperture 210 facilitates propagation of electrical charge through crystalline structure 100, ELR material operates in its ELR state. For purposes of this description, "propagates," "propagating," and/or "facilitating propagation" (along with their respective forms) generally refer to "conducts," "conducting" and/or "facilitating conduction" and their respective forms; "transports," "transporting" and/or "facilitating transport" and their respective forms; "guides," "guiding" and/or "facilitating guidance" and their respective forms; and/or "carry," "carrying" and/or "facilitating carrying" and their respective forms. For purposes of this description, electrical charge may include positive charge or negative charge, and/or pairs or other groupings of such charges. For purposes of this description, current carriers may include, but are not limited to, electrons. In some implementations of the invention, aperture 210 propagates negative charges through crystalline structure 100. In some implementations of the invention, aperture 210 propagates positive charges through crystalline structure 100. In some implementations of the invention, aperture 210 propagates pairs or other groupings of electrical charge through crystalline structure 100. In some implementations of the invention, aperture 210 propagates current carriers through crystalline structure 100. In some implementations of the invention, aperture 210 propagates pairs or other groupings of current carriers through crystalline structure 100. In some implementations of the invention, aperture 210 propagates electrical charge in the form of one or more particles through crystalline structure 100. In some implementations of the invention, aperture 210 propagates electrons, pairs of electrons, and/or groupings of electrons in the form of one or more particles through crystalline structure 100. In some implementations of the invention, aperture 210 propagates electrical charge in the form of one or more waves or wave packets through crystalline structure 100. In some implementations of the invention, aperture 210 propagates electrons, pairs of electrons, and/or groupings of electrons in the form of one or more waves or wave packets through crystalline structure 100.

In some implementations of the invention, propagation of electrical charge through crystalline structure 100 may be in a manner analogous to that of a waveguide. In some implementations of the invention, aperture 210 may be a waveguide with regard to propagating electrical charge through crystalline structure 100. Waveguides and their operation are generally well understood. In particular, walls surrounding an interior of the waveguide may correspond to the boundary or perimeter of aperture atoms 250 around aperture 210. One aspect relevant to an operation of a waveguide is its cross-section. Typically, the cross-section of a waveguide is related to a wavelength of the signals capable of propagating through the waveguide. Accordingly, the wavelength of the electrical charge propagating through aperture 210 may be related to the cross-section of aperture 210. At the atomic level, aperture 210 and/or its cross-section may change substantially with changes in temperature of the ELR material. For example, in some implementations of the invention, changes in temperature of the ELR material may cause changes in aperture 210 and its operating characteristics, which in turn may cause the ELR material to transition between its ELR state to its non-ELR state. In some implementations of the invention, as temperature of the ELR material increases, aperture 210 may restrict or impede propagation of electrical charge through crystalline structure 100 and the corresponding ELR material may transition from its ELR state to its non-ELR state. In some implementations of the invention, as temperature of the ELR material increases, the cross-section of aperture 210 may change, thereby inhibiting operation of aperture 210 in a manner analogous to a waveguide and the corresponding ELR material may transition from its ELR state to its non-ELR state. Likewise as temperature of the ELR material decreases, in some implementations of the invention, aperture 210 may facilitate (as opposed to restrict or impede) propagation of electrical charge through crystalline structure 100 and the corresponding ELR material may transition from its non-ELR state to its ELR state. In some implementations of the invention, the cross-section of aperture 210 may change, thereby facilitating operation of aperture 210 as a waveguide (or in a manner analogous thereto) and the corresponding ELR material may transition from its non-ELR state to its ELR state.

According to various implementations of the invention, as long as aperture 210 is "maintained" within a given ELR material, the ELR material should operate in an ELR state. In various implementations of the invention, as long as aperture 210 is maintained within a given ELR material, aperture 210 should operate in an ELR state. In various implementations of the invention, maintaining aperture 210 may include: maintaining aperture 210 in an ELR state; maintaining an ability of aperture 210 to propagate electrical charge through crystalline structure 100 in an ELR state; maintaining aperture atoms 250 relative to one another so that ELR material operates in an ELR state; maintaining aperture atoms 250 with respect to other atoms within crystalline structure 100 so that the ELR material operates in an ELR state; maintaining a cross-section of aperture 210 sufficient to propagate electrical charge there through so that the ELR material remains in an ELR state; maintaining a cross-section of aperture 210 such that it does not impede, restrict, or otherwise interfere with the propagation of electrical charge so that the ELR material remains in an ELR state; maintaining a cross-section of aperture 210 sufficient to propagate current carriers there through so that ELR material remains in an ELR state; maintaining a cross-section of aperture 210 such that it does not interfere with current carriers so that the ELR material remains in an ELR state; maintaining aperture 210 substantially free from obstruction so that the ELR material remains in an ELR state; maintaining aperture 210 so that ELR material operates with improved operating characteristics; enhancing aperture 210 so that the ELR material operates in an ELR state with improved operating characteristics; enhancing aperture 210 so that the enhanced aperture operates in an ELR state with improved operating characteristics; and/or other ways of maintaining aperture 210 such that ELR material operates in an ELR state. According to various implementations of the invention, maintaining aperture 210 within existing ELR materials may improve the operating characteristics of these existing ELR materials. According to various implementations of the invention, maintaining an aperture 210 within new materials may result in new ELR materials, some of which may have improved operating characteristics over existing ELR materials. According to various implementations of the invention, as long as aperture 210 is maintained within a given ELR material as temperature increases, the ELR material should operate in an ELR state. According to various implementations of the invention, as long as aperture 210 is maintained so as to propagate electrical charge through crystalline structure 100, the ELR material should operate in an ELR state. According to various implementations of the invention, as long as aperture 210 is maintained so as to propagate current carriers through crystalline structure 100, the ELR material should operate in an ELR state. According to various implementations of the invention, as long as aperture atoms 250 are maintained relative to one another within a given ELR material, the ELR material should operate in an ELR state. According to various implementations of the invention, as long as aperture atoms 250 are maintained relative to other atoms within crystalline structure 100 within a given ELR material, the ELR material should operate in an ELR state. According to various implementations of the invention, as long as a cross-section of aperture 210 is maintained sufficient to propagate electrical charge through aperture 210 within a given ELR material, the ELR material should operate in an ELR state. According to various implementations of the invention, as long as a cross-section of aperture 210 is maintained sufficient to propagate current carriers through aperture 210 within a given ELR material, the ELR material should operate in an ELR state. According to various implementations of the invention, as long as a cross-section of aperture 210 is maintained such that electrical charge receives little or no interference through aperture 210, the ELR material should operate in an ELR state. According to various implementations of the invention, as long as a cross-section of aperture 210 is maintained such that current carriers receive little or no interference through aperture 210, the ELR material should operate in an ELR state. According to various implementations of the invention, as long as a cross-section of aperture 210 is maintained substantially free from obstruction within a given ELR material, the ELR material should operate in an ELR state.

According to various implementations of the invention, aperture 210 may be maintained, and/or designed to be maintained, such that aperture 210 propagates electrical charge there through with little or no interference. In some implementations of the invention, electrical charge propagating through aperture 210 collides elastically with the boundary or "walls" of aperture 210 similar to the way reflection occurs in an optical waveguide. More particularly, electrical charge propagating through aperture 210 collides elastically with various aperture atoms 250 that comprise the boundary or walls of aperture 210. As long as such collisions are elastic, the electrical charge will experience minimal loss (i.e., "resistance") as it propagates through aperture 210.

Apertures, such as, but not limited to, aperture 210 in FIG. 2, exist in various ELR materials, such as, but not limited to, various ELR materials illustrated in FIG. 3, FIG. 17, FIG. 18, FIG. 19, FIG. 45, FIG. 46, etc., and described below. As illustrated, such apertures are intrinsic to the crystalline structure of some or all the ELR materials. Various forms, shapes, sizes, and numbers of apertures 210 exist in ELR materials depending on the precise configuration of the crystalline structure, composition of atoms, and arrangement of atoms within the crystalline structure of the ELR material as would be appreciated in light of this description.

Figure 11:
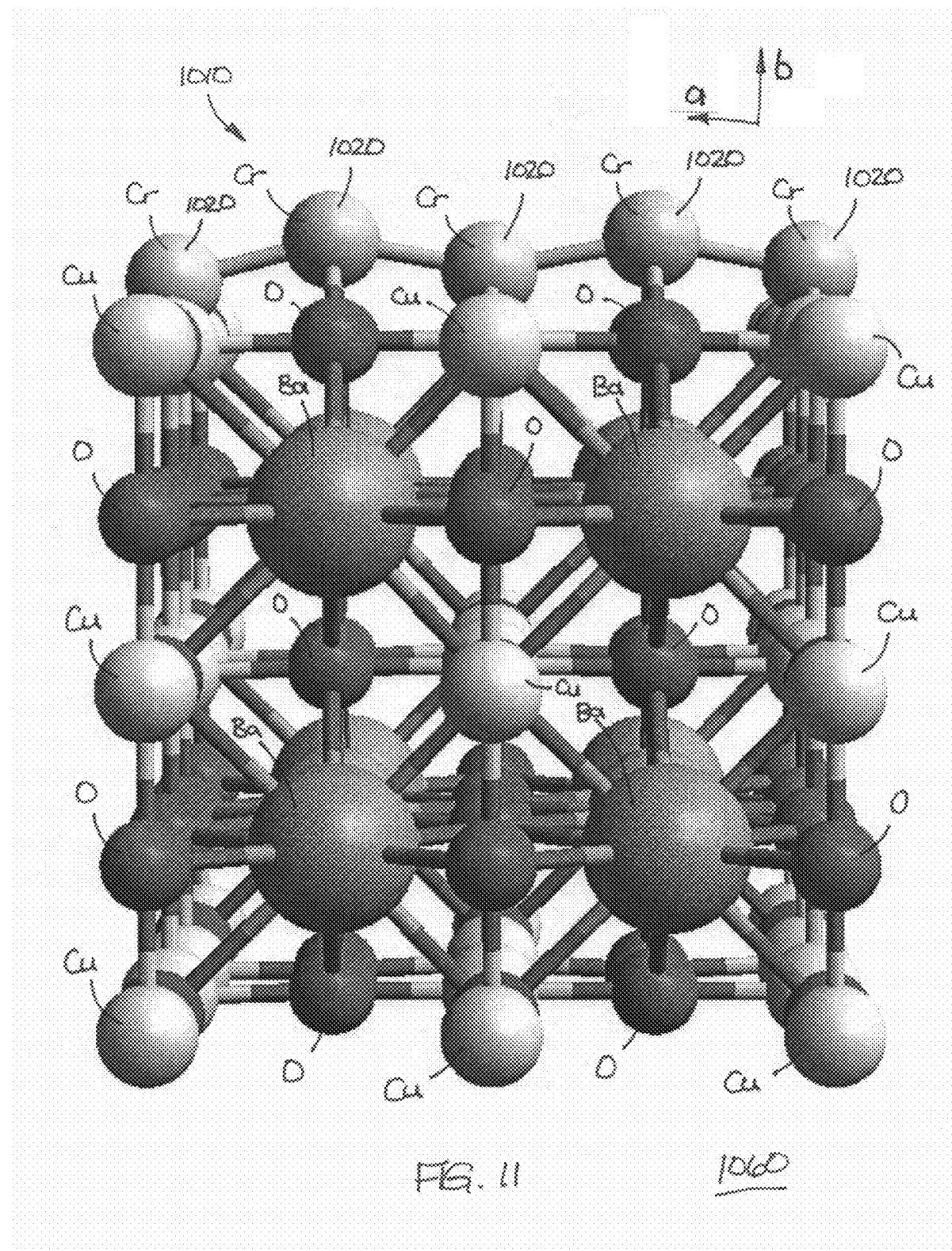
FIG. 11 illustrates a modified crystalline structure, according to various implementations of the invention, of an ELR material as viewed from a first perspective.

The presence and absence of apertures 210 that extend in the direction of various axes through the crystalline structures 100 of various ELR materials is consistent with the anisotropic dependence demonstrated by such ELR materials. For example, as will be discussed in further detail below, various ELR materials illustrated in FIG. 3, FIG. 17, FIG. 18, FIG. 19, FIG. 45, FIG. 46, etc., have apertures that extend in the directions in which these materials demonstrate the resistance phenomenon; similarly, these ELR materials tend not to have apertures that extend in the directions in which these materials do not demonstrate the resistance phenomenon. For example, YBCO-123 exhibits the resistance phenomenon in the direction of the a-axis and the b-axis, but tends not to exhibit the resistance phenomenon in the direction of the c-axis. ELR material 360 which is illustrated in FIG. 3, FIG. 11, and FIG. 30 corresponds to YBCO-123. Consistent with the anisotropic dependence of the resistance phenomenon demonstrated by YBCO-123, FIG. 3 illustrates that apertures 310 extend through crystalline structure 300 in the direction of the a-axis; FIG. 30 illustrates that apertures 310 and apertures 3010 extend through crystalline structure 300 in the direction of the b-axis; and FIG. 11 illustrates that no suitable apertures extend through crystalline structure 300 in the direction of the c-axis.

Aperture 210 and/or its cross-section may be dependent upon various atomic characteristics of aperture atoms 250. Such atomic characteristics include, but are not limited to, atomic size, atomic weight, numbers of electrons, number of bonds, bond lengths, bond strengths, bond angles between aperture atoms, bond angles between aperture atoms and non-aperture atoms, and/or isotope number. Aperture atoms 250 may be selected based on their corresponding atomic characteristic to optimize aperture 210 in terms of its size, shape, rigidity, and modes of vibration (in terms of amplitude, frequency, and direction) in relation to crystalline structure and/or atoms therein.

In some implementations of the invention, at least some of aperture atoms 250 include atoms having high electro-negativity, for example, but not limited to, oxygen. In some implementations of the invention, at least some of aperture atoms 250 include atoms of an element understood as having some degree of conductivity in their bulk form. In some implementations of the invention, some of aperture atoms 250 include atoms having high electro-negativity and some others of aperture atoms 250 include atoms of an element understood as having some degree of conductivity. In some implementations of the invention, aperture atoms 250 may provide a source of electrical charge (e.g., electrons, etc.) that propagates through aperture 210. In some implementations of the invention, aperture atoms 250 may provide a readily available source of electrical charge for flow of such electrical charge to occur through aperture 210.

Aperture 210 and/or its cross-section may be dependent upon various atomic characteristics of "non-aperture atoms" (i.e., atoms in crystalline structure 100 other than aperture atoms 250). Such atomic characteristics include, but are not limited to, atomic size, atomic weight, numbers of electrons, electronic structure, number of bonds, types of bonds, differing bonds, multiple bonds, bond lengths, bond strengths, and/or isotope number. The non-aperture atoms may also be selected based on their corresponding atomic characteristics to optimize aperture 210 in terms of its size, shape, rigidity, and their modes of vibration (in terms of amplitude, frequency, and direction) in relation to crystalline structure and/or atoms therein. In some implementations of the invention, non-aperture atoms may provide a source of electrical charge (e.g., electrons, etc.) that propagates through aperture 210. In some implementations of the invention, non-aperture atoms may provide a readily available source of electrical charge for flow of such electrical charge to occur through aperture 210.

In some implementations of the invention, aperture 210 may be dependent upon various atomic characteristics of non-aperture atoms in relation to aperture atoms 250. In some implementations of the invention, aperture 210 may be dependent upon various atomic characteristics of aperture atoms 250 in relation to non-aperture atoms. In some implementations of the invention, aperture 210 may be dependent upon various atomic characteristics of aperture atoms 250 in relation to other aperture atoms 250. In some implementations of the invention, aperture 210 may be dependent upon various atomic characteristics of non-aperture atoms in relation to other non-aperture atoms.

According to various implementations of the invention, changes to aperture 210 within crystalline structure 110 may have an impact on the resistance phenomenon. According to various implementations of the invention, changes to the cross-section of aperture 210 may have an impact on the resistance phenomenon. According to various implementations of the invention, changes to obstructions within aperture 210, including changes to a size of the obstruction, a number of the obstructions, or a frequency or probability with which such obstructions appear, may have an impact on the resistance phenomenon. In some implementations of the invention, such obstructions may be dependent upon various atomic characteristics of aperture atoms 250. In some implementations of the invention, such obstructions may be dependent upon various atomic characteristics of non-aperture atoms. Atomic characteristics include, but are not limited to, atomic size, atomic weight, numbers of electrons, electronic structure, number of bonds, types of bonds, differing bonds, multiple bonds, bond lengths, bond strengths, and/or isotope number.

According to various implementations of the invention, changes in a physical structure of aperture 210, including changes to a shape and/or size of its cross-section, may have an impact on the resistance phenomenon. According to various implementations of the invention, changes in an electronic structure of aperture 210 may have an impact on the resistance phenomenon. According to various implementations of the invention, changes in crystalline structure 100 that affect aperture atoms 250 may have an impact on the resistance phenomenon. Changes affecting aperture atoms 250 may include, but are not limited to: 1) displacement of a nucleus of an aperture atom relative to other aperture atoms; 2) displacement of a nucleus of a non-aperture atom relative to aperture atoms; 3) changing possible energy states of aperture and/or non-aperture atoms; and 4) changing occupancy of such possible energy states. Any of such changes or combinations of such changes may affect aperture 210. For example, as temperature of crystalline structure 100 increases, the cross-section of aperture 210 may be changed due to vibration of various atoms within crystalline structure 100 as well as changes in energy states, or occupancy thereof, of the atoms in crystalline structure 100. Physical flexure, tension or compression of crystalline structure 100 may also affect the positions of various atoms within crystalline structure 100 and therefore the cross-section of aperture 210. Magnetic fields imposed on crystalline structure 100 may also affect the positions of various atoms within crystalline structure 100 and therefore the cross-section of aperture 210.

Phonons correspond to various modes of vibration within crystalline structure 100. Phonons in crystalline structure 100 may interact with electrical charge propagated through crystalline structure 100. More particularly, phonons in crystalline structure 100 may cause atoms in crystalline structure 100 (e.g., aperture atoms 250, non-aperture atoms, etc.) to interact with electrical charge propagated through crystalline structure 100. Higher temperatures result in higher phonon amplitude and may result in increased interaction among phonons, atoms in crystalline structure 100, and such electrical charge. Various implementations of the invention may minimize, reduce, or otherwise modify such interaction among phonons, atoms in crystalline structure 100, and such electrical charge within crystalline structure 100.

In some implementations of the invention, modifications to crystalline structure 100 of an existing ELR material may be made to maintain aperture 210 within crystalline structure 100 thereby permitting the existing ELR material to operate with improved operating characteristics. In some implementations of the invention, modifications to crystalline structure 100 of an existing ELR material may be made to maintain aperture 210 within crystalline structure 100 at higher temperatures thereby permitting the existing ELR material to operate with improved operating characteristics. In some implementations of the invention, modifications to crystalline structure 100 of the existing ELR material may be made to maintain aperture 210 within crystalline structure 100 at higher temperatures thereby permitting the existing ELR material to remain in an ELR state at higher temperatures and/or with increased current capacity and/or with other improved operational characteristics. In some implementations of the invention, new ELR materials may be designed with crystalline structures that form and maintain aperture 210 at higher temperatures and/or with increased current capacity and/or with other improved operational characteristics. Various mechanisms may be used to modify crystalline structure 100 in order to maintain aperture 210.

In some implementations of the invention, aperture 210 is maintained at temperatures at, about, or above that of liquid nitrogen. In some implementations of the invention, aperture 210 is maintained at temperatures at, about, or above that of solid carbon dioxide. In some implementations of the invention, aperture 210 is maintained at temperatures at, about, or above that of liquid ammonia. In some implementations of the invention, aperture 210 is maintained at temperatures at, about, or above that of various formulations of liquid Freon. In some implementations of the invention, aperture 210 is maintained at temperatures at, about, or above that of frozen water. In some implementations of the invention, aperture 210 is maintained at temperatures at, about, or above that of room temperature (e.g., 21° C.).

Accordingly, various new ELR materials may be created, either as modifications of existing ELR materials or design and formation of new ELR materials. In some implementations of the invention, an ELR material operates in an ELR state at temperatures at, about, or above that of liquid nitrogen. In some implementations of the invention, an ELR material operates in an ELR state at temperatures at, about, or above that of solid carbon dioxide. In some implementations of the invention, an ELR material operates in an ELR state at temperatures at, about, or above that of liquid ammonia. In some implementations of the invention, an ELR material operates in an ELR state temperatures at, about, or above that of various formulations of liquid Freon. In some implementations of the invention, an ELR material operates in an ELR state at temperatures at, about, or above that of frozen water. In some implementations of the invention, an ELR material operates in an ELR state at temperatures at, about, or above that of room temperature (e.g., 21° C.). In some implementations of the invention, portions of the ELR material operates in the ELR state at, about, or above any one or more of these temperatures.

FIG. 3 illustrates a crystalline structure 300 of an exemplary ELR material 360 from a second perspective. Exemplary ELR material 360 is a superconducting material commonly referred to as "YBCO" which, in certain formulations, has a transition temperature of approximately 90K. In particular, exemplary ELR material 360 depicted in FIG. 3 is YBCO-123. Crystalline structure 300 of exemplary ELR material 360 includes various atoms of yttrium ("Y"), barium ("Ba"), copper ("Cu") and oxygen ("O"). As illustrated in FIG. 3, an aperture 310 is formed within crystalline structure 300 by aperture atoms 350, namely atoms of yttrium, copper, and oxygen. A cross-sectional distance between the yttrium aperture atoms in aperture 310 is approximately 0.389 nm, a cross-sectional distance between the oxygen aperture atoms in aperture 310 is approximately 0.285 nm, and a cross-sectional distance between the copper aperture atoms in aperture 310 is approximately 0.339 nm.

FIG. 3O illustrates crystalline structure 300 of exemplary ELR material 360 from a third perspective. Similar to that described above with regard to FIG. 3, exemplary ELR material 360 is YBCO-123, and aperture 310 is formed within crystalline structure 300 by aperture atoms 350, namely atoms of yttrium, copper, and oxygen. In this orientation, a cross-sectional distance between the yttrium aperture atoms in aperture 310 is approximately 0.382 nm, a cross-sectional distance between the oxygen aperture atoms in aperture 310 is approximately 0.288 nm, and a cross-sectional distance between the copper aperture atoms in aperture 310 is approximately 0.339 nm. In this orientation, in addition to aperture 310, crystalline structure 300 of exemplary ELR material 360 includes an aperture 3010. Aperture 3010 occurs in the direction of the b-axis of crystalline structure 300. More particularly, aperture 3010 occurs between individual unit cells of exemplary ELR material 360 in crystalline structure 300. Aperture 3010 is formed within crystalline structure 300 by aperture atoms 3050, namely atoms of barium, copper and oxygen. A cross-sectional distance between the barium aperture atoms 3050 in aperture 3010 is approximately 0.430 nm, a cross-sectional distance between the oxygen aperture atoms 3050 in aperture 3010 is approximately 0.382 nm, and a cross-sectional distance between the copper aperture atoms 3050 in aperture 3010 is approximately 0.382 nm. In some implementations of the invention, aperture 3010 operates in a manner similar to that described herein with regard to aperture 310. For purposes of this description, aperture 310 in YBCO may be referred to as an "yttrium aperture," whereas aperture 3010 in YBCO may be referred to as a "barium aperture," based on the compositions of their respective aperture atoms 350, 3050.

FIG. 17 illustrates a crystalline structure 1700 of an exemplary ELR material 1760 as viewed from the second perspective. Exemplary ELR material 1760 is an HTS material commonly referred to as "HgBa$_2$CuO$_4$" which has a transition temperature of approximately 94K. Crystalline structure 1700 of exemplary ELR material 1760 includes various atoms of mercury ("Hg"), barium ("Ba"), copper ("Cu"), and oxygen ("O"). As illustrated in FIG. 17, an aperture 1710 is formed within crystalline structure 1700 by aperture atoms which comprise atoms of barium, copper, and oxygen.

Figure 18:
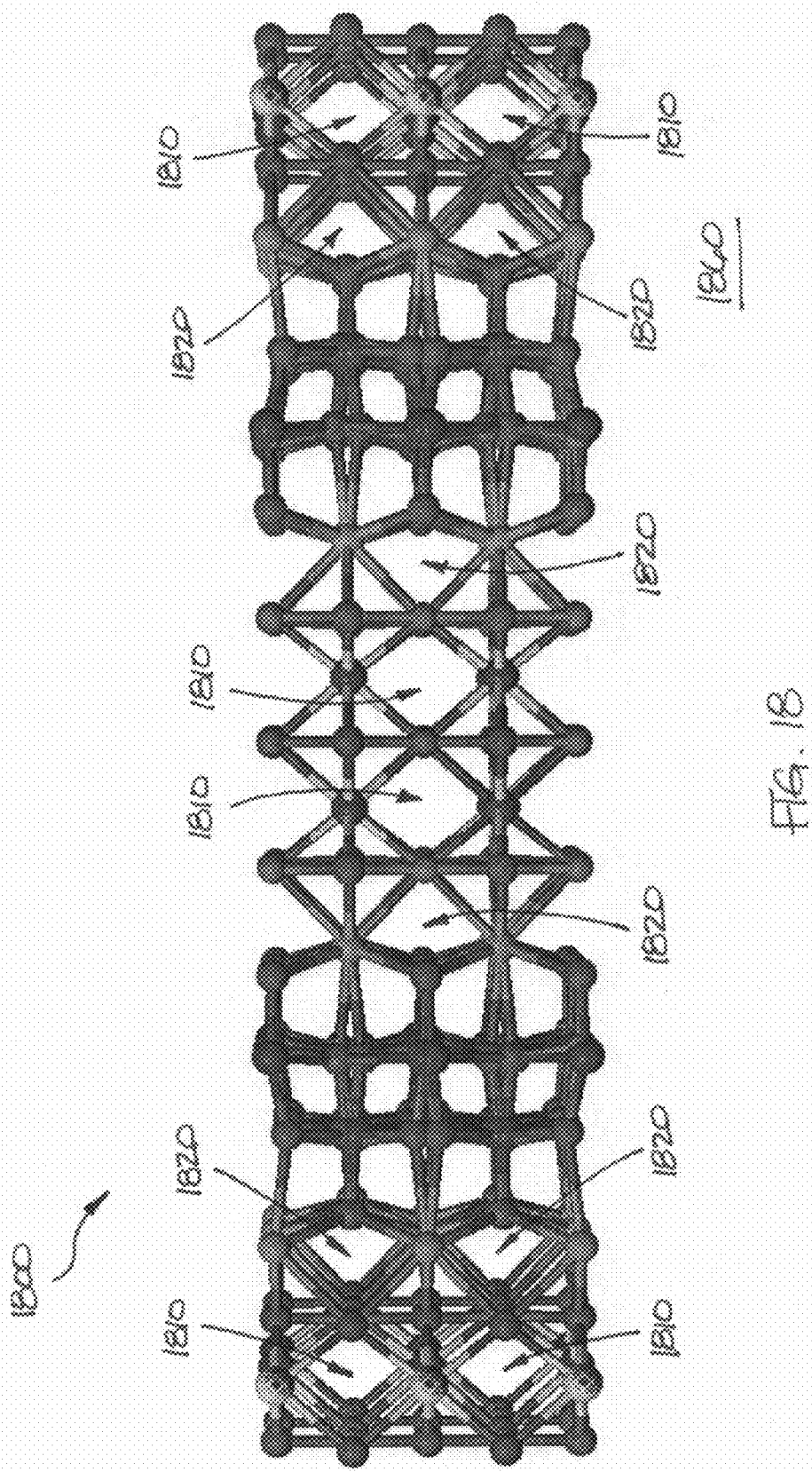
FIG. 18 illustrates a crystalline structure of an exemplary ELR material as viewed from a second perspective.

FIG. 18 illustrates a crystalline structure 1800 of an exemplary ELR material 1860 as viewed from the second perspective. Exemplary ELR material 1860 is an HTS material commonly referred to as "Tl$_2$Ca$_2$Ba$_2$Cu$_3$O$_{10}$" which has a transition temperature of approximately 128K. Crystalline structure 1800 of exemplary ELR material 1860 includes various atoms of thallium ("Tl"), calcium ("Ca"), barium ("Ba"), copper ("Cu"), and oxygen ("O"). As illustrated in FIG. 18, an aperture 1810 is formed within crystalline structure 1800 by aperture atoms which comprise atoms of calcium, barium, copper and oxygen. As also illustrated in FIG. 18, a secondary aperture 1820 may also be formed within crystalline structure 1800 by secondary aperture atoms which comprise atoms of calcium, copper and oxygen. Secondary apertures 1820 may operate in a manner similar to that of apertures 1810.

Figure 19:
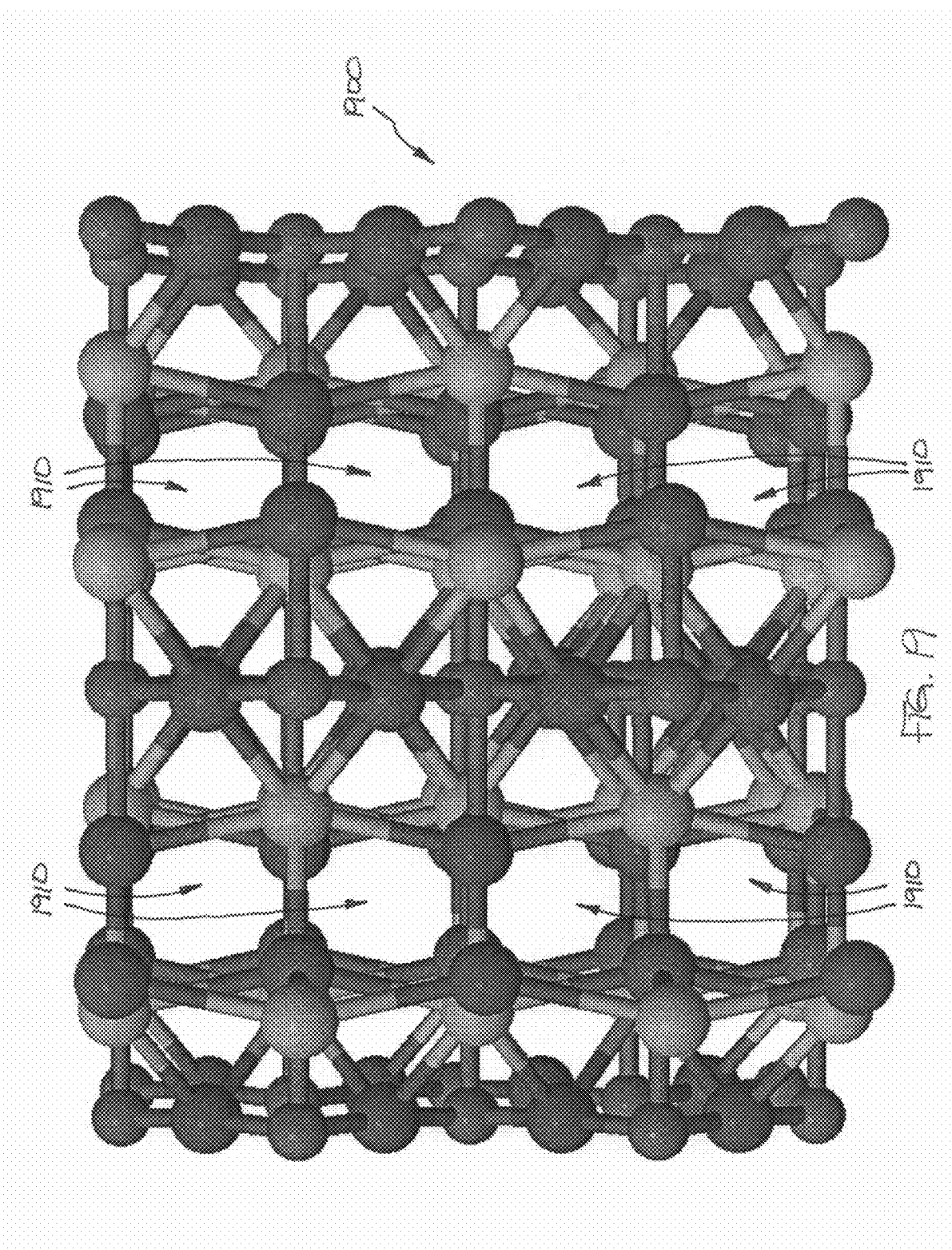
FIG. 19 illustrates a crystalline structure of an exemplary ELR material as viewed from a second perspective.

FIG. 19 illustrates a crystalline structure 1900 of an exemplary ELR material 1960 as viewed from the second perspective. Exemplary ELR material 1960 is an HTS material commonly referred to as "La$_2$CuO$_4$" which has a transition temperature of approximately 39K. Crystalline structure 1900 of exemplary ELR material 1960 includes various atoms of lanthanum ("La"), copper ("Cu"), and oxygen ("O"). As illustrated in FIG. 19, an aperture 1910 is formed within crystalline structure 1900 by aperture atoms which comprise atoms of lanthanum and oxygen.

Figure 45:
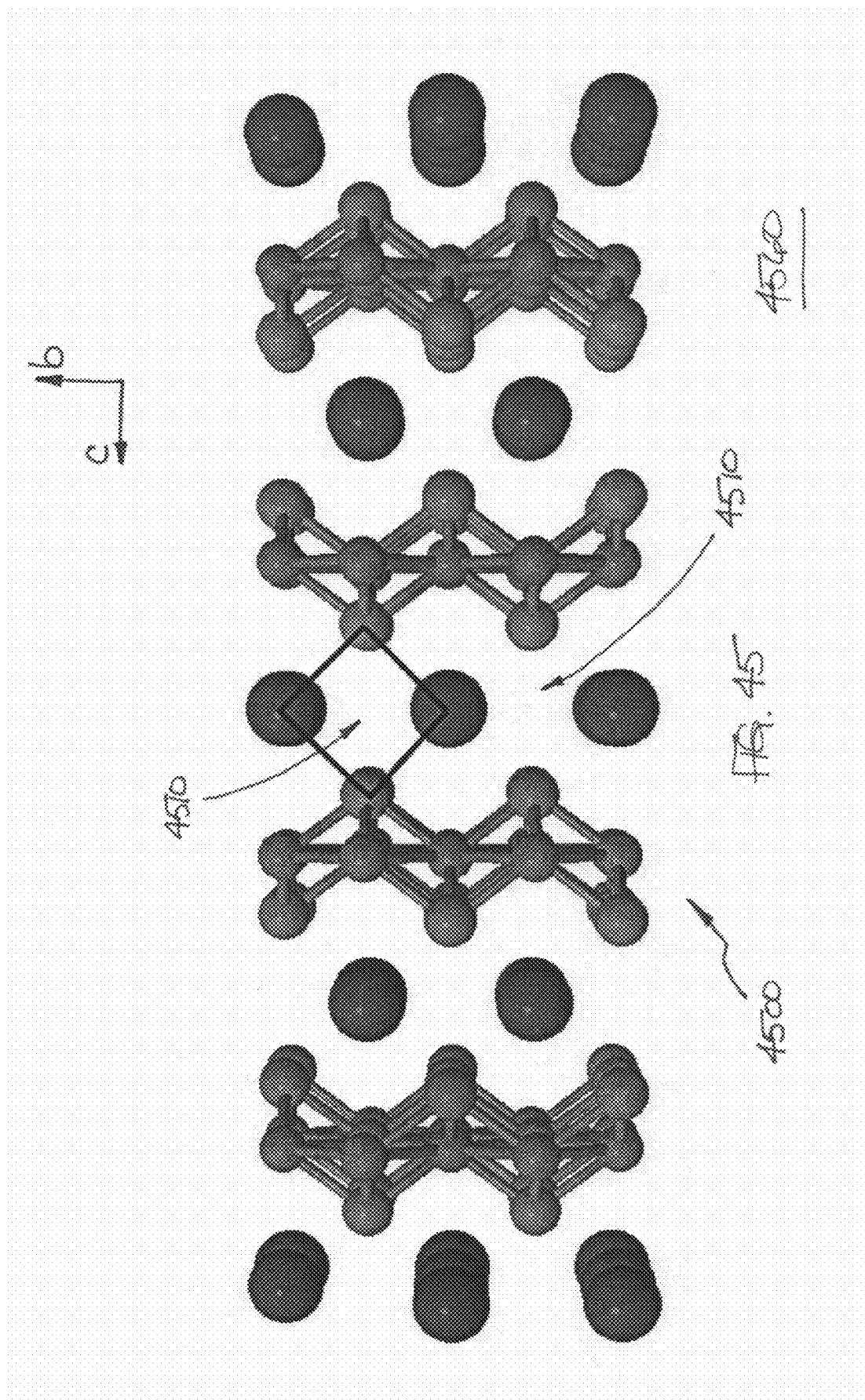
FIG. 45 illustrates a crystalline structure of an exemplary ELR material as viewed from a second perspective.

FIG. 45 illustrates a crystalline structure 4500 of an exemplary ELR material 4560 as viewed from the second perspective. Exemplary ELR material 4560 is an HTS material commonly referred to as "As$_2$Ba$_{0.34}$Fe$_2$K$_{0.66}$" which has a transition temperature of approximately 38K. Exemplary ELR material 4560 is representative of a family of ELR materials sometimes referred to as "iron pnictides." Crystalline structure 4500 of exemplary ELR material 4560 includes various atoms of arsenic ("As"), barium ("Ba"), iron ("Fe"), and potassium ("K"). As illustrated in FIG. 45, an aperture 4510 is formed within crystalline structure 4500 by aperture atoms which comprise atoms of potassium and arsenic.

FIG. 46 illustrates a crystalline structure 4600 of an exemplary ELR material 4660 as viewed from the second perspective. Exemplary ELR material 4660 is an HTS material commonly referred to as "MgB$_2$" which has a transition temperature of approximately 39K. Crystalline structure 4600 of exemplary ELR material 4660 includes various atoms of magnesium ("Mg") and boron ("B"). As illustrated in FIG. 46, an aperture 4610 is formed within crystalline structure 4600 by aperture atoms which comprise atoms of magnesium and boron.

The foregoing exemplary ELR materials illustrated in FIG. 3, FIG. 17, FIG. 18, FIG. 19, FIG. 30, FIG. 45, and FIG. 46 each demonstrate the presence of various apertures within such materials. Various other ELR materials have similar apertures. Once attributed to the resistance phenomenon, apertures and their corresponding crystalline structures may be exploited to improve operating characteristics of existing ELR materials, to derive improved ELR materials from existing ELR materials, and/or to design and formulate new ELR materials.

In some implementations of the invention, apertures and their crystalline structures may be modeled, using various computer modeling tools, to improve operating characteristics of various ELR materials. For convenience of description, ELR material 360 (and its attendant characteristics and structures) henceforth generally refers to various ELR materials, including, but not limited to, ELR material 1760, ELR material 1860 and other ELR materials illustrated in the drawings, not just that ELR material illustrated and described with reference to FIG. 3.

Figure 4:
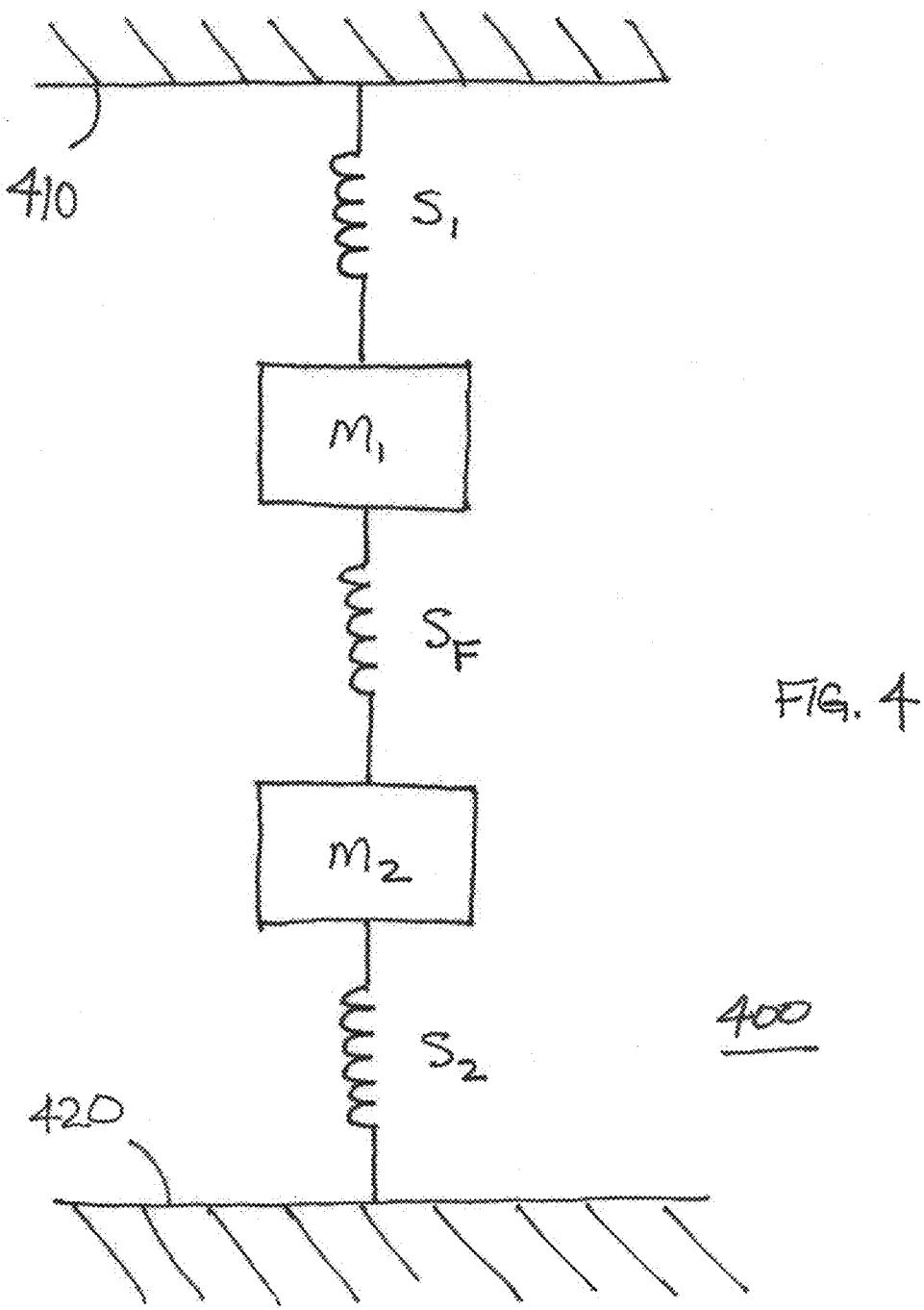
FIG. 4 illustrates a conceptual mechanical model of a crystalline structure of an ELR material.

FIG. 4 illustrates a conceptual mechanical model 400 of crystalline structure 100. Conceptual model 400 includes three springs, namely, a spring $S_1$, a spring $S_F$, and a spring $S_2$, and two masses, namely a mass $M_1$ and a mass $M_2$. For purposes of this description, spring $S_1$ may be modeled as attached to a rigid wall 410 on one side and mass $M_1$ on the other. Together spring $S_1$ and mass $M_1$ may be used to model first portion 220 of crystalline structure 100. Mass $M_1$ is coupled between spring $S_1$ and spring $S_F$. Spring $S_F$ may be used to model aperture 210 of crystalline structure 100 (i.e., the forces interacting between first portion 220 and second portion 230). Spring $S_F$ is coupled between mass $M_1$ and mass $M_2$. Mass $M_2$ is coupled between spring $S_F$ and spring $S_2$. Together spring $S_2$ and mass $M_2$ may be used to model second portion 230 of crystalline structure 100. Again, for purposes of this description, spring $S_2$ may be modeled as attached to a rigid wall 420. Other crystalline structures may be modeled as would be apparent.

The springs in FIG. 4 represent the forces interacting between groups of atoms within crystalline structure 100. Each of these forces may be modeled with a spring according to well-established modeling techniques. While the springs in FIG. 4 are depicted in a single dimension, it should be appreciated that the springs may be modeled in three-dimensions as would be apparent; however, such three-dimensional depiction is not necessary for purposes of understanding the invention or implementations thereof.

As would be appreciated, temperature and vibrations of atoms (e.g., phonons) are related. In particular, temperature of the ELR material increases as vibrations of the atoms of the ELR materials increase. Amplitude and frequency of these vibrations are related to various forces and masses present in a given ELR material. With regard to crystalline structure 100, springs $S_1$, $S_2$, and $S_F$ and masses $M_1$ and $M_2$ affect the vibrations of the mechanical model which in turn simulate the vibrations experienced by crystalline structure 100 as temperature increases, which may in turn impact aperture 210.

According to various implementations of the invention, these vibrations affect aperture 210. According to various implementations of the invention, at temperatures above the transition temperature, the vibrations change or otherwise affect aperture 210 such that the ELR material operates in its non-ELR state (e.g., the cross-section of aperture 210 restricts, impedes, or otherwise does not facilitate the propagation of electrical charge through aperture 210); whereas, at temperatures below the transition temperature, the vibrations do not prevent the ELR material from operating in its ELR state (e.g., the cross-section of aperture 210 facilitates propagation of electrical charge through aperture 210).

According to various implementations of the invention, at temperatures above the transition temperature, the vibrations change or otherwise affect aperture atoms 250 such that the ELR material transitions to and/or operates in its non-ELR state (or in other words, ceases to operate in its ELR state). According to various implementations of the invention, at temperatures above the transition temperature, the vibrations change or otherwise affect non-aperture atoms such that the ELR material transitions to and/or operates in its non-ELR state.

According to various implementations of the invention, the crystalline structure of various known ELR materials may be modified (thereby producing new material derivations) such that the modified ELR material operates with improved operating characteristics over the known ELR material. According to various implementations of the invention, the crystalline structure of various known ELR materials may be modified such that aperture 210 is maintained at higher temperatures. According to various implementations of the invention, the crystalline structure of various known ELR materials may be modified (thereby producing new ELR material derivations) such that aperture 210 propagates electrical charge at higher temperatures. According to various implementations of the invention, the crystalline structure of various new and previously unknown ELR materials may be designed and fabricated such that the new ELR materials operate with improved operating characteristics over existing ELR materials. According to various implementations of the invention, the crystalline structure of various new and previously unknown ELR materials may be designed and fabricated such that aperture 210 is maintained at higher temperatures. According to various implementations of the invention, the crystalline structure of various new and previously unknown ELR materials may be designed and fabricated such that aperture 210 propagates electrical charge at higher temperatures.

According to various implementations of the invention, apertures 210 in crystalline structure 100 have a cross-section of sufficient size to propagate electric charge through crystalline structure 100 so that ELR material 360 operates in an ELR state. In some implementations of the invention, those apertures 210 in crystalline structure 100 having a cross-section ranging in size from 0.20 nm to 1.00 nm may propagate electric charge through crystalline structure 100 so that ELR material 360 operates in an ELR state. According to various implementations of the invention, apertures 210 in crystalline structure 100 have a cross-section of sufficient size to propagate electric charge through crystalline structure 100 so that aperture 210 operates in an ELR state. In some implementations, those apertures 210 in crystalline structure 100 having a cross-section ranging in size from 0.20 nm to 1.00 nm may propagate electric charge through crystalline structure 100 so that aperture 210 operates in an ELR state.

In some implementations of the invention, improving and designing an ELR material that operates with improved operating characteristics may involve analyzing mechanical aspects (e.g., forces, distances, masses, modes of vibration, etc.) of aperture 210 and crystalline structure 100 so that aperture 210 is maintained sufficiently to remain in an ELR state at higher temperatures. In some implementations of the invention, improving and designing ELR materials that operate with improved operating characteristics may involve analyzing electronic aspects (e.g., attractive and repulsive atomic forces, conductivity, electro-negativity, etc.) of atoms in crystalline structure 100 (including, but not limited to aperture atoms 250) so that aperture 210 is maintained sufficiently to remain in an ELR state at higher temperatures. In some implementations of the invention, improving and designing ELR materials that operate with improved operating characteristics may involve analyzing both electrical aspects and mechanical aspects of aperture 210 and crystalline structure 100, and the atoms therein, so that aperture 210 is maintained sufficiently to operate in an ELR state at higher temperatures.

Figure 5:
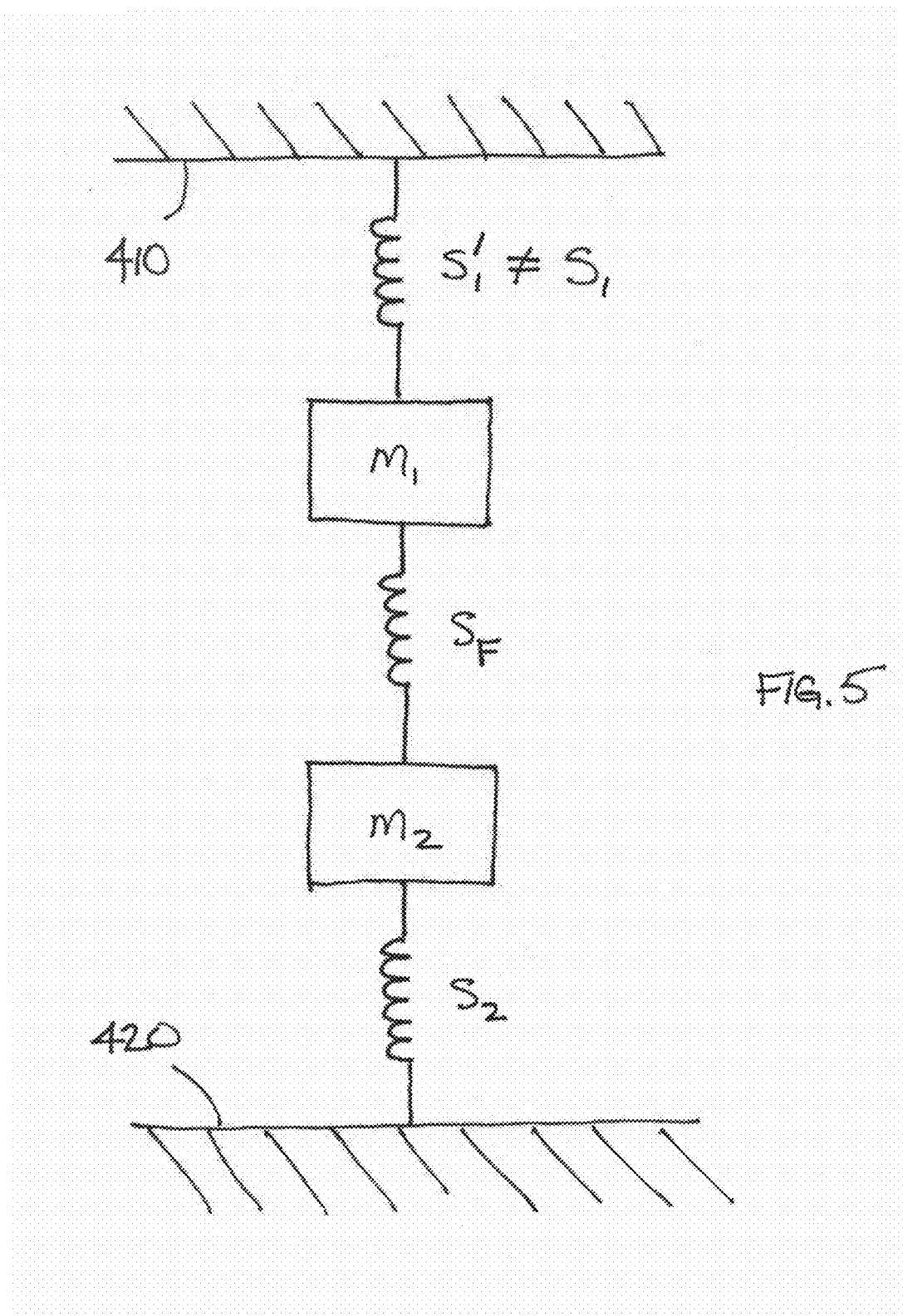
FIG. 5 illustrates a conceptual mechanical model of an improved crystalline structure, according to various implementations of the invention, of an ELR material.

In some implementations of the invention, conceptually speaking, a spring constant of spring $S_1$ may be changed such that $S_1' \neq S_1$ as illustrated in FIG. 5. A changed spring constant tends to change the amplitude, modes, frequency, direction, and/or other vibrational characteristics of vibrations of the mechanical model. The changed spring constant may guide a corresponding change in crystalline structure 100, for example, a change to a rigidity of first portion 220 of crystalline structure 100. The rigidity of first portion 220 of crystalline structure 100 may be changed by changing various atoms within first portion 220 to affect bond lengths, bond strengths, bond angles, number of bonds or other atomic characteristics of atoms within first portion 220. The rigidity of first portion 220 of crystalline structure 100 may be changed by bonding fewer or more atoms to first portion 220 thereby effectively changing the spring constant of spring $S_1$ as would be appreciated.

Figure 6:
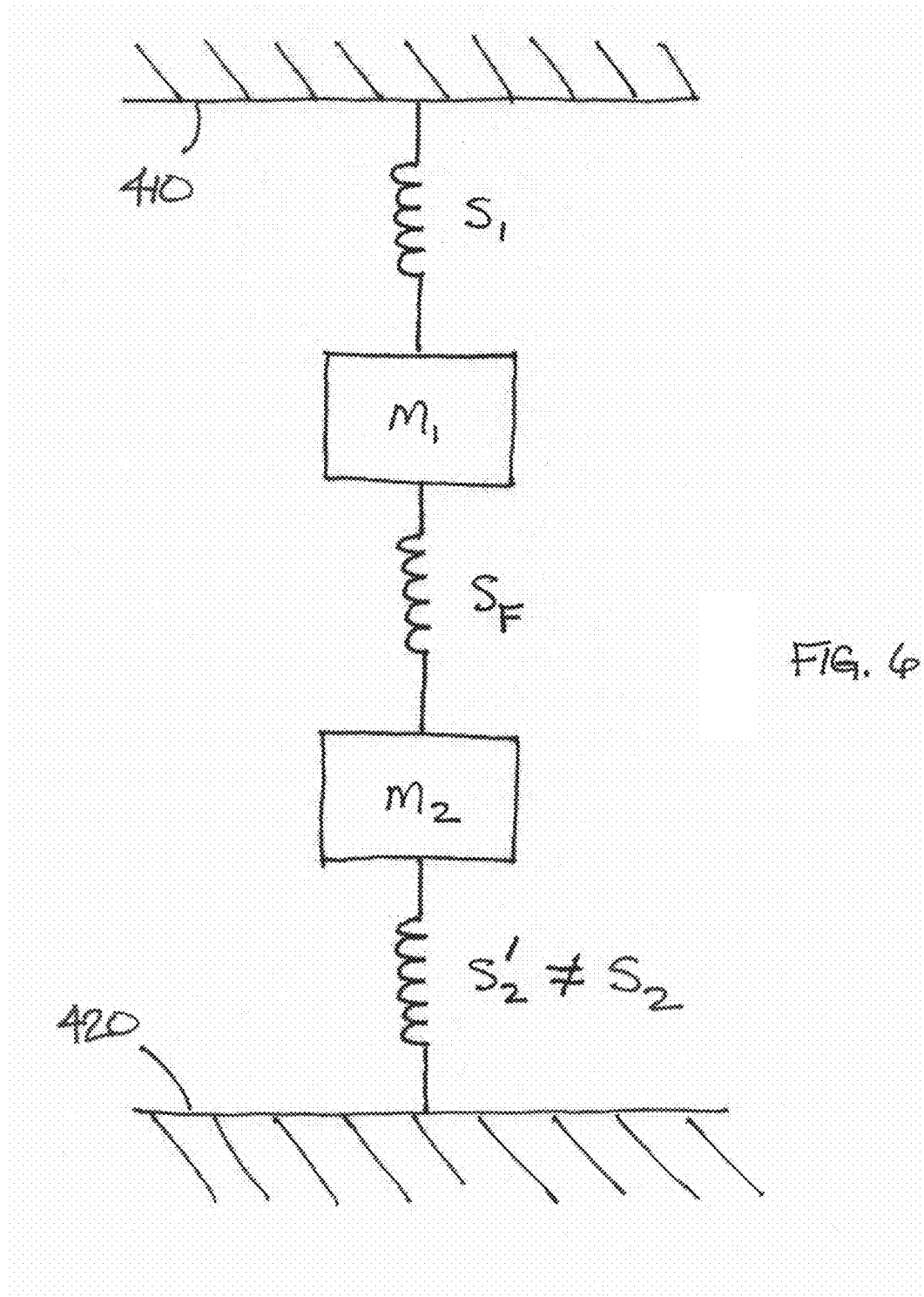
FIG. 6 illustrates a conceptual mechanical model of an improved crystalline structure, according to various implementations of the invention, of an ELR material.

In some implementations of the invention, conceptually speaking, a spring constant of spring $S_2$ may be changed such that $S_2' \neq S_2$ as illustrated in FIG. 6. As described above, a changed spring constant tends to change the amplitude, modes, frequency, direction, and/or other vibrational characteristics of vibrations of the mechanical model. The changed spring constant may guide a corresponding change in crystalline structure 100, for example, a change to a rigidity of second portion 230 of crystalline structure 100 in a manner similar to that described above with regard to spring $S_1$. The rigidity of second portion 230 of crystalline structure 100 may be changed by bonding fewer or more atoms to second portion 230 thereby effectively changing the spring constant of spring $S_2$ as would be appreciated.

Figure 7:
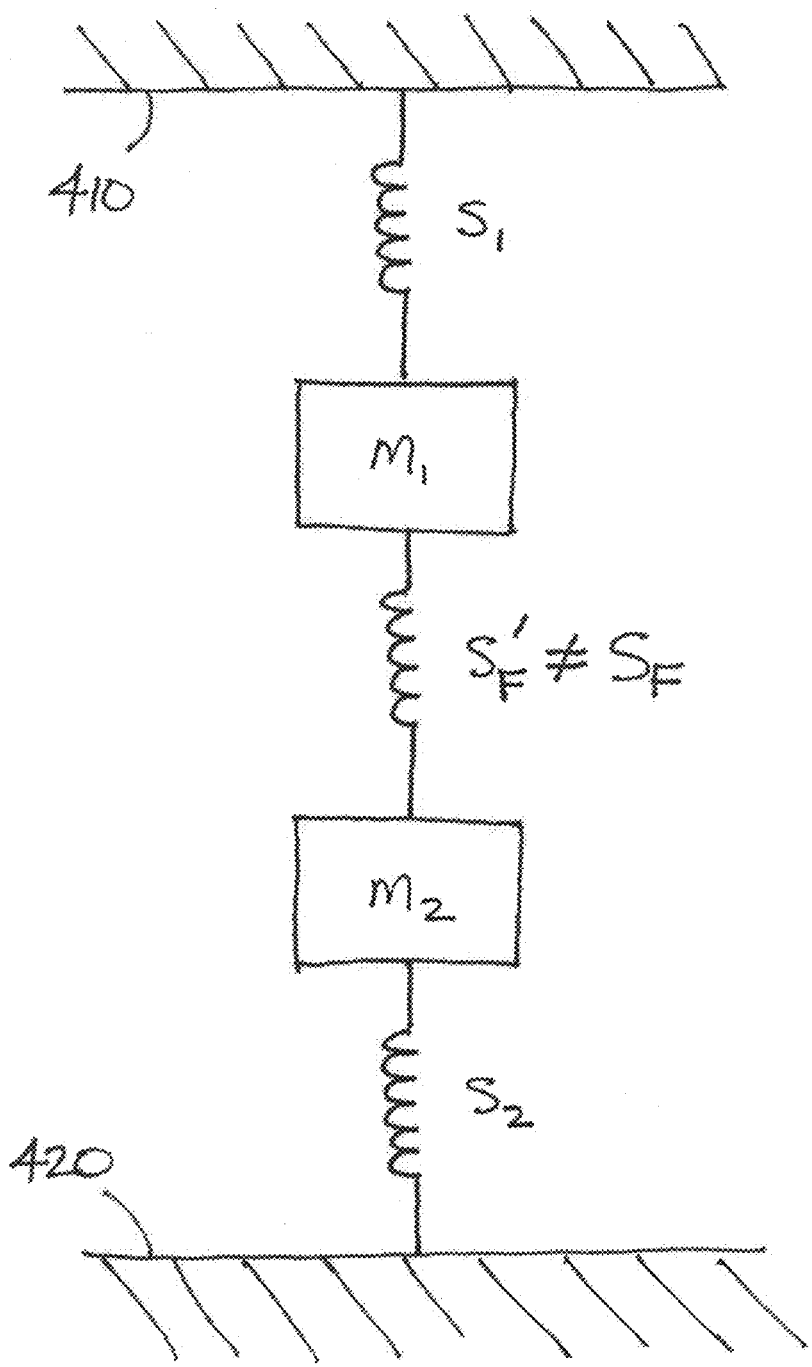
FIG. 7 illustrates a conceptual mechanical model of an improved crystalline structure, according to various implementations of the invention, of an exemplary ELR material.

In some implementations of the invention, again, conceptually speaking, a spring constant of spring $S_F$ may be changed such that $S_F' \neq S_F$ as illustrated in FIG. 7. As described above, a changed spring constant tends to change the amplitude, modes, frequency, direction, and/or other vibrational characteristics of vibrations of the mechanical model. The changed spring constant may guide a corresponding change in crystalline structure 100, for example, a change to a rigidity of aperture 210 formed within crystalline structure 100. This may be accomplished in a variety of ways including, but not limited to, changing a shape of aperture 210 to one that is structurally different in strength than other shapes, changing bond strengths between aperture atoms, changing bond angles, changing modes of vibration of crystalline structure 100, changing apertures atoms 250, or other ways. This may also be accomplished, for example, by layering a material over crystalline structure 100 such that atoms of the material span aperture 210 by forming one or more bonds between first portion 220 and second portion 230 thereby effectively changing the spring constant of spring $S_F$ as would be appreciated. In other words, the atoms spanning aperture 210 introduce an additional spring S in parallel with $S_F$, that in effect, changes the spring constant between first portion 220 and second portion 230. This modification of layering material over crystalline structure 100 is described in further detail below in connection with various experimental test results.

Figure 8:
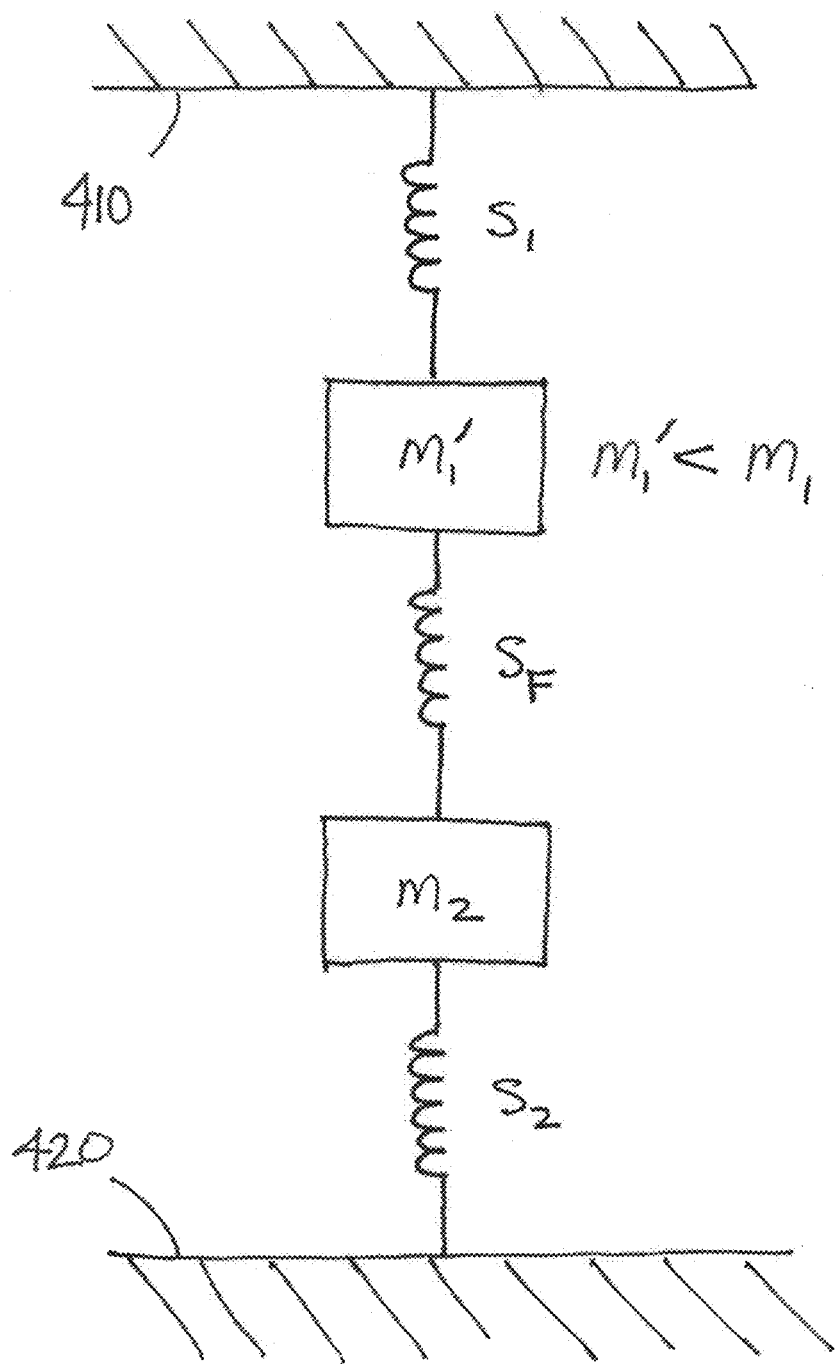
FIG. 8 illustrates a conceptual mechanical model of an improved crystalline structure, according to various implementations of the invention, of an ELR material.

In some implementations of the invention, again conceptually speaking, a mass of mass $M_1$ may be decreased such that $M_1'<M_1$ as illustrated in FIG. 8. A decreased mass tends to change various amplitude, modes, frequency, direction and/or other vibrational characteristics of vibrations of the mechanical model. The decreased mass may guide a corresponding change in crystalline structure 100, which may ultimately lead to maintaining and/or stabilizing aperture 210 within crystalline structure 100 at higher temperatures. This may be accomplished by, for example, using smaller molecules and/or atoms within first portion 220 of crystalline structure 100 or replacing various larger molecules and/or atoms with smaller ones. Similar effects may be achieved by decreasing a mass of mass $M_2$.

Figure 9:
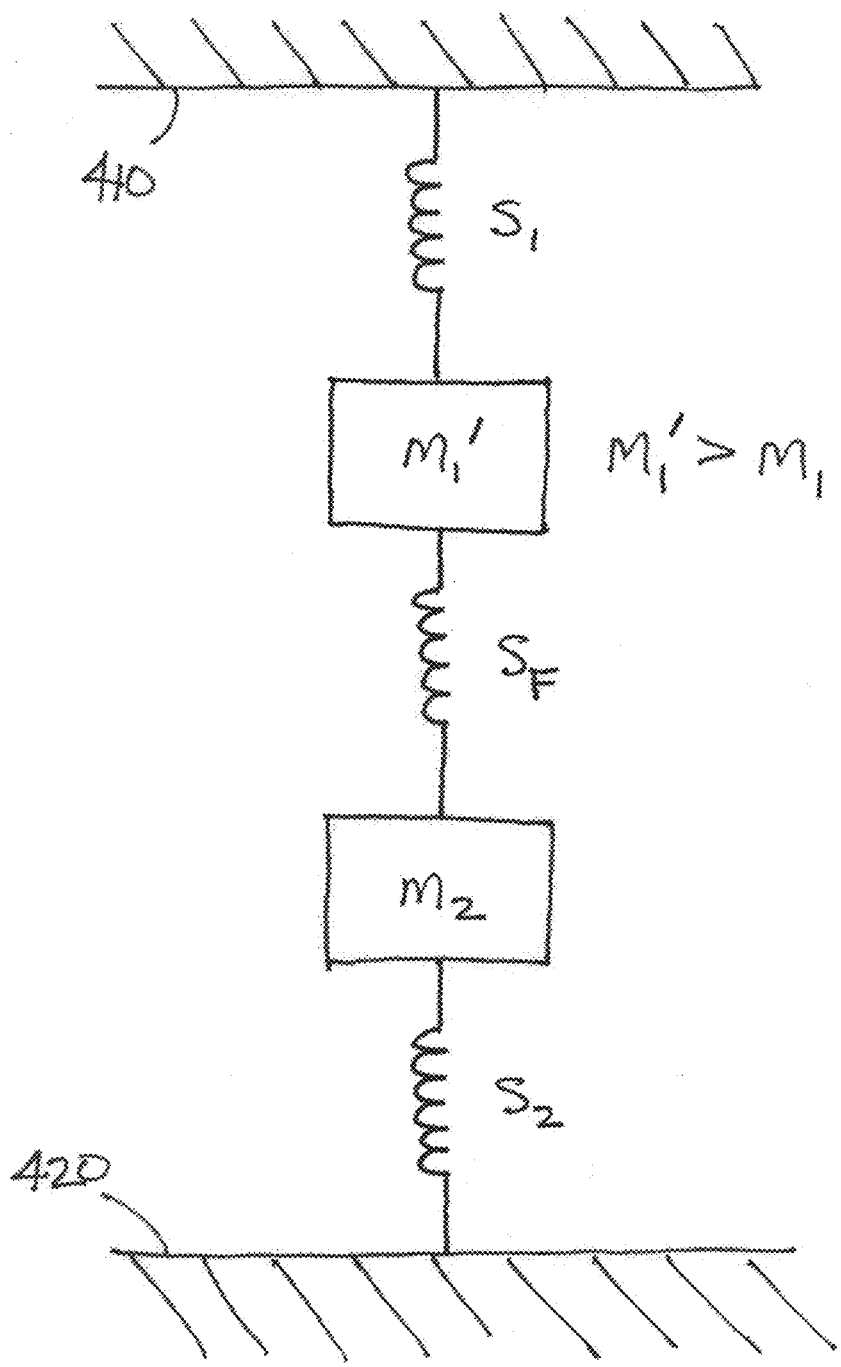
FIG. 9 illustrates a conceptual mechanical model of an improved crystalline structure, according to various implementations of the invention, of an ELR material.

In some implementations of the invention, again conceptually speaking, a mass of mass $M_1$ may be increased such that $M_1'>M_1$ as illustrated in FIG. 9. An increased mass tends to change various amplitude, modes, frequency, direction and/or other vibrational characteristics of vibrations of the mechanical model. The increased mass may guide a corresponding change in crystalline structure 100, which may ultimately lead to maintaining and/or stabilizing aperture 210 within crystalline structure 100 at higher temperatures. This may be accomplished by, for example, using larger atoms within first portion 220 of crystalline structure 100 or replacing various smaller atoms with larger ones. Similar effects may be achieved by increasing a mass of mass $M_2$.

In various implementations of the invention, any combination of the various changes described above with regard to FIGS. 5-9 may be made to change vibrations of the mechanical model, which may guide corresponding changes in crystalline structure 100 in order to maintain aperture 210 at higher temperatures. In some implementations of the invention, tradeoffs between various changes may be necessary in order to provide a net improvement to the maintenance of aperture 210.

In some implementations of the invention, a three-dimensional computer model of crystalline structure 100 may be used to design an ELR material with an appropriate aperture 210 that is maintained at higher temperatures. Such models may be used to analyze interactions between aperture atoms 250 and/or non-aperture atoms and their respective impact on aperture 210 over temperature as would be apparent. For example, various computer modeling tools may be used to visualize and analyze crystalline structure 100, and in particular, visualize and analyze apertures 210 in crystalline structure 100. One such computer modeling tool is referred to as "Jmol," which is an open-source Java viewer for viewing and manipulating chemical structures in 3D. Jmol is available at http://www.jmol.org.

In some implementations of the invention, various three-dimensional computer models of crystalline structure 100 may be simulated to determine and evaluate crystalline structures 100 and the interaction of atoms therein. Such computer models may employ the density functional theory ("DFT"). Computer models employing DFT may be used to design new ELR materials and modify existing ELR materials based on maintaining aperture 210 so that these ELR materials operate in an ELR state in accordance with various principles of the invention described herein and as would be appreciated.

In some implementations of the invention, combinations of the springs and masses may be selected to change vibrations (including their associated vibrational characteristics) that affect aperture 210 within crystalline structure 100 according to various known techniques. In other words, the springs and masses may be modified and/or selected to change amplitude, modes, frequency, direction and/or other vibrational characteristics of various vibrations within crystalline structure 100 to minimize their impact on aperture 210. By way of example, the springs and masses may be modified and/or selected to permit vibrations within crystalline structure 100 in directions parallel (or substantially parallel) to the propagation of electrical charge through aperture 210 thereby reducing the impact of such vibrations on aperture 210. By way of further example, the springs and masses may be modified and/or selected to adjust various resonant frequencies with crystalline structure 100 to propagate electrical charge through aperture 210 at different temperatures.

In some implementations of the invention, combinations of the springs and masses may be selected to maintain aperture 210 within crystalline structure 100 regardless of vibrations experienced within crystalline structure 100. In other words, reducing, increasing and/or otherwise changing vibrations within crystalline structure 100 may not otherwise impact the resistance phenomenon provided that aperture 210 itself is maintained.

Figure 10:
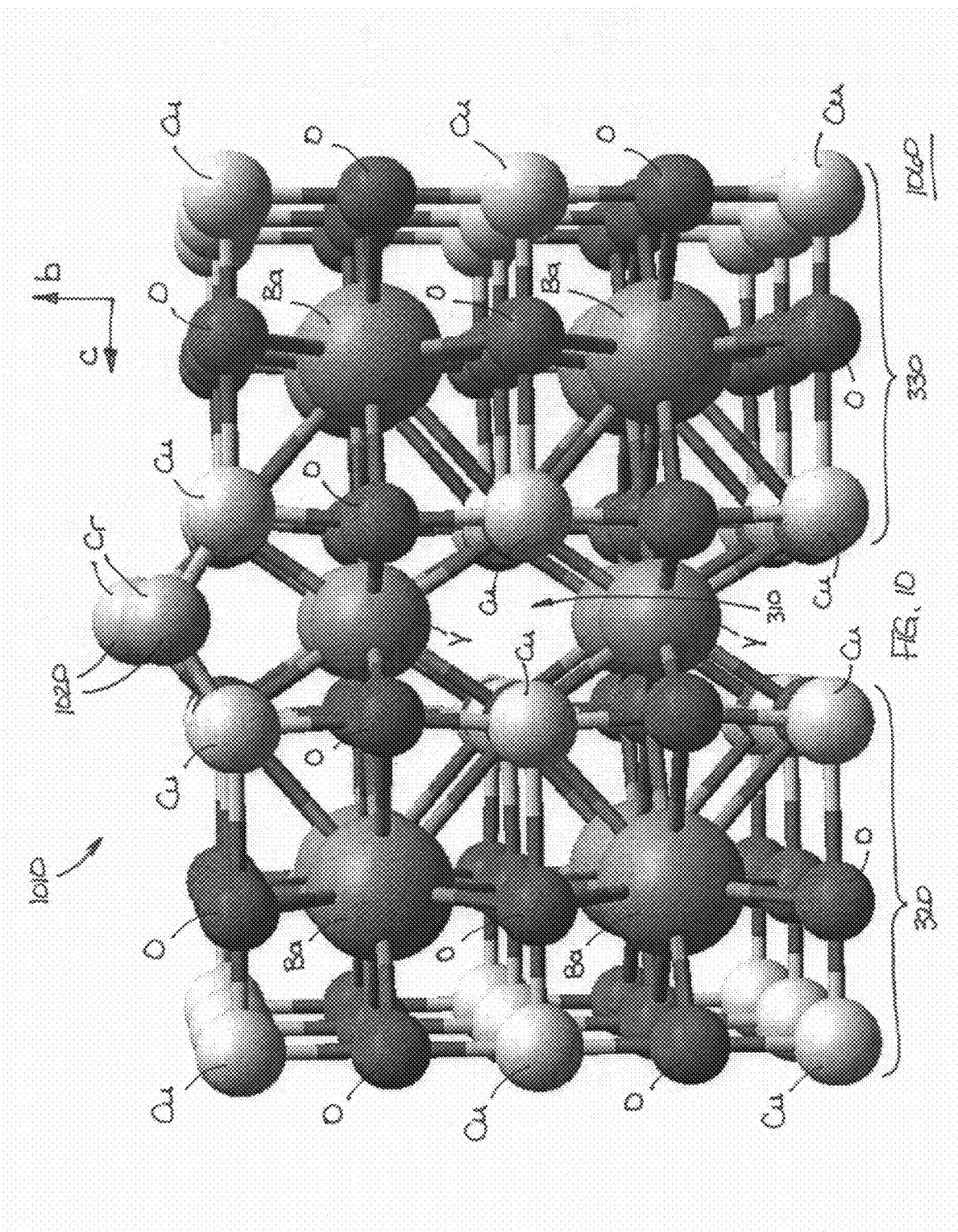
FIG. 10 illustrates a modified crystalline structure, according to various implementations of the invention, of an ELR material as viewed from a second perspective.

FIG. 10 illustrates a modified crystalline structure 1010 of a modified ELR material 1060 as viewed from the second perspective in accordance with various implementations of the invention. FIG. 11 illustrates modified crystalline structure 1010 of modified ELR material 1060 as viewed from the first perspective in accordance with various implementations of the invention. ELR material 360 (e.g., for example, as illustrated in FIG. 3 and elsewhere) is modified to form modified ELR material 1060. Modifying material 1020 forms bonds with atoms of crystalline structure 300 (of FIG. 3) of ELR material 360 to form modified crystalline structure 1010 of modified ELR material 1060 as illustrated in FIG. 11. As illustrated, modifying material 1020 bridges a gap between first portion 320 and second portion 330 thereby changing, among other things, vibration characteristics of modified crystalline structure 1010, particularly in the region of aperture 310. In doing so, modifying material 1020 maintains aperture 310 at higher temperatures. In reference to FIG. 7, modifying material 1020 serves to modify the effective spring constant of spring $S_F$, by, for example, acting as one or more additional springs in parallel with spring $S_F$. Accordingly, in some implementations of the invention, modifying material 1020 is specifically selected to fit in and bond with appropriate atoms in crystalline structure 300.

In some implementations of the invention and as illustrated in FIG. 10, modifying material 1020 is bonded a face of crystalline structure 300 that is parallel to the b-plane (e.g., an "a-c" face). In such implementations where modifying material 1020 is bonded to the "a-c" face, apertures 310 extending in the direction of the a-axis and with cross-sections lying in the a-plane are maintained. In such implementations, charge carriers flow through aperture 310 in the direction of the a-axis.

In some implementations of the invention, modifying material 1020 is bonded to a face of crystalline structure 300 that is parallel to the a-plane (e.g., a "b-c" face). In such implementations where modifying material 1020 is bonded to the "b-c" face, apertures 310 extending in the direction of the b-axis and with cross-sections lying in the b-plane are maintained. In such implementations, charge carriers flow through aperture 310 in the direction of the b-axis.

Various implementations of the invention include layering a particular surface of ELR material 360 with modifying material 1020 (i.e., modifying the particular surface of ELR material 360 with the modifying material 1020). As would be recognized from this description, reference to "modifying a surface" of ELR material 360, ultimately includes modifying a face (and in some cases more that one face) of one or more unit cells 2100 of ELR material 360. In other words, modifying material 1020 actually bonds to atoms in unit cell 2100 of ELR material 360.

For example, modifying a surface of ELR material 360 parallel to the a-plane includes modifying "b-c" faces of unit cells 2100. Likewise, modifying a surface of ELR material 360 parallel to the b-plane includes modifying "a-c" faces of unit cells 2100. In some implementations of the invention, modifying material 1020 is bonded to a surface of ELR material 360 that is substantially parallel to any plane that is parallel to the c-axis. For purposes of this description, planes that are parallel to the c-axis are referred to generally as ab-planes, and as would be appreciated, include the a-plane and the b-plane. As would be appreciated, a surface of ELR material 360 parallel to the ab-plane is formed from a mixture of "a-c" faces and "b-c" faces of unit cells 2100. In such implementations where modifying material 1020 is bonded to a surface parallel to an ab-plane, apertures 310 extending in the direction of the a-axis and apertures 310 extending in the direction of the b-axis are maintained.

In some implementations of the invention, modifying material 1020 may be a conductive material. In some implementations of the invention, modifying material 1020 may a material with high oxygen affinity (i.e., a material that bonds easily with oxygen) ("oxygen bonding material"). In some implementations of the invention, modifying material 1020 may be a conductive material that bonds easily with oxygen ("oxygen bonding conductive materials"). Such oxygen bonding conductive materials may include, but are not limited to: chromium, copper, bismuth, cobalt, vanadium, and titanium. Such oxygen bonding conductive materials may also include, but are not limited to: rhodium or beryllium. Other modifying materials may include gallium or selenium. In some implementations of the invention, modifying material 1020 may be chromium (Cr). In some implementations of the invention, modifying material 1020 may be copper (Cu). In some implementations of the invention, modifying material 1020 may be bismuth (Bi). In some implementations of the invention, modifying material 1020 may be cobalt (Co). In some implementations of the invention, modifying material 1020 may be vanadium (V). In some implementations of the invention, modifying material 1020 may be titanium (Ti). In some implementations of the invention, modifying material 1020 may be rhodium (Rh). In some implementations of the invention, modifying material 1020 may be beryllium (Be). In some implementations of the invention, modifying material 1020 may be gallium (Ga). In some implementations of the invention, modifying material 1020 may be selenium (Se). In some implementations of the invention, other elements may be used as modifying material 1020. In some implementations of the invention, combinations of different materials (e.g., compounds, compositions, molecules, alloys, etc.) may be used as modifying material 1020. In some implementations of the invention, various layers of materials and/or combinations of materials may be used collectively as modifying material 1020. In some implementations of the invention, modifying material 1020 corresponds to atoms having appropriate bonding with oxygen. In some implementations of the invention, modifying material 1020 includes atoms that have bond lengths with various atom(s) in crystalline structure 1010 at least as large as half the distance between atoms of first portion 320 and atoms of second portion 330. In some implementations of the invention, modifying material 1020 includes atoms that bond with various atom(s) in crystalline structure 1010. In some implementations of the invention, modifying material 1020 includes atoms that bond well with various atom(s) in crystalline structure 1010.

In some implementations of the invention, oxides of modifying material 1020 may form during various operations associated with modifying ELR material 360 with modifying material 1020. Accordingly, in some implementations of the invention, modifying material 1020 may comprise a substantially pure form of modifying material 1020 and various oxides of modifying material 1020. In other words, in some implementations of the invention, ELR material 360 is modified with modifying material 1020 and various oxides of modifying material 1020. By way of example, but not limitation, in some implementations of the invention, modifying material 1020 may comprise chromium and chromium oxide ($Cr_xO_y$). In some implementations of the invention, ELR material 360 is modified with various oxides of modifying material 1020. By way of example, but not limitation, in some implementations of the invention, ELR material 360 is modified with chromium oxide ($Cr_xO_y$).

In some implementations of the invention, other materials may be used to modify crystalline structure 1010. For example, a modifying material 1020 having increased bond strengths in relation to the copper oxide layer may be selected to replace yttrium (one of the aperture atoms). Also for example, a modifying material 1020 having increased bond strengths in relation to yttrium may be selected to replace the copper oxide layer. For example, chromium oxide (CrO) may be selected to replace the copper oxide (CuO). Also for example, a modifying material 1020 having increased bond strengths in relation to the copper oxide layer may be selected to replace barium. While these examples refer to bond strengths, various modifying materials 1020 may be selected based on other atomic characteristics or combinations thereof that tend to maintain aperture 310 at higher temperatures, for example, but not limited to, modifying materials 1020 that may result in net changes in vibrations in crystalline structure 1010.

In some implementations of the invention, ELR material 360 may be YBCO and modifying material 1020 may be an oxygen bonding conductive material. In some implementations of the invention, modifying material 1020 may be chromium and ELR material 360 may be YBCO. In some implementations of the invention, modifying material 1020 may be copper and ELR material 360 may be YBCO. In some implementations of the invention, modifying material 1020 may be bismuth and ELR material 360 may be YBCO. In some implementations of the invention, modifying material 1020 may be cobalt and ELR material 360 may be YBCO. In some implementations of the invention, modifying material 1020 may be vanadium and ELR material 360 may be YBCO. In some implementations of the invention, modifying material 1020 may be titanium and ELR material 360 may be YBCO. In some implementations of the invention, modifying material 1020 may be rhodium and ELR material 360 may be YBCO. In some implementations of the invention, modifying material 1020 may be beryllium and ELR material 360 may be YBCO. In some implementations of the invention, modifying material 1020 is another oxygen bonding conductive material and ELR material 360 may be YBCO.

In some implementations of the invention, modifying material 1020 may be gallium and ELR material 360 may be YBCO. In some implementations of the invention, modifying material 1020 may be selenium and ELR material 360 may be YBCO.

In some implementations of the invention, various other combinations of mixed-valence copper-oxide perovskite materials and oxygen bonding conductive materials may be used. For example, in some implementations of the invention, ELR material 360 corresponds to a mixed-valence copper-oxide perovskite material commonly referred to as "BSCCO." BSCCO includes various atoms of bismuth ("Bi"), strontium ("Sr"), calcium ("Ca"), copper ("Cu") and oxygen ("O"). By itself, BSCCO has a transition temperature of approximately 100K. In some implementations of the invention, ELR material 360 may be BSCCO and modifying material 1020 may be an oxygen bonding conductive material. In some implementations of the invention, ELR material 360 may be BSCCO and modifying material 1020 may be selected from the group including, but not limited to: chromium, copper, bismuth, cobalt, vanadium, titanium, rhodium, or beryllium. In some implementations of the invention, ELR material 360 may be BSCCO and modifying material 1020 may be selected from the group consisting of: chromium, copper, bismuth, cobalt, vanadium, titanium, rhodium, and beryllium.

In some implementations of the invention, various combinations of other ELR materials and modifying materials may be used. For example, in some implementations of the invention, ELR material 360 corresponds to an iron pnictide material. Iron pnictides, by themselves, have transition temperatures that range from approximately 25-60K. In some implementations of the invention, ELR material 360 may be an iron pnictide and modifying material 1020 may be an oxygen bonding conductive material. In some implementations of the invention, ELR material 360 may be an iron pnictide and modifying material 1020 may be selected from the group including, but not limited to: chromium, copper, bismuth, cobalt, vanadium, titanium, rhodium, or beryllium. In some implementations of the invention, ELR material 360 may be an iron pnictide and modifying material 1020 may be selected from the group consisting of: chromium, copper, bismuth, cobalt, vanadium, titanium, rhodium, and beryllium.

In some implementations of the invention, various combinations of other ELR materials and modifying materials may be used. For example, in some implementations of the invention, ELR material 360 may be magnesium diboride ("$MgB_2$"). By itself, magnesium diboride has a transition temperature of approximately 39K. In some implementations of the invention, ELR material 360 may be magnesium diboride and modifying material 1020 may be an oxygen bonding conductive material. In some implementations of the invention, ELR material 360 may be magnesium diboride and modifying material 1020 may be selected from the group including, but not limited to: chromium, copper, bismuth, cobalt, vanadium, titanium, rhodium, or beryllium. In some implementations of the invention, ELR material 360 may be magnesium diboride and modifying material 1020 may be selected from the group consisting of: chromium, copper, bismuth, cobalt, vanadium, titanium, rhodium, and beryllium.

In some implementations of the invention, modifying material 1020 may be layered onto a sample of ELR material 360 using various techniques for layering one composition onto another composition as would be appreciated. For example, such layering techniques include, but are not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering techniques. In some implementations of the invention, ELR material 360 may be layered onto a sample of modifying material 1020 using various techniques for layering one composition onto another composition. In some implementations of the invention, a single atomic layer of modifying material 1020 (i.e., a layer of modifying material 1020 having a thickness substantially equal to a single atom or molecule of modifying material 1020) may be layered onto a sample of ELR material 360. In some implementations of the invention, a single unit layer of the modifying material (i.e., a layer of the modifying material having a thickness substantially equal to a single unit (e.g., atom, molecule, crystal, or other unit) of the modifying material) may be layered onto a sample of the ELR material. In some implementations of the invention, the ELR material may be layered onto a single unit layer of the modifying material. In some implementations of the invention, two or more unit layers of the modifying material may be layered onto the ELR material. In some implementations of the invention, the ELR material may be layered onto two or more unit layers of the modifying material.

Others have attempted to layer various compositions (e.g., gold, copper, silicon, etc.) onto known ELR materials in an effort to improve their usefulness in various applications. However, the selection of such compositions was not based on an intent to change, enhance or otherwise maintain aperture 210, specifically with regard to: various geometric characteristics of crystalline structure 100 and aperture 210 (for example, but not limited to, the width of the gap between first portion 220 and second portion 230, size of aperture 210, etc.); atomic characteristics of aperture atoms 250 in crystalline structure 100, their interaction with each other and their impact on aperture 210 as temperature changes; and atomic characteristics of atoms in crystalline structure 100 and their interaction with modifying material 1020 (for example, but not limited to, various bonding properties of modifying material 1020 with atoms in crystalline structure 100).

In some implementations of the invention, changes to lattices used within crystalline structure 100 may be made. For example, lattices having monoclinic crystal symmetries, orthorhombic crystal symmetries, or cubic crystal symmetries may be used to improve various other lattices within crystalline structure 100. In addition, a body-centered cubic symmetry or a face-centered cubic symmetry may be used to improve a simple cubic symmetry within crystalline structure 100. In some implementations, a wider variety of lattices within crystalline structure 100 may maintain aperture 210 at higher temperatures. In some implementations, more complex lattices within crystalline structure 100 may maintain aperture 210 at higher temperatures.

In some implementations of the invention, crystalline structure 100 may be designed so that phonons (i.e., lattice vibrations) within crystalline structure 100 predominately propagate through crystalline structure 100 in a single direction that is parallel to the propagation of electrical charge through aperture 210 (i.e., into the page of, for example, FIG. 2). Such phonons tend not to affect aperture 210 thereby permitting aperture 210 to operate in an ELR state at higher temperatures. Any phonons propagating orthogonal to the propagation of electrical charge through aperture 210 may be minimized so as to avoid affecting aperture 210.

Figure 12:
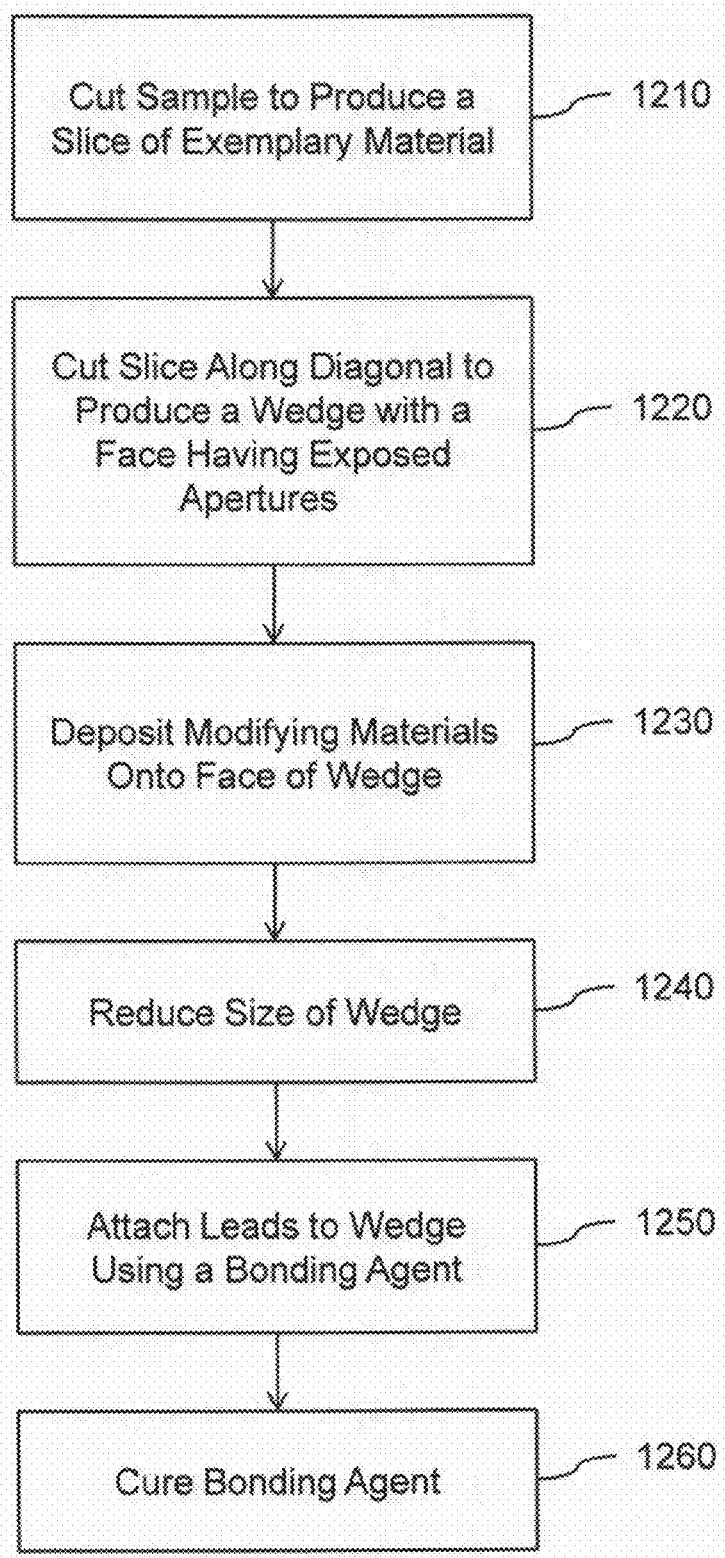
FIG. 12 is a flowchart for producing a modified material from an ELR material according to various implementations of the invention.

FIGS. 12 and 13A-13I are now used to describe modifying a sample 1310 of an ELR material 360 to produce a modified ELR material 1060 according to various implementations of the invention. FIG. 12 is a flowchart for modifying sample 1310 of ELR material 360 with a modifying material 1020 to produce a modified ELR material 1060 according to various implementations of the invention. FIGS. 13A-13J illustrate sample 1310 of ELR material 360 undergoing modifications to produce modified ELR material 1060 according to various implementations of the invention. In some implementations of the invention, ELR material 360 is a mixed-valence copper-oxide perovskite material and modifying material 1380 is an oxygen bonding conductive material. In some implementations of the invention, ELR material 360 is an HTS material commonly referred to as YBCO and modifying material 1380 is chromium.

As illustrated in FIG. 13A, sample 1310 is a plurality of crystalline unit cells of ELR material 360 and is oriented with its non-conducting axis (or more particularly, its non-ELR or non-superconducting axis) along the c-axis. In some implementations of the invention, sample 1310 has dimensions of approximately 5 mm×10 mm×10 mm. For purposes of this description, sample 1310 is oriented so that a primary axis of conduction of ELR material 360 aligned along the a-axis. As would be apparent, if ELR material 360 includes two primary axes of conduction, sample 1310 may be oriented along either the a-axis or the b-axis. As would be further appreciated, in some implementations sample 1310 may be oriented along any line within the c-plane (i.e., a face parallel with any ab-plane). In an operation 1210 and as illustrated in FIG. 13B and FIG. 13C, a slice 1320 is produced by cutting sample 1310 along a plane substantially parallel to the a-plane of sample 1310. In some implementations of the invention, slice 1320 is approximately 3 mm thick although other thicknesses may be used. In some implementations of the invention, this may be accomplished using a precision diamond blade.

Figure 13F:
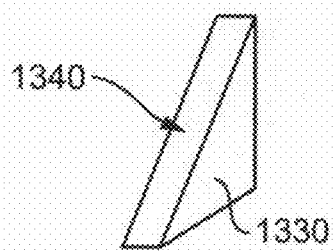

In an optional operation 1220 and as illustrated in FIG. 13D, FIG. 13E, and FIG. 13F, a wedge 1330 is produced by cutting slice 1320 along a diagonal of the a-plane of slice 1320 to expose various apertures in sample 1310. In some implementations of the invention, this is accomplished using a precision diamond blade. This operation produces a face 1340 on the diagonal surface of wedge 1330 having exposed apertures. In some implementations of the invention, face 1340 corresponds to any plane that is substantially parallel to the c-axis. In some implementations of the invention, face 1340 corresponds to a plane substantially perpendicular to the a-axis (i.e., the a-plane of crystalline structure 100). In some implementations of the invention, face 1340 corresponds to a plane substantially perpendicular to the b-axis (i.e., the b-plane of crystalline structure 100). In some implementations of the invention, face 1340 corresponds to a plane substantially perpendicular to any line in the ab-plane. In some implementations of the invention, face 1340 corresponds to any plane that is not substantially perpendicular to the c-axis. In some implementations of the invention, face 1340 corresponds to any plane that is not substantially perpendicular to any substantially non-conducting axis (or non-ELR or non-superconducting axis) of the ELR material 360. As would be appreciated, operation 1220 may not be necessary as slice 1320 may have exposed apertures and/or other characteristics similar to those discussed above with reference to face 1340.

Figure 13G:
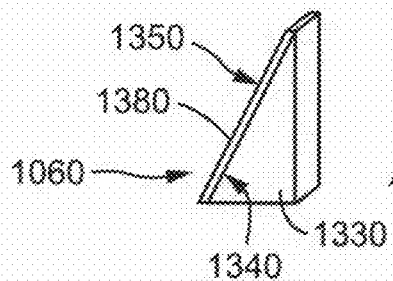
Figure 13H:
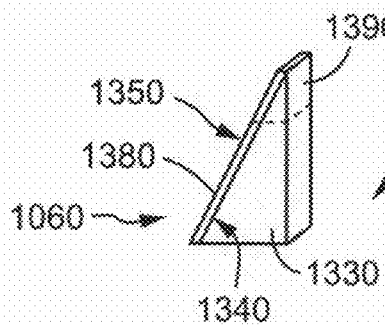
Figure 13I:
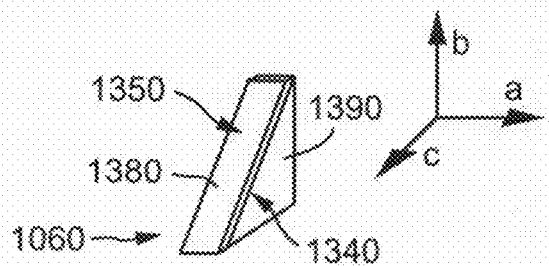
Figure 13J:
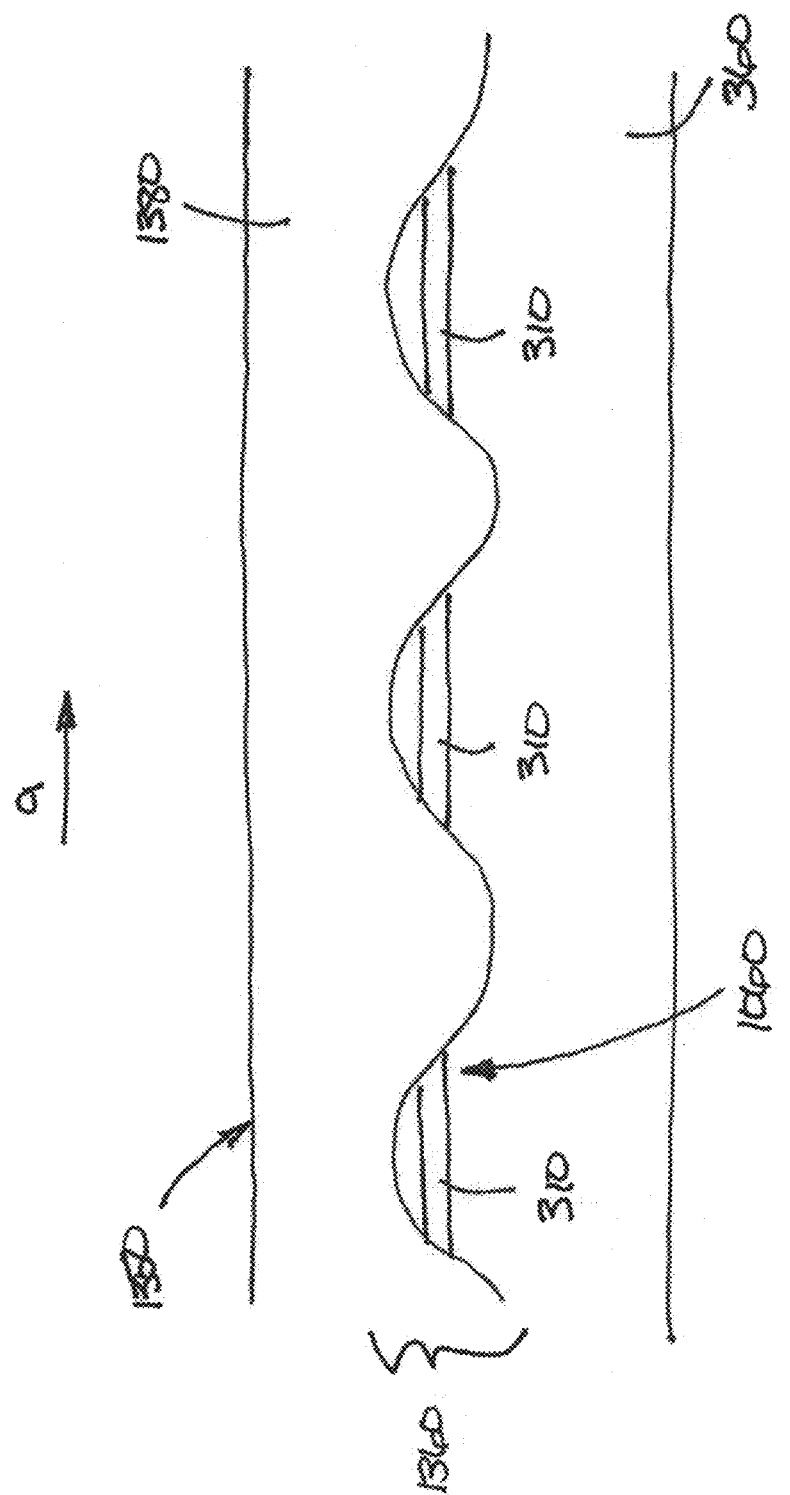

In an operation 1230 and as illustrated in FIG. 13G and FIG. 13J, a modifying material 1380 (e.g., modifying material 1020 as illustrated in FIG. 10 and elsewhere) is deposited onto face 1340 to produce a face 1350 of modifying material 1380 on wedge 1330 and a modified region 1360 of modified ELR material 1060 at an interface between face 1340 and modifying material 1380. Modified region 1360 in wedge 1330 corresponds to a region in wedge 1330 where modifying material 1380 bonds to crystalline structure 300 in accordance with various implementations of the invention to improve crystalline structure 300 in proximity to aperture 310. Other forms of bonding modifying material 1380 to ELR material 360 may be used. Operation 1230 is described in further detail below in reference to FIG. 14.

Figure 14:
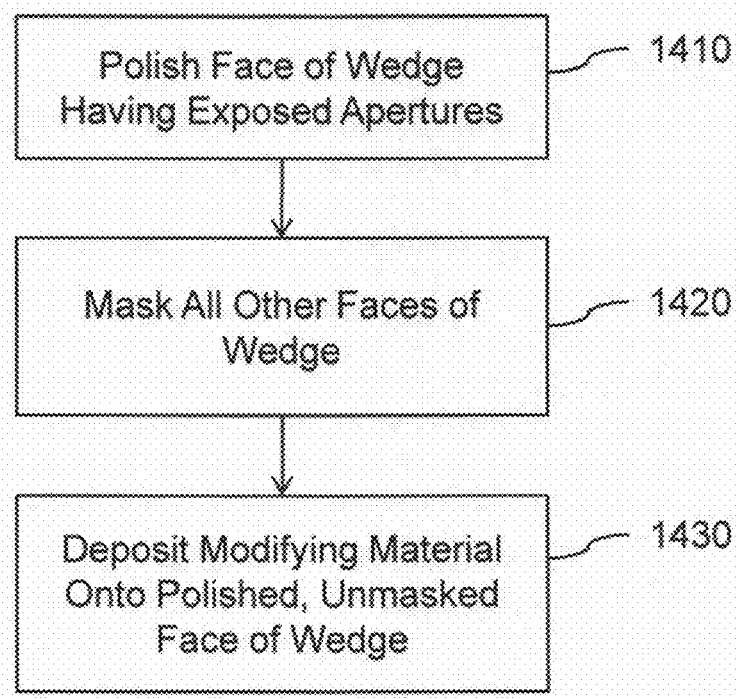
FIG. 14 is a flowchart for depositing a modifying material onto an ELR material according to various implementations of the invention.

Referring to FIG. 14, in an operation 1410, face 1340 is polished. In some implementations of the invention, one or more polishes may be used. In some implementations of the invention that include YBCO as the ELR material, one or more non-water-based polishes may be used, including, but not limited to isopropyl alcohol, heptane, non-organic or stable organic slurries. In some implementations of the invention, water-based polishes may be used. In some implementations of the invention, face 1340 is finally polished with a 20 nm colloidal slurry. In some implementations of the invention, polishing of face 1340 is performed in a direction substantially parallel to the a-axis of wedge 1330 (i.e., along a direction of apertures 310). In some implementations of the invention, oxygen plasma ashing may be used as would be appreciated. In some implementations of the invention, cleanliness of face 1340 (i.e., absence of impurities or other materials, compositions, or compounds) just prior to layering modifying material 1380 thereon may be important to achieving improved operational characteristics in the modified ELR material over those of the unmodified ELR material.

In an operation 1420, one or more surfaces other than face 1340 are masked. In some implementations, all surfaces other than face 1340 are masked. In an operation 1430, modifying material 1380 is deposited onto face 1340 using vapor deposition. In some implementations of the invention, approximately 40 nm of modifying material 1380 is deposited onto face 1340 using vapor deposition, although smaller or larger amounts of modifying material 1380 may be used. In some implementations of the invention, modifying material 1380 is deposited onto face 1340 using vapor deposition under a vacuum, which may have a pressure of $5 \times 10^{-6}$ torr or less.

Referring to FIG. 12, FIG. 13H and FIG. 13I, in an optional operation 1240, in some implementations of the invention, a portion of wedge 1330 is removed to reduce a size of wedge 1330 to produce a wedge 1390. In an operation 1250, double-ended leads are applied to each of the two a-planes (i.e., "b-c" faces) of wedge 1390 using a bonding agent. In some implementations of the invention, silver paste (Alfa Aesar silver paste #42469) is used to apply double-ended leads to the two a-planes (i.e., "b-c" faces) of wedge 1390. In an operation 1260, the bonding agent is cured. In some implementations using silver paste as the bonding agent, the silver paste is cured for one hour at 60° C. and then cured for an additional hour at 150° C. Other curing protocols may be used as would be apparent. In some implementations of the invention, a conductive material, such as, but not limited to, silver, is sputtered or otherwise bonded onto each of the two b-c faces of wedge 1390 and the double-ended leads are attached thereto as would be apparent. Other mechanisms for attaching double-ended leads to wedge 490 may be used. After operation 1250, wedge 1390 with modified region 1360 (illustrated in FIG. 13J) is ready for testing.

Figure 15:
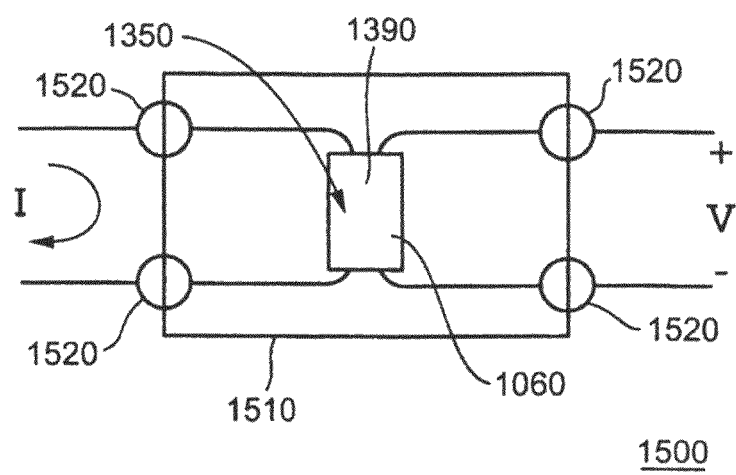
FIG. 15 illustrates a test bed useful for determining various operational characteristics of a modified ELR material according to various implementations of the invention.

FIG. 15 illustrates a test bed 1500 useful for determining various operational characteristics of wedge 1390. Test bed 1500 includes a housing 1510 and four clamps 1520. Wedge 1390 is placed in housing 1510 and each of the double-ended leads are clamped to housing 1510 using clamps 1520 as illustrated. The leads are clamped to housing 1510 to provide stress relief in order to prevent flexure and/or fracture of the cured silver paste. A current source is applied to one end of the pair of double-ended leads and a voltmeter measures voltage across the other end of the pair of double-ended leads. This configuration provides a multi-point technique for determining resistance of wedge 1390, and in particular, of modified ELR material 1060 as would be appreciated.

Figure 16A:
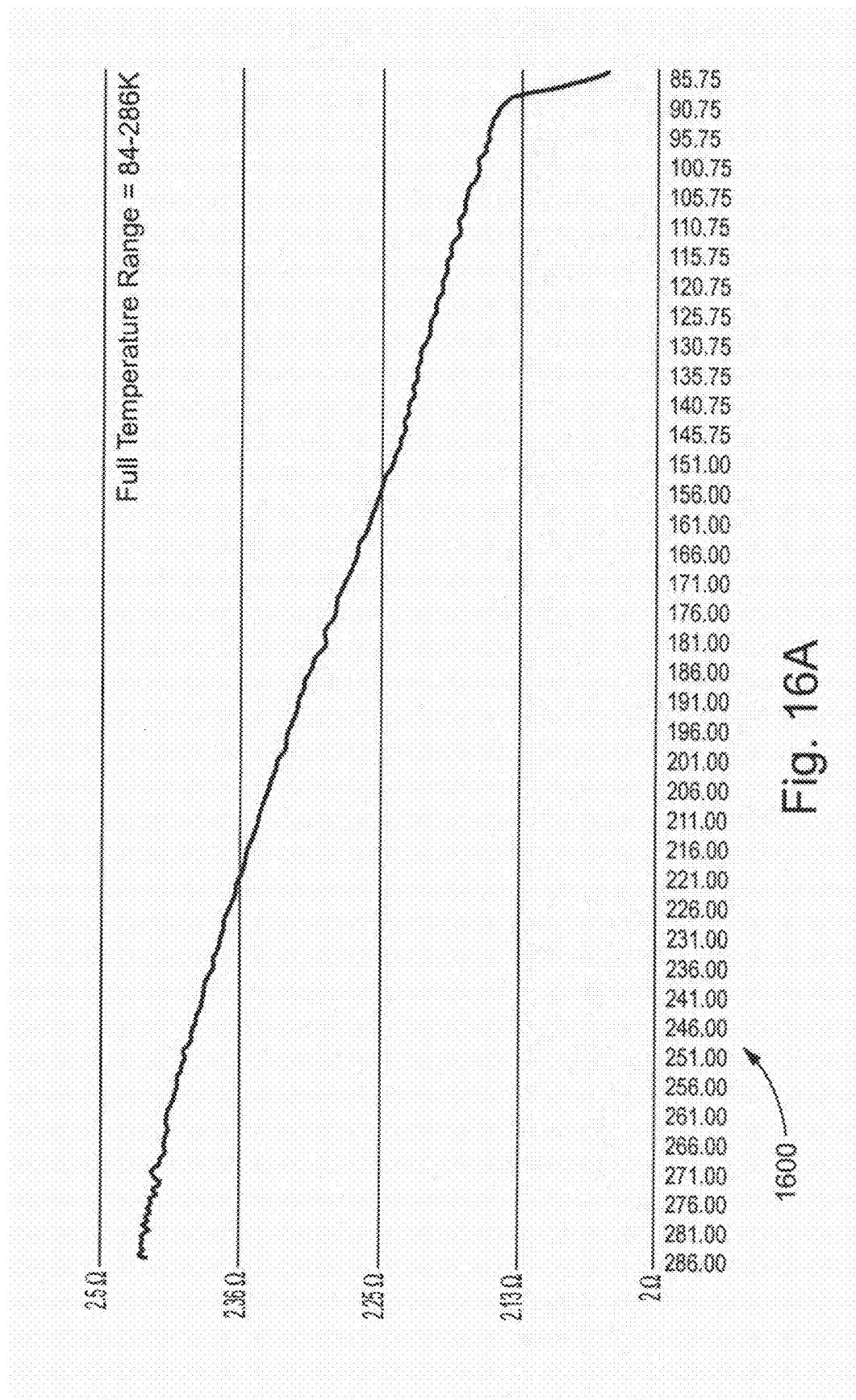
FIGS. 16A-16G illustrate test results demonstrating various operational characteristics of a modified ELR material.
Figure 16B:
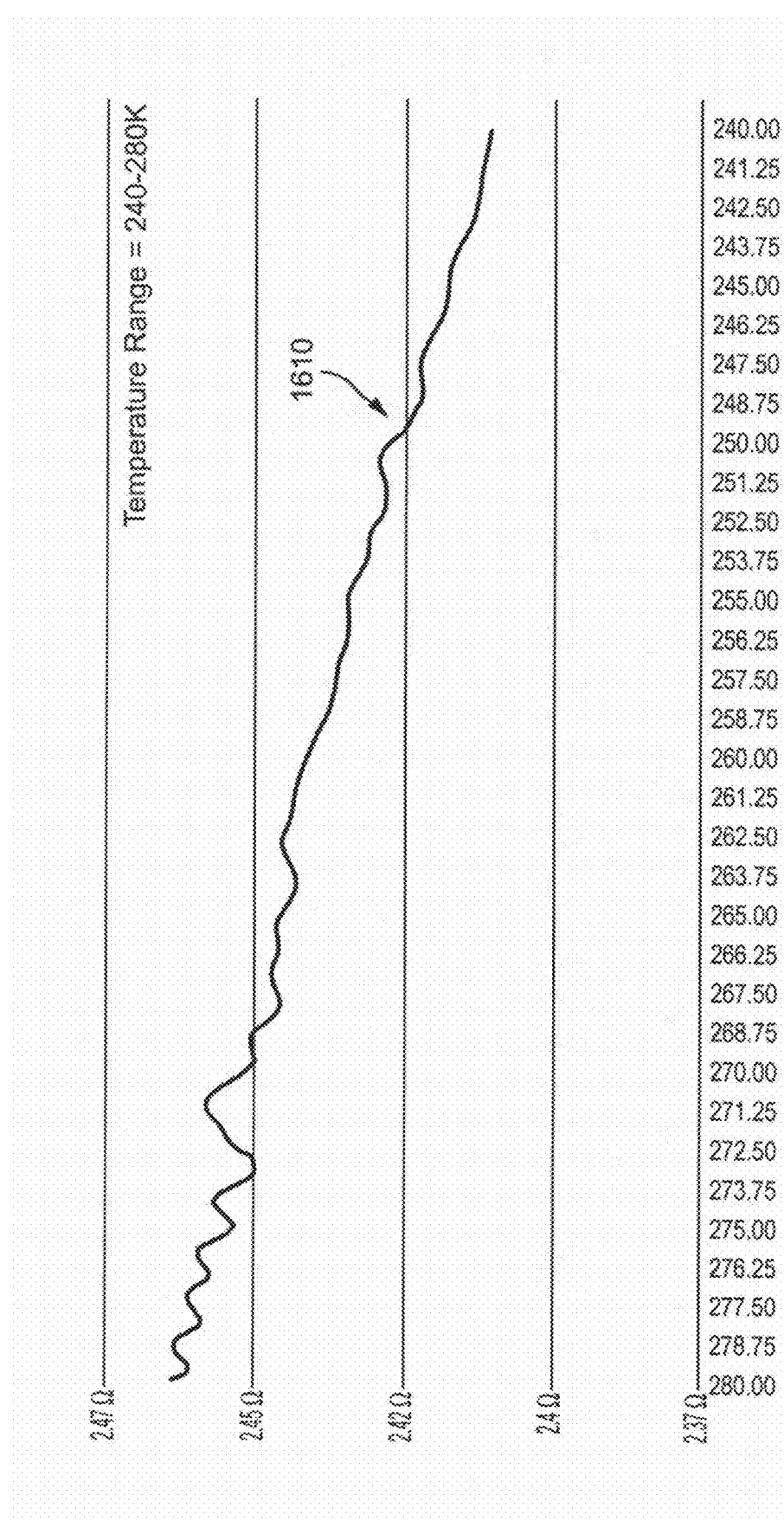
Figure 16C:
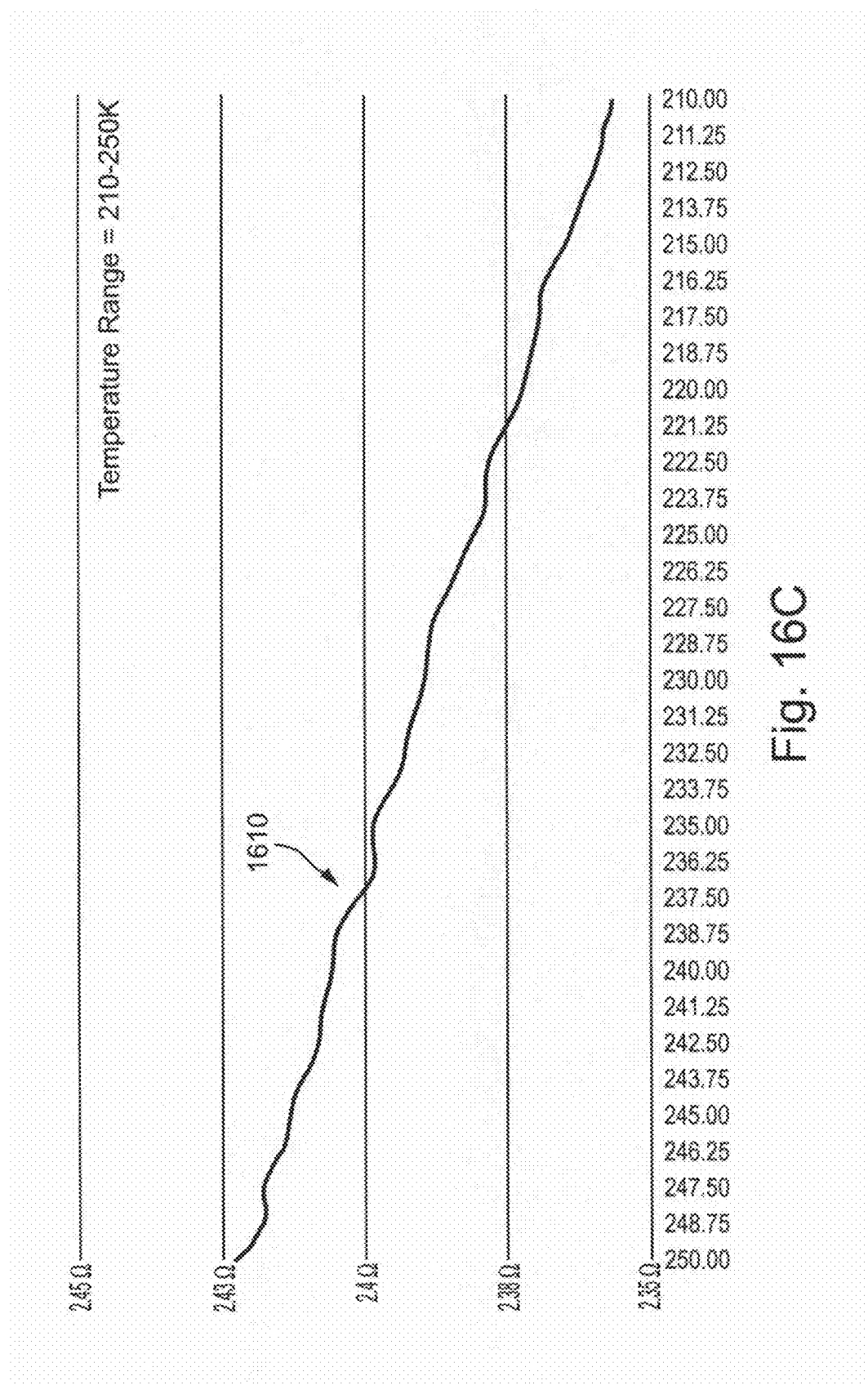
Figure 16D:
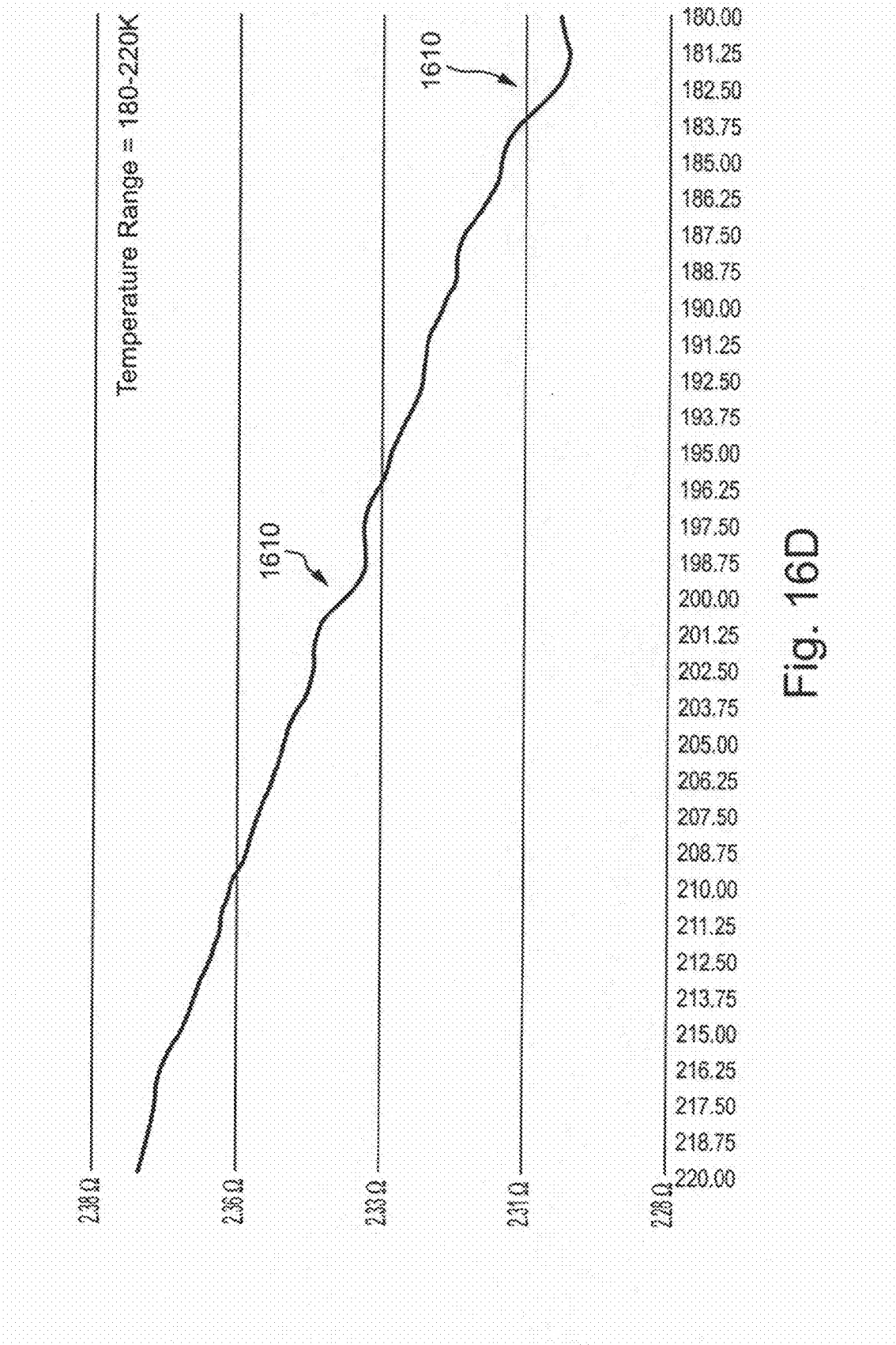
Figure 16E:
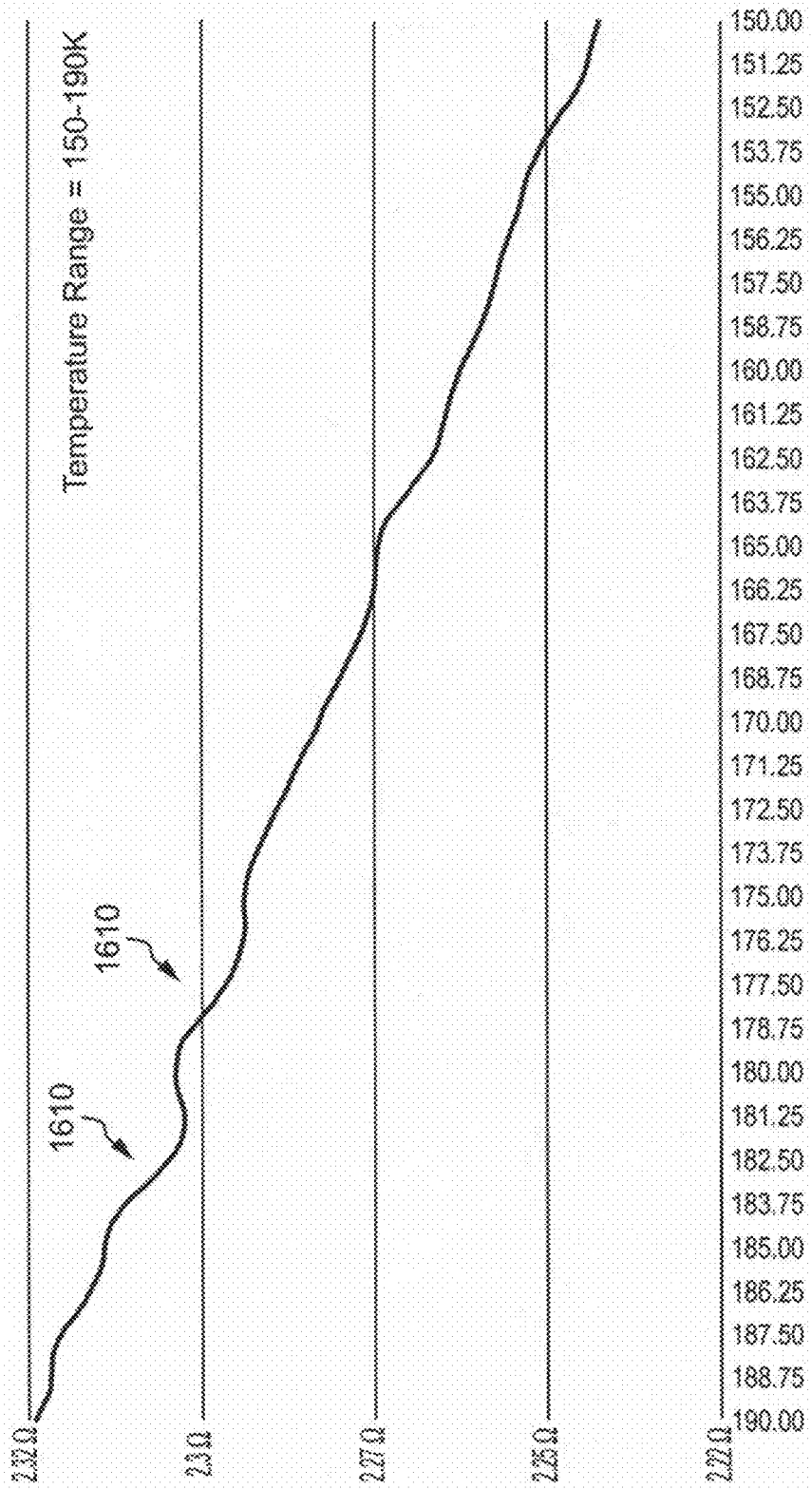
Figure 16F:
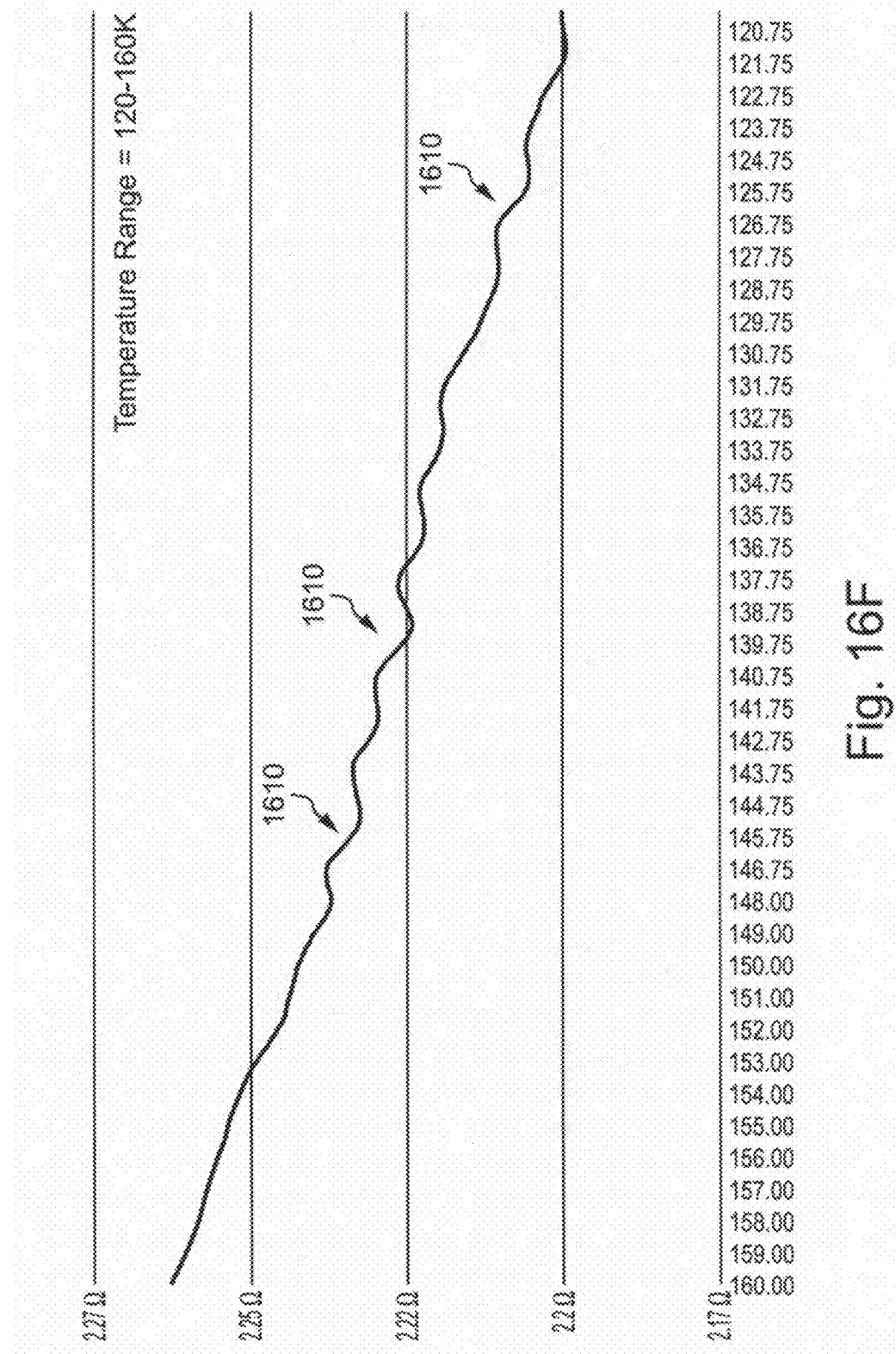
Figure 16G:
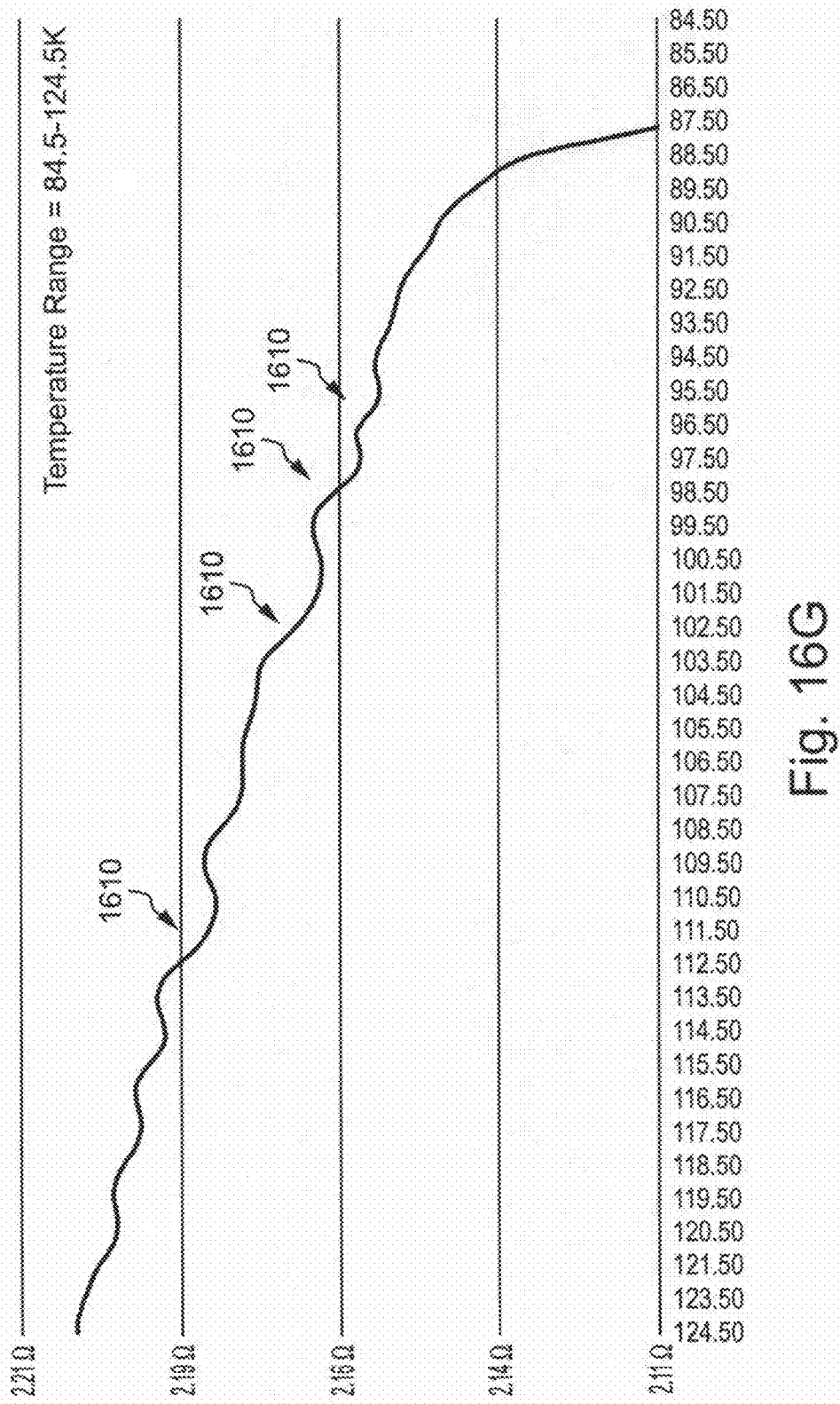

FIGS. 16A-16G illustrate test results 1600 obtained as described above. Test results 1600 include a plot of resistance of modified ELR material 1060 as a function of temperature (in K). More particularly, test results 1600 correspond to modified ELR material 1060 where modifying material 1380 corresponds to chromium and where ELR material 360 corresponds to YBCO. FIG. 16A includes test results 1600 over a full range of temperature over which resistance of modified ELR material 1060 was measured, namely 84K to 286K. In order to provide further detail, test results 1600 were broken into various temperature ranges and illustrated. In particular, FIG. 16B illustrates those test results 1600 within a temperature range from 240K to 280K; FIG. 16C illustrates those test results 1600 within a temperature range from 210K to 250K; FIG. 16D illustrates those test results 1600 within a temperature range from 180K to 220K; FIG. 16E illustrates those test results 1600 within a temperature range from 150K to 190K; FIG. 16F illustrates those test results 1600 within a temperature range from 120K to 160K; and FIG. 16G illustrates those test results 1600 within a temperature range from 84.5K to 124.5K.

Test results 1600 demonstrate that various portions of modified ELR material 1060 within wedge 1390 operate in an ELR state at higher temperatures relative to ELR material 360. Six sample analysis test runs were made using wedge 1390. For each sample analysis test run, test bed 1510, with wedge 1390 mounted therein, was slowly cooled from approximately 286K to 83K. While being cooled, the current source applied +60 nA and −60 nA of current in a delta mode configuration through wedge 1390 in order to reduce impact of any DC offsets and/or thermocouple effects. At regular time intervals, the voltage across wedge 1390 was measured by the voltmeter. For each sample analysis test run, the time series of voltage measurements were filtered using a 512-point fast Fourier transform ("FFT"). All but the lowest 44 frequencies from the FFT were eliminated from the data and the filtered data was returned to the time domain. The filtered data from each sample analysis test run were then merged together to produce test results 1600. More particularly, all the resistance measurements from the six sample analysis test runs were organized into a series of temperature ranges (e.g., 80K-80.25K, 80.25K to 80.50, 80.5K to 80.75K, etc.) in a manner referred to as "binning." Then the resistance measurements in each temperature range were averaged together to provide an average resistance measurement for each temperature range. These average resistance measurements form test results 1600.

Test results 1600 include various discrete steps 1610 in the resistance versus temperature plot, each of such discrete steps 1610 representing a relatively rapid change in resistance over a relatively narrow range of temperatures. At each of these discrete steps 1610, discrete portions of modified ELR material 1060 begin propagating electrical charge up to such portions' charge propagating capacity at the respective temperatures. This behavior is described in reference to FIG. 13J, which illustrates an interface between modifying material 1380 and ELR material 360. At very small scales, face 1340 is not perfectly smooth. In fact, as illustrated, only portions of apertures 310 are exposed within face 1340 and hence only small portions of ELR material 360 may be modified. Hence, apertures 310 within modified ELR material 1060 typically do not extend across the entire width or length of wedge 1390. Accordingly, in some implementations of the invention, modifying material 1380 covers an entire surface of ELR material 360 and may act as a conductor that carries electrical charge between apertures 310.

Before discussing test results 1600 in further detail, various characteristics of ELR material 360 and modifying material 1380 are discussed. Resistance versus temperature ("R-T") profiles of these materials individually are generally well known. The individual R-T profiles of these materials are not believed to include features similar to discrete steps 1610 found in test results 1600. In fact, unmodified samples of ELR material 360 and samples of modifying material 1380 alone have been tested under similar and often identical testing and measurement configurations. In each instance, the R-T profile of the unmodified samples of ELR material 360 and the R-T profile of the modifying material alone did not include any features similar to discrete steps 1610. Accordingly, discrete steps 1610 are the result of modifying ELR material 360 with modifying material 1380 to maintain aperture 310 at increased temperatures thereby allowing modified material 1380 to remain in an ELR state at such increased temperatures in accordance with various implementations of the invention.

At each of discrete steps 1610, various ones of apertures 310 within modified ELR material 1060 start propagating electrical charge up to each aperture's 310 charge propagating capacity. As measured by the voltmeter, each charge propagating aperture 310 appears as a short-circuit, dropping the apparent voltage across wedge 1390 by a small amount. The apparent voltage continues to drop as additional ones of apertures 310 start propagating electrical charge until the temperature of wedge 1390 reaches the transition temperature of ELR material 360 (i.e., the transition temperature of the unmodified ELR material which in the case of YBCO is approximately 90K).

Test results 1600 indicate that certain apertures 310 within modified ELR material 1060 propagate electrical charge at approximately 97K. In other words, test results indicate that certain apertures 310 within modified ELR material 1060 propagate electrical charge through crystalline structure of the modified ELR material 1060 at approximately 97K. Test results 1600 also indicate that: certain apertures 310 within modified ELR material 1060 propagate electrical charge at approximately 100K; certain apertures 310 within modified ELR material 1060 propagate electrical charge at approximately 103K; certain apertures 310 within modified ELR material 1060 propagate electrical charge at approximately 113K; certain apertures 310 within modified ELR material 1060 propagate electrical charge at approximately 126K; certain apertures 310 within modified ELR material 1060 propagate electrical charge at approximately 140K; certain apertures 310 within modified ELR material 1060 propagate electrical charge at approximately 146K; certain apertures 310 within modified ELR material 1060 propagate electrical charge at approximately 179K; certain apertures 310 within modified ELR material 1060 propagate electrical charge at approximately 183.5K; certain apertures 310 within modified ELR material 1060 propagate electrical charge at approximately 200.5K; certain apertures 310 within modified ELR material 1060 propagate electrical charge at approximately 237.5K; and certain apertures 310 within modified ELR material 1060 propagate electrical charge at approximately 250K. Certain apertures 310 within modified ELR material 1060 may propagate electrical charge at other temperatures within the full temperature range as would be appreciated.

Test results 1600 include various other relatively rapid changes in resistance over a relatively narrow range of temperatures not otherwise identified as a discrete step 1610. Some of these other changes may correspond to artifacts from data processing techniques used on the measurements obtained during the test runs (e.g., FFTs, filtering, etc.). Some of these other changes may correspond to changes in resistance due to resonant frequencies in modified crystalline structure 1010 affecting aperture 310 at various temperatures. Some of these other changes may correspond to additional discrete steps 1610. In addition, changes in resistance in the temperature range of 270-274K are likely to be associated with water present in modified ELR material 1060, some of which may have been introduced during preparation of wedge 1380, for example, but not limited to, during operation 1410.

In addition to discrete steps 1610, test results 1600 differ from the R-T profile of ELR material 360 in that modifying material 1380 conducts well at temperatures above the transition temperature of ELR material 360 whereas ELR material 360 typically does not.

Figure 24:
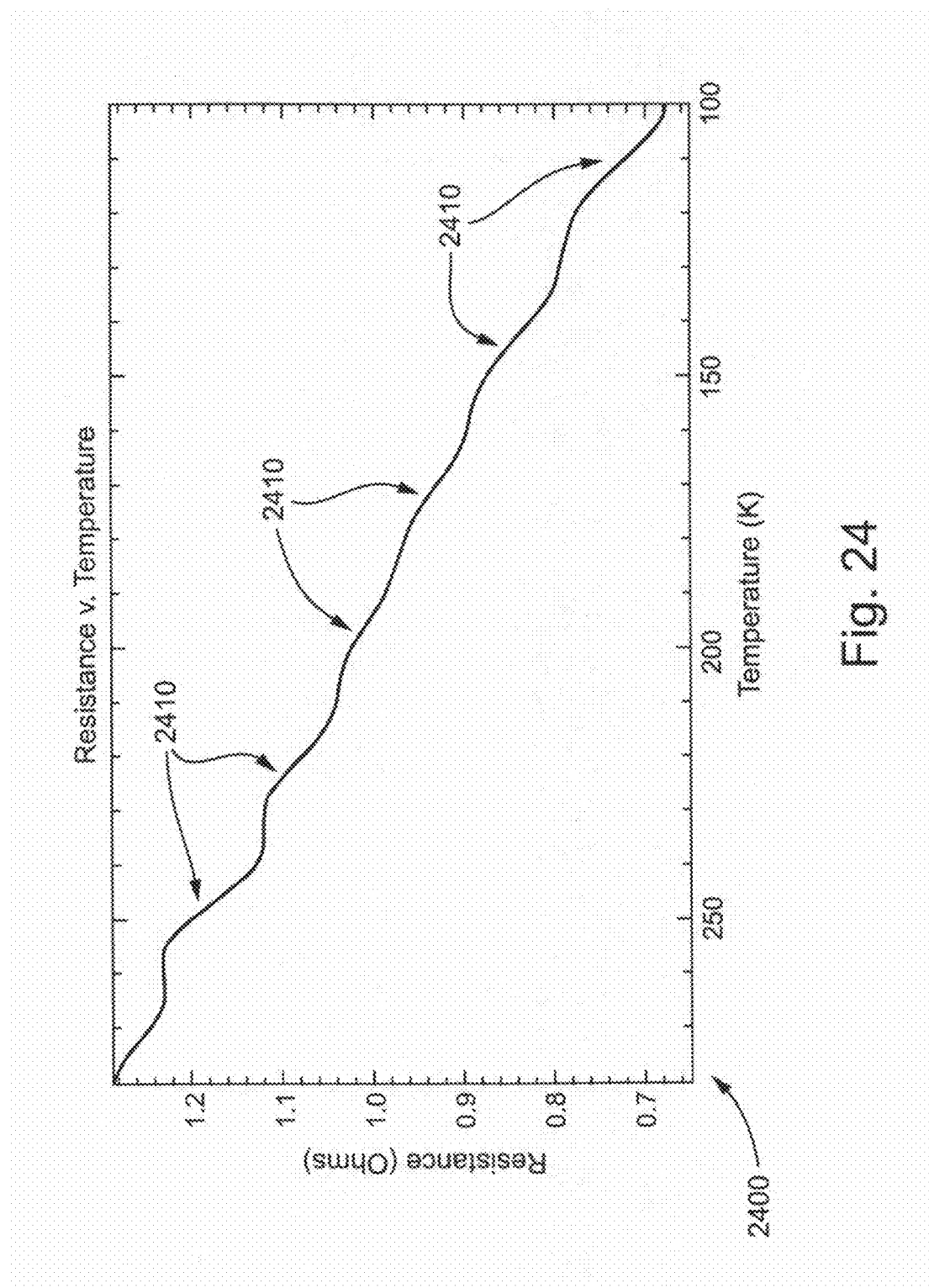
FIG. 24 illustrates test results demonstrating various operational characteristics of a modified ELR material, namely with chromium as a modifying material and YBCO as an ELR material, in accordance with various implementations of the invention.

FIG. 24 illustrates additional test results 2400 for samples of ELR material 360 and modifying material 1380. More particularly, for test results 2400, modifying material 1380 corresponds to chromium and ELR material 360 corresponds to YBCO. For test results 2400, samples of ELR material 360 were prepared, using various techniques discussed above, to expose a face of crystalline structure 300 parallel to the a-plane or the b-plane. Test results 2400 were gathered using a lock-in amplifier and a K6221 current source, which applied a 10 nA current at 24.0, Hz to modified ELR material 1060. Test results 2400 include a plot of resistance of modified ELR material 1060 as a function of temperature (in K). FIG. 24 includes test results 2400 over a full range of temperature over which resistance of modified ELR material 1060 was measured, namely 80K to 275K. Test results 2400 demonstrate that various portions of modified ELR material 1060 operate in an ELR state at higher temperatures relative to ELR material 360. Five sample analysis test runs were made with a sample of modified ELR material 1060. For each sample analysis test run, the sample of modified ELR material 1060 was slowly warmed from 80K to 275K. While being warmed, the voltage across the sample of modified ELR material 1060 was measured at regular time intervals and the resistance was calculated based on the source current. For each sample analysis test run, the time series of resistance measurements were filtered using a 1024-point FFT. All but the lowest 15 frequencies from the FFT were eliminated from the data and the filtered resistance measurements were returned to the time domain. The filtered resistance measurements from each sample analysis test run were then merged together using the binning process referred to above to produce test results 2400. Then the resistance measurements in each temperature range were averaged together to provide an average resistance measurement for each temperature range. These average resistance measurements form test results 2400.

Test results 2400 include various discrete steps 2410 in the resistance versus temperature plot, each of such discrete steps 2410 representing a relatively rapid change in resistance over a relatively narrow range of temperatures, similar to discrete steps 1610 discussed above with respect to FIGS. 16A-16G. At each of these discrete steps 2410, discrete portions of modified ELR material 1060 propagate electrical charge up to such portions' charge propagating capacity at the respective temperatures.

Test results 2400 indicate that certain apertures 310 within modified ELR material 1060 propagate electrical charge at approximately 120K. In other words, test results 2400 indicate that certain apertures 310 within modified ELR material 1060 propagate electrical charge through crystalline structure of the modified ELR material 1060 at approximately 120K. Test results 2400 also indicate that: certain apertures 310 within modified ELR material 1060 propagate electrical charge at approximately 145K; certain apertures 310 within modified ELR material 1060 propagate electrical charge at approximately 175K; certain apertures 310 within modified ELR material 1060 propagate electrical charge at approximately 200K; certain apertures 310 within modified ELR material 1060 propagate electrical charge at approximately 225K; and certain apertures 310 within modified ELR material 1060 propagate electrical charge at approximately 250K. Certain apertures 310 within modified ELR material 1060 may propagate electrical charge at other temperatures within the full temperature range as would be appreciated.

FIGS. 25-29 illustrate additional test results for samples of ELR material 360 and various modifying materials 1380. For these additional test results, samples of ELR material 360 were prepared, using various techniques discussed above, to expose a face of crystalline structure 300 substantially parallel to the a-plane or the b-plane or some combination of the a-plane or the b-plane and the modifying material was layered onto these exposed faces. Each of these modified samples was slowly cooled from approximately 300K to 80K. While being warmed, a current source applied a current in a delta mode configuration through the modified sample as described below. At regular time intervals, the voltage across the modified sample was measured. For each sample analysis test run, the time series of voltage measurements were filtered in the frequency domain using an FFT by removing all but the lowest frequencies, and the filtered measurements were returned to the time domain. The number of frequencies kept is in general different for each data set. The filtered data from each of test runs were then binned and averaged together to produce the test results illustrated in FIGS. 25-29.

Figure 25:
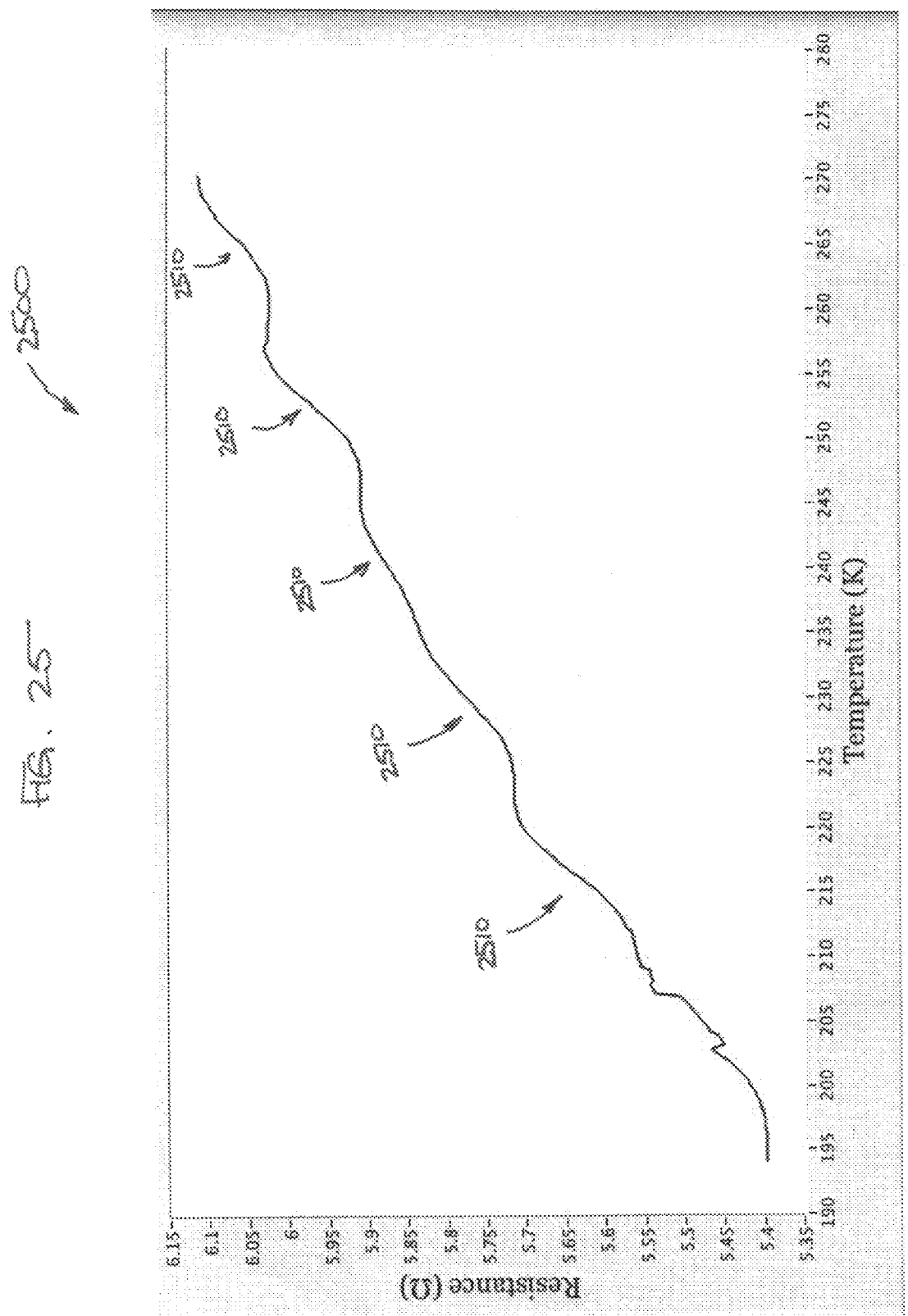
FIG. 25 illustrates test results demonstrating various operational characteristics of a modified ELR material, namely with vanadium as a modifying material and YBCO as an ELR material, in accordance with various implementations of the invention.
Figure 24:
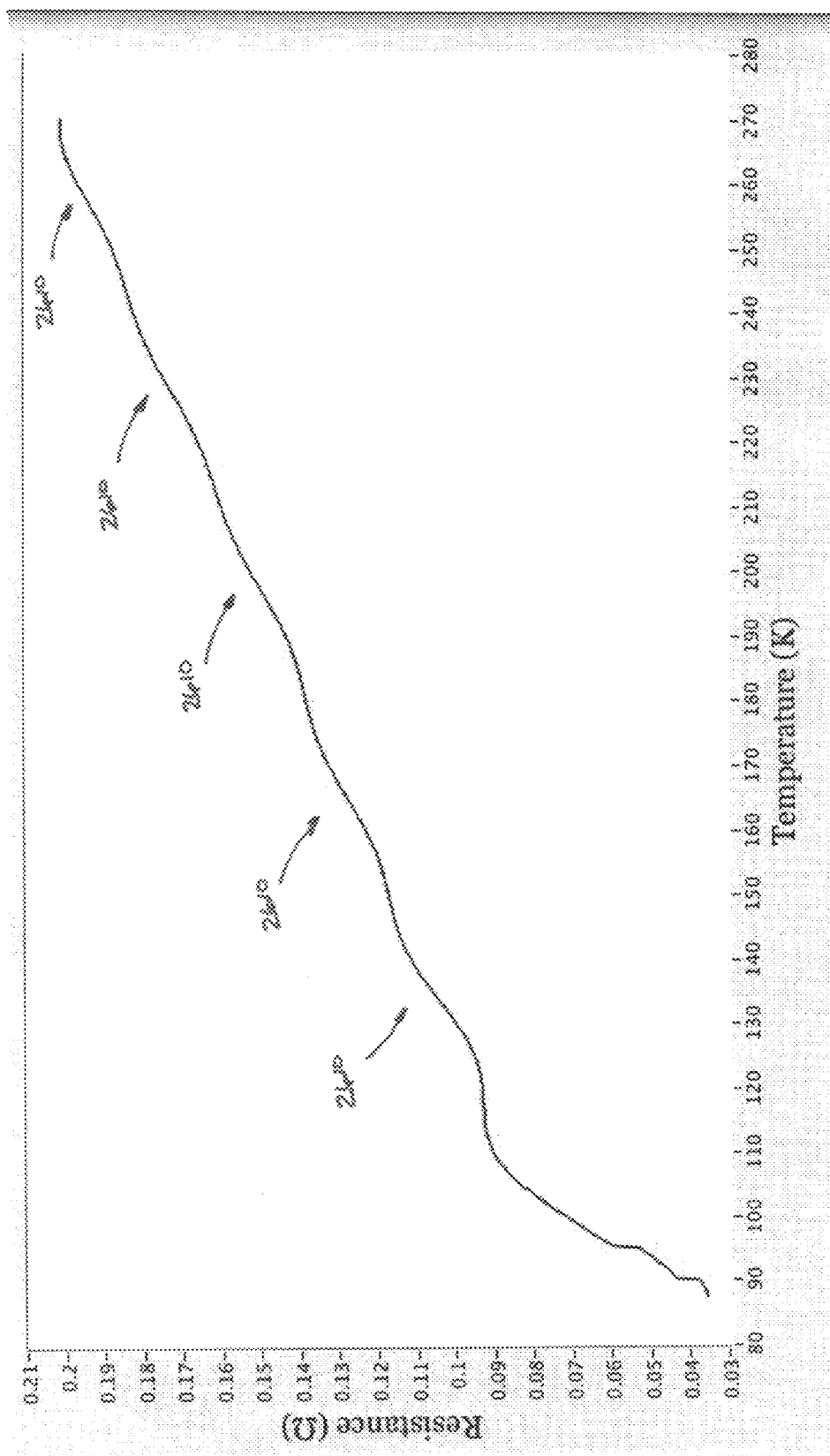

FIG. 25 illustrates test results 2500 including a plot of resistance of modified ELR material 1060 as a function of temperature (in K). For test results 2500, modifying material 1380 corresponds to vanadium and ELR material 360 corresponds to YBCO. Test results 2500 were produced over 11 test runs using a 20 nA current source, a 1024-point FFT was performed, and information from all but the lowest 12 frequencies were eliminated. Test results 2500 demonstrate that various portions of modified ELR material 1060 operate in an ELR state at higher temperatures relative to ELR material 360. Test results 2500 include various discrete steps 2510 in the resistance versus temperature plot, similar to those discussed above with regard to FIGS. 16A-16G. Test results 2500 indicate that: certain apertures 310 within modified ELR material 1060 propagate electrical charge at approximately 267K; certain apertures 310 within modified ELR material 1060 propagate electrical charge at approximately 257K; certain apertures 310 within modified ELR material 1060 propagate electrical charge at approximately 243K; certain apertures 310 within modified ELR material 1060 propagate electrical charge at approximately 232K; and certain apertures 310 within modified ELR material 1060 propagate electrical charge at approximately 219K. Certain apertures 310 within modified ELR material 1060 may propagate electrical charge at other temperatures.

FIG. 26 illustrates test results 2600 include a plot of resistance of modified ELR material 1060 as a function of temperature (in K). For test results 2600, modifying material 1380 corresponds to bismuth and ELR material 360 corresponds to YBCO. Test results 2600 were produced over 5 test runs using a 400 nA current source, a 1024-point FFT was performed, and information from all but the lowest 12 frequencies were eliminated. Test results 2600 demonstrate that various portions of modified ELR material 1060 operate in an ELR state at higher temperatures relative to ELR material 360. Test results 2600 include various discrete steps 2610 in the resistance versus temperature plot, similar to those discussed above with regard to FIGS. 16A-16G. Test results 2600 indicate that: certain apertures 310 within modified ELR material 1060 propagate electrical charge at approximately 262K; certain apertures 310 within modified ELR material 1060 propagate electrical charge at approximately 235K; certain apertures 310 within modified ELR material 1060 propagate electrical charge at approximately 200K; certain apertures 310 within modified ELR material 1060 propagate electrical charge at approximately 172K; and certain apertures 310 within modified ELR material 1060 propagate electrical charge at approximately 141K. Certain apertures 310 within modified ELR material 1060 may propagate electrical charge at other temperatures.

FIG. 27 illustrates test results 2700 include a plot of resistance of modified ELR material 1060 as a function of temperature (in K). For test results 2700, modifying material 1380 corresponds to copper and ELR material 360 corresponds to YBCO. Test results 2500 were produced over 25 test runs using a 200 nA current source, a 1024-point FFT was performed, and information from all but the lowest 12 frequencies were eliminated. Test results 2700 demonstrate that various portions of modified ELR material 1060 operate in an ELR state at higher temperatures relative to ELR material 360. Test results 2700 include various discrete steps 2710 in the resistance versus temperature plot, similar to those discussed above with regard to FIGS. 16A-16G. Test results 2700 indicate that: certain apertures 310 within modified ELR material 1060 propagate electrical charge at approximately 268K; certain apertures 310 within modified ELR material 1060 propagate electrical charge at approximately 256K; certain apertures 310 within modified ELR material 1060 propagate electrical charge at approximately 247K; certain apertures 310 within modified ELR material 1060 propagate electrical charge at approximately 235K; and certain apertures 310 within modified ELR material 1060 propagate electrical charge at approximately 223K. Certain apertures 310 within modified ELR material 1060 may propagate electrical charge at other temperatures.

FIG. 28 illustrates test results 2800 include a plot of resistance of modified ELR material 1060 as a function of temperature (in K). For test results 2800, modifying material 1380 corresponds to cobalt and ELR material 360 corresponds to YBCO. Test results 2500 were produced over 11 test runs using a 400 nA current source, a 1024-point FFT was performed, and information from all but the lowest 12 frequencies were eliminated. Test results 2800 demonstrate that various portions of modified ELR material 1060 operate in an ELR state at higher temperatures relative to ELR material 360. Test results 2800 include various discrete steps 2810 in the resistance versus temperature plot, similar to those discussed above with regard to FIGS. 16A-16G. Test results 2800 indicate that: certain apertures 310 within modified ELR material 1060 propagate electrical charge at approximately 265K; certain apertures 310 within modified ELR material 1060 propagate electrical charge at approximately 236K; certain apertures 310 within modified ELR material 1060 propagate electrical charge at approximately 205K; certain apertures 310 within modified ELR material 1060 propagate electrical charge at approximately 174K; and certain apertures 310 within modified ELR material 1060 propagate electrical charge at approximately 143K. Certain apertures 310 within modified ELR material 1060 may propagate electrical charge at other temperatures.

FIG. 29 illustrates test results 2900 include a plot of resistance of modified ELR material 1060 as a function of temperature (in K). For test results 2900, modifying material 1380 corresponds to titanium and ELR material 360 corresponds to YBCO. Test results 2500 were produced over 25 test runs using a 100 nA current source, a 512-point FFT was performed, and information from all but the lowest 11 frequencies were eliminated. Test results 2900 demonstrate that various portions of modified ELR material 1060 operate in an ELR state at higher temperatures relative to ELR material 360. Test results 2900 include various discrete steps 2910 in the resistance versus temperature plot, similar to those discussed above with regard to FIGS. 16A-16G. Test results 2900 indicate that: certain apertures 310 within modified ELR material 1060 propagate electrical charge at approximately 266K; certain apertures 310 within modified ELR material 1060 propagate electrical charge at approximately 242K; and certain apertures 310 within modified ELR material 1060 propagate electrical charge at approximately 217K. Certain apertures 310 within modified ELR material 1060 may propagate electrical charge at other temperatures.

In other experiments, modifying material 1020 was layered onto a surface of ELR material 360 substantially parallel to the c-plane of crystalline structure 300. These tests results (not otherwise illustrated) demonstrate that layering a surface of ELR material 360 parallel to the c-plane with modifying material 1020 did not produce any discrete steps such as those described above (e.g., discrete steps 1610). These test results indicate that modifying a surface of ELR material 360 that is perpendicular to a direction in which ELR material 360 does not (or tends to not) exhibit the resistance phenomenon does not improve the operating characteristics of the unmodified ELR material. In other words, modifying such surfaces of ELR material 360 may not maintain aperture 310. In accordance with various principles of the invention, modifying material should be layered with surfaces of the ELR material that are parallel to the direction in which ELR material does not (or tends to not) exhibit the resistance phenomenon. More particularly, and for example, with regard to ELR material 360 (illustrated in FIG. 3), modifying material 1020 should be bonded to an "a-c" face or a "b-c" face of crystalline structure 300 (both of which faces are parallel to the c-axis) in ELR material 360 (which tends not to exhibit the resistance phenomenon in the direction of the c-axis) in order to maintain aperture 310.

Figure 20:
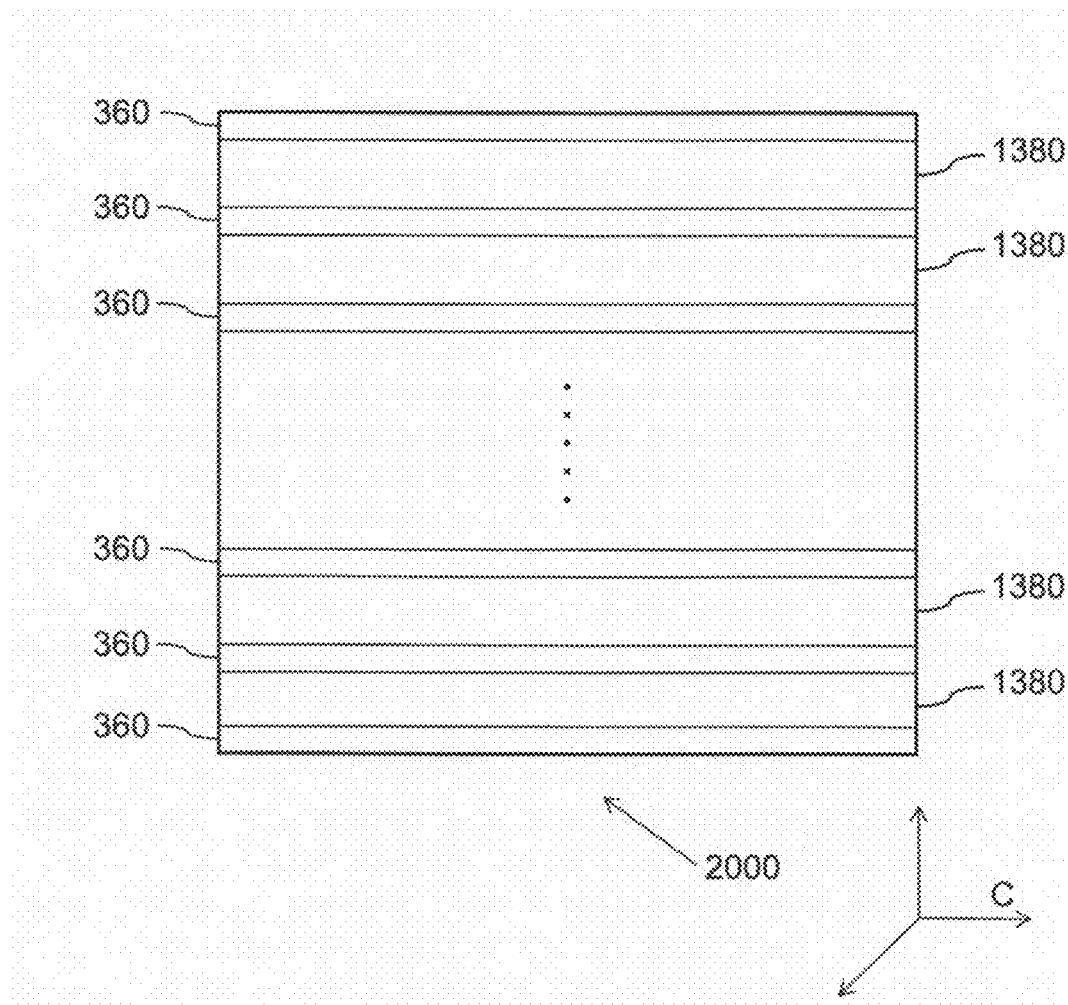
FIG. 20 illustrates an arrangement of an ELR material and a modifying material useful for propagating electrical charge according to various implementations of the invention.

FIG. 20 illustrates an arrangement 2000 including alternating layers of ELR material 360 and a modifying material 1380 useful for propagating additional electrical charge according to various implementations of the invention. Such layers may be deposited onto one another using various deposition techniques. Various techniques may be used to improve alignment of crystalline structures 300 within layers of ELR material 360. Improved alignment of crystalline structures 300 may result in apertures 310 of increased length through crystalline structure 300 which in turn may provide for operation at higher temperatures and/or with increased charge propagating capacity. Arrangement 2000 provides increased numbers of apertures 310 within modified ELR material 1060 at each interface between adjacent layers of modifying material 1380 and ELR material 360. Increased numbers of apertures 310 may increase a charge propagating capacity of arrangement 2000.

In some implementations of the invention, any number of layers may be used. In some implementations of the invention, other ELR materials and/or other modifying materials may be used. In some implementations of the invention, additional layers of other material (e.g., insulators, conductors, or other materials) may be used between paired layers of ELR material 360 and modifying material 1380 to mitigate various effects (e.g., magnetic effects, migration of materials, or other effects) or to enhance the characteristics of the modified ELR material 1060 formed within such paired layers. In some implementations of the invention, not all layers are paired. In other words, arrangement 2000 may have one or more extra (i.e., unpaired) layers of ELR material 360 or one or more extra layers of modifying material 1380.

Figure 23:
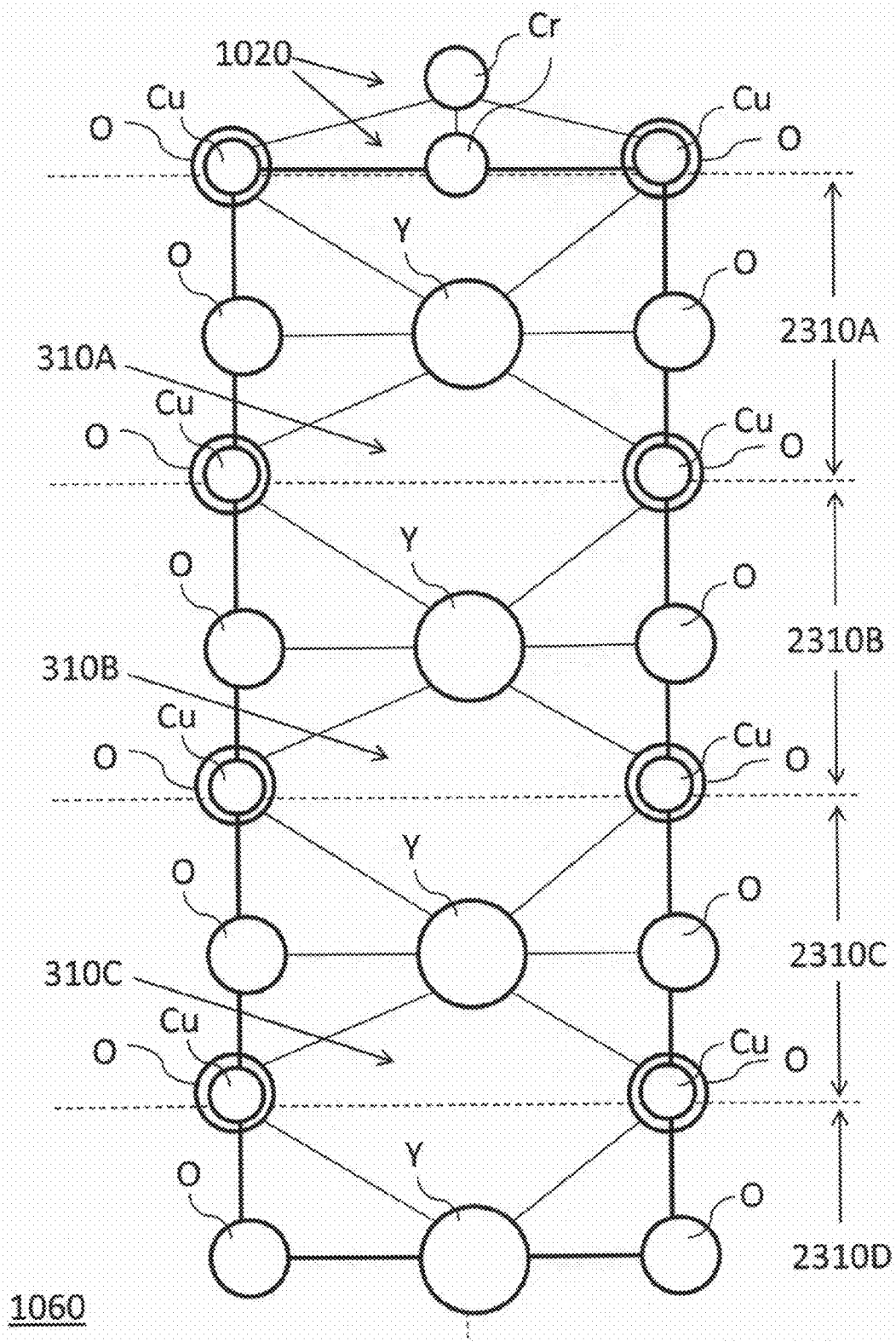
FIG. 23 illustrates multiple layers of crystalline structures of an exemplary surface-modified ELR material according to various implementations of the invention.

FIG. 23 illustrates additional of layers 2310 (illustrated as a layer 2310A, a layer 2310B, a layer 2310C, and a layer 2310D) of modified crystalline structure 1010 in modified ELR material 1060 according to various implementations of the invention. As illustrated, modified ELR material 1060 includes various apertures 310 (illustrated as an aperture 310A, an aperture 310B, and an aperture 310C) at different distances into material 1060 from modifying material 1020 that form bonds with atoms of crystalline structure 300 (of FIG. 3). Aperture 310A is nearest modifying material 1020, followed by aperture 310B, which in turn is followed by aperture 310C, etc. In accordance with various implementations of the invention, an impact of modifying material 1020 is greatest with respect to aperture 310A, followed by a lesser impact with respect to aperture 310B, which in turn is followed by a lesser impact with respect to aperture 310C, etc. According to some implementations of the invention, modifying material 1020 should better maintain aperture 310A than either aperture 310B or aperture 310C due to aperture 310A's proximity to modifying material 1020; likewise, modifying material 1020 should better maintain aperture 310B than aperture 310C due to aperture 310B's proximity to modifying material 1020, etc. According to some implementations of the invention, modifying material 1020 should better maintain the cross-section of aperture 310A than the cross-sections of either aperture 310B or aperture 310C due to aperture 310A's proximity to modifying material 1020; likewise, modifying material 1020 should better maintain the cross-section of aperture 310B than the cross-section of aperture 310C due to aperture 310B's proximity to modifying material 1020, etc. According to some implementations of the invention, modifying material 1020 should have a greater impact on a charge propagating capacity of aperture 310A at a particular temperature than on a charge propagating capacity of either aperture 310B or aperture 310C at that particular temperature due to aperture 310A's proximity to modifying material 1020; likewise, modifying material 1020 should have a greater impact on the charge propagating capacity of aperture 310B at a particular temperature than on the charge propagating capacity of aperture 310C at that particular temperature due to aperture 310B's proximity to modifying material 1020, etc. According to some implementations of the invention, modifying material 1020 should enhance the propagation of electrical charge through aperture 310A more than the propagation of electrical charge through either aperture 310B or aperture 310C due to aperture 310A's proximity to modifying material 1020; likewise, modifying material 1020 should enhance the propagation of electrical charge through aperture 310B more than the propagation of electrical charge through aperture 310C due to aperture 310B's proximity to modifying material 1020, etc.

Various test results described above, for example, test results 1600 of FIG. 16, among others, support these aspects of various implementations of the invention, i.e., generally, that the impact of modifying material 1020 on apertures 310 varies in relation to their proximity to one another. In particular, each discrete step 1610 in test results 1600 may correspond to a change in electrical charge carried by modified ELR material 1060 as those apertures 310 in a particular layer 2310 (or more appropriately, those apertures 310 formed between adjacent layers 2310 as illustrated) propagate electrical charge up to such apertures' 310 charge propagating capacity. Those apertures 310 in layers 2310 closer in proximity to modifying material 1020 correspond to discrete steps 1610 at higher temperatures whereas those apertures 310 in layers 2310 further from modifying material 1020 correspond to discrete steps 1610 at lower temperatures. Discrete steps 1610 are "discrete" in the sense that apertures 310 at a given relative distance to modifying material 1020 (i.e., apertures 310A between layers 2310A and 2310B) propagate electrical charge at a particular temperature and quickly reach their maximum charge propagating capacity. Another discrete step 1610 is reached when apertures 310 at an increased distance from modifying material 1020 (i.e., apertures 310B between layers 2310B and 2310C) propagate electrical charge at a lower temperature as a result of the increased distance and hence the lessened impact of modifying material 1020 on those apertures 310. Each discrete step 1610 corresponds to another set of apertures 310 beginning to carry electrical charge based on their distance from modifying material 1020. At some distance, however, modifying material 1020 may have insufficient impact on some apertures 310 to cause them to carry electrical charge at a higher temperature than they otherwise would; hence, such apertures 310 propagate electrical charge at a temperature consistent with that of ELR material 360.

In some implementations of the invention, a distance between modifying material 1020 and apertures 310 is reduced so as to increase impact of modifying material 1020 on more apertures 310. In effect, more apertures 310 should propagate electrical charge at discrete steps 1610 associated with higher temperatures. For example, in arrangement 2000 of FIG. 20 and in accordance with various implementations of the invention, layers of ELR material 360 may be made to be only a few unit cells thick in order to reduce the distance between apertures 310 in ELR material 360 and modifying material 1380. Reducing this distance should increase the number of apertures 310 impacted by modifying material 1380 at a given temperature. Reducing this distance also increases the number of alternating layers of ELR material 360 in a given overall thickness of arrangement 2000 thereby increasing an overall charge propagating capacity of arrangement 2000.

Figure 32:
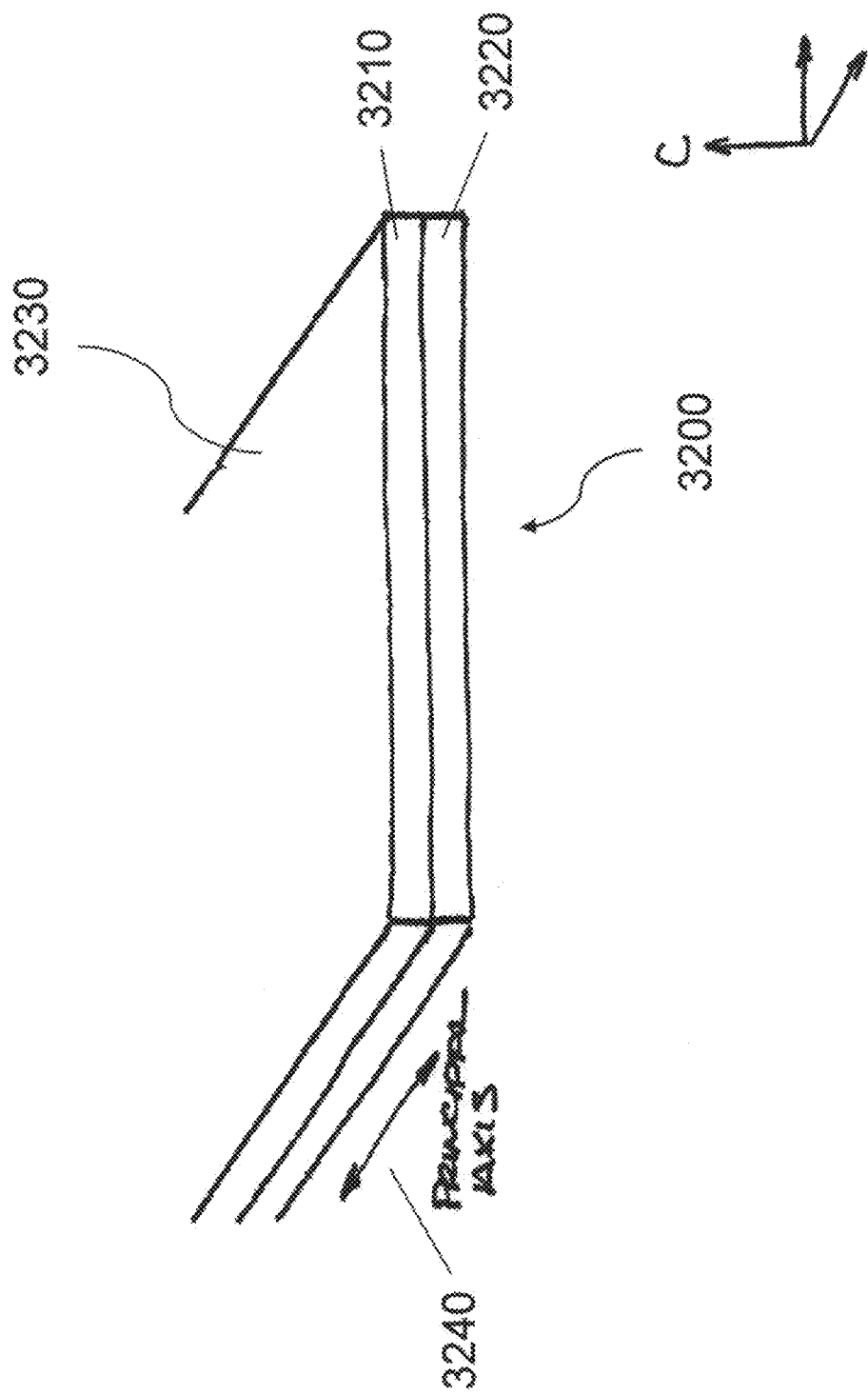
FIG. 32 illustrates a c-film of ELR material according to various implementations of the invention.

FIG. 32 illustrates a film 3200 of an ELR material 3210 formed on a substrate 3220, although, substrate 3220 may not be necessary in various implementations of the invention. In various implementations of the invention, film 3200 may be formed into a tape having a length, for example, greater than 10 cm, 1 m, 1 km or more. Such tapes may be useful, for example, as ELR conductors or ELR wires. As would be appreciated, while various implementations of the invention are described in reference to ELR films, such implementations apply to ELR tapes as well.

For purposes of this description and as illustrated in FIG. 32, film 3200 has a primary surface 3230 and a principal axis 3240. Principal axis 3240 corresponds to a axis extending along a length of film 3200 (as opposed to a width of film 3200 or a thickness of film 3200). Principal axis 3240 corresponds to a primary direction in which electrical charge flows through film 3200. Primary surface 3230 corresponds to the predominant surface of film 3200 as illustrated in FIG. 32, and corresponds to the surface bound by the width and the length of film 3200. It should be appreciated that films 3200 may have various lengths, widths, and/or thicknesses without departing from the scope of the invention.

In some implementations of the invention, during the fabrication of film 3200, the crystalline structures of ELR material 3210 may be oriented such that their c-axis is substantially perpendicular to primary surface 3230 of film 3200 and either the a-axis or the b-axis of their respective crystalline structures is substantially parallel to principal axis 3240. Hence, as illustrated in FIG. 32, the c-axis is referenced by name and the a-axis and the b-axis are not specifically labeled, reflecting their interchangeability for purposes of describing various implementations of the invention. In some fabrication processes of film 3200, the crystalline structures of ELR material may be oriented such that any given line within the c-plane may be substantially parallel with principal axis 3240.

For purposes of this description, films 3200 having the c-axis of their respective crystalline structures oriented substantially perpendicular to primary surface 3230 (including film 3200 depicted in FIG. 32) are referred to as "c-films" (i.e., c-film 3200). C-film 3200, with ELR material 3210 comprised of YBCO, is commercially available from, for example, American Superconductors™ (e.g., 344 Superconductor-Type 348C) or Theva Dünnschichttechnik GmbH (e.g., HTS coated conductors).

In some implementations of the invention, substrate 3220 may include a substrate material including, but not limited to, MgO, STO, LSGO, a polycrystalline material such as a metal or a ceramic, an inert oxide material, a cubic oxide material, a rare earth oxide material, or other substrate material as would be appreciated.

According to various implementations of the invention (and as described in further detail below), a modifying material (e.g., modifying material 1020, 1380) is layered onto an appropriate surface of ELR material 3210, where the appropriate surface of ELR material 3210 corresponds to any surface not substantially perpendicular to the c-axis of the crystalline structure of ELR material 3210. In other words, the appropriate surface of ELR material 3210 may correspond to any surface that is not substantially parallel to the primary surface 3230. In some implementations of the invention, the appropriate surface of ELR material 3210 may correspond to any surface that is substantially parallel to the c-axis of the crystalline structure of ELR material 3210. In some implementations of the invention, the appropriate surface of ELR material 3210 may correspond to any surface that is not substantially perpendicular to the c-axis of the crystalline structure of ELR material 3210. In order to modify an appropriate surface of c-film 3200 (whose primary surface 3230 is substantially perpendicular to the c-axis of the crystalline structure of ELR material 3210), the appropriate surface of ELR material 3210 may be formed on or within c-film 3200. In some implementations of the invention, primary surface 3230 may be processed to expose appropriate surface(s) of ELR material 3210 on or within c-film 3200 on which to layer modifying material. In some implementations of the invention, primary surface 3230 may be processed to expose one or more apertures 210 of ELR material 3210 on or within c-film 3200 on which to layer modifying material. It should be appreciated, that in various implementations of the invention, modifying material may be layered onto primary surface 3230 in addition to the appropriate surfaces referenced above.

Processing of primary surface 3230 of c-film 3200 to expose appropriate surfaces and/or apertures 210 of ELR material 3210 may comprise various patterning techniques, including various wet processes or dry processes. Various wet processes may include lift-off, chemical etching, or other processes, any of which may involve the use of chemicals and which may expose various other surfaces within c-film 3200. Various dry processes may include ion or electron bream irradiation, laser direct-writing, laser ablation or laser reactive patterning or other processes which may expose various appropriate surfaces and/or apertures 210 of ELR material 3210 within c-film 3200.

Figure 33:
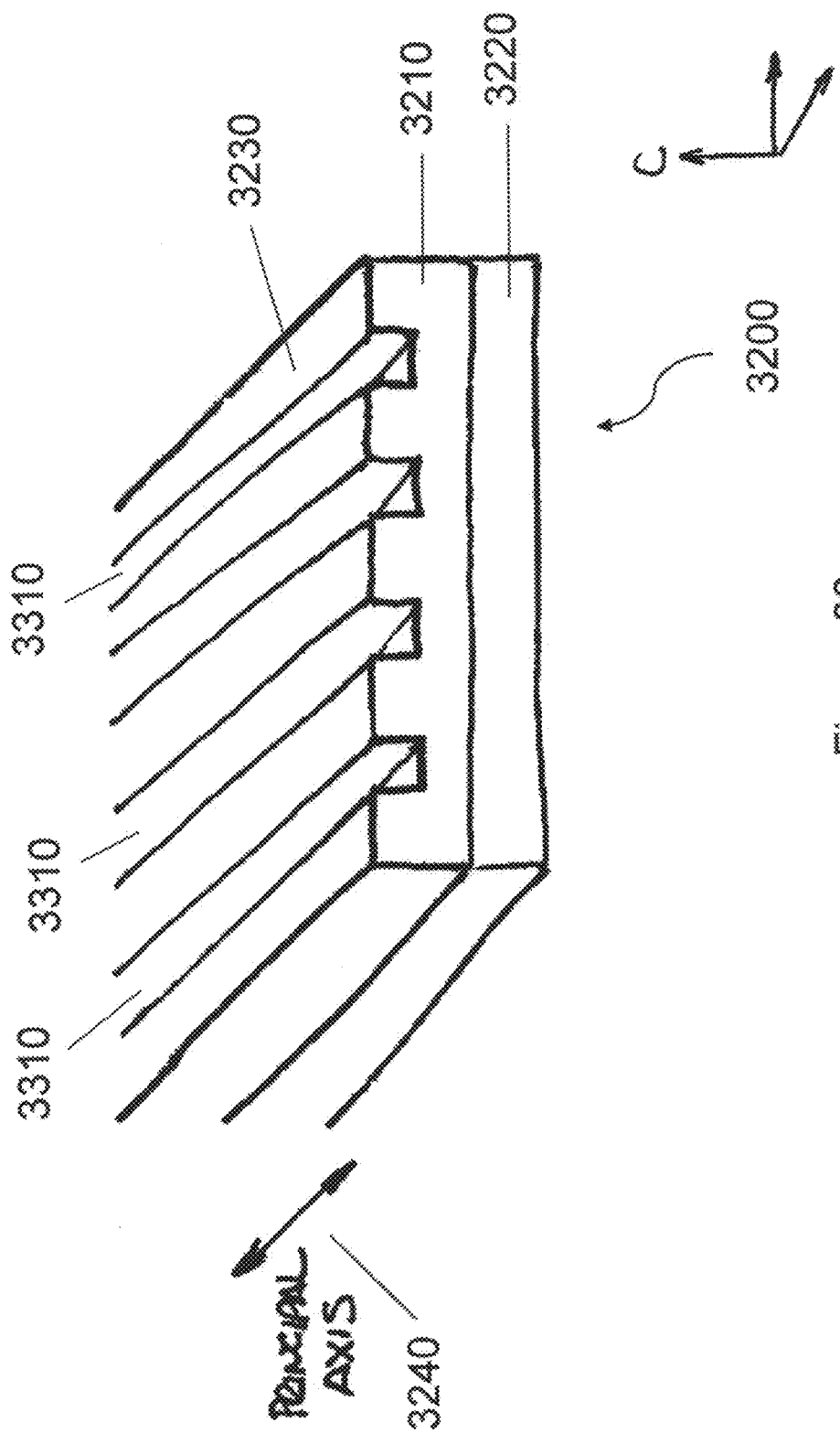
FIG. 33 illustrates a c-film with appropriate surfaces of ELR material according to various implementations of the invention.

As illustrated in FIG. 33, primary surface 3230 of c-film 3200 may be processed to expose an appropriate surface within c-film 3200. For example, c-film 3200 may be processed to expose a face within c-film 3200 substantially parallel to the b-plane of crystalline structure 100 or a face within c-film 3200 substantially parallel to the a-plane of crystalline structure 100. More generally, in some implementations of the invention, primary surface 3230 of c-film 3200 may be processed to expose an appropriate surface within c-film 3200 corresponding to an a/b-c face (i.e., a face substantially parallel to ab-plane). In some implementations of the invention, primary surface 3230 of c-film may be processed to expose any face within c-film 3200 that is not substantially parallel with primary surface 3230. In some implementations of the invention, primary surface 3230 of c-film may be processed to expose any face within c-film 3200 that is not substantially parallel with primary surface 3230 and also substantially parallel with principal axis 3240. Any of these faces, including combinations of these faces, may correspond to appropriate surfaces of ELR material 3210 on or within c-film 3200. According to various implementations of the invention, appropriate surfaces of ELR material 3210 provide access to or otherwise "expose" apertures 210 in ELR material 3210 for purposes of maintaining such apertures 210.

Figure 34:
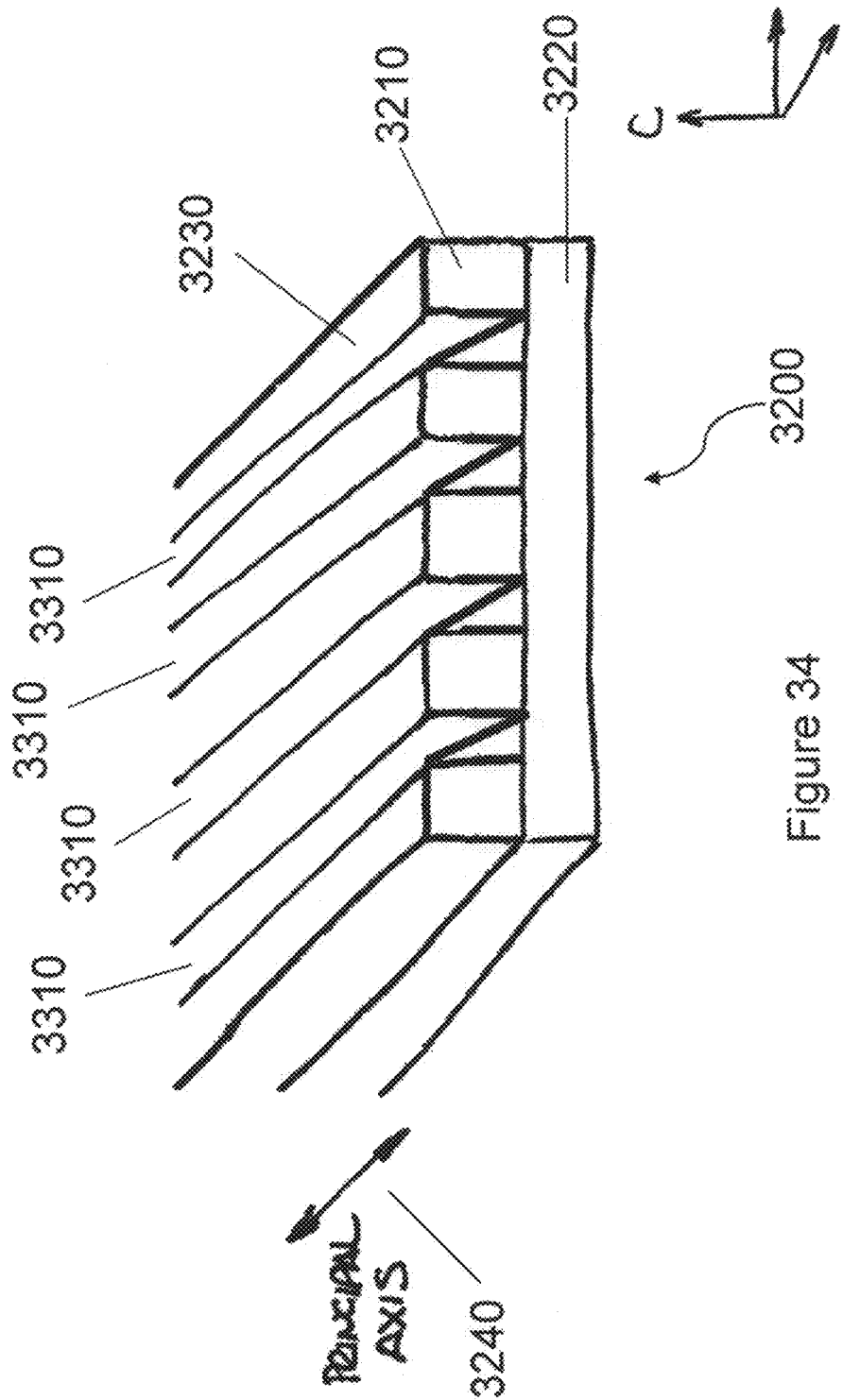
FIG. 34 illustrates a c-film with appropriate surfaces of ELR material according to various implementations of the invention.

In some implementations of the invention, as illustrated in FIG. 33, primary surface 3230 is processed to form one or more grooves 3310 in primary surface 3230. Grooves 3310 include one or more appropriate surfaces (i.e., surfaces other than one substantially parallel to primary surface 3230) on which to deposit modifying material. While grooves 3310 are illustrated in FIG. 33 as having a cross section substantially rectangular in shape, other shapes of cross sections may be used as would be appreciated. In some implementations of the invention, the width of grooves 3310 may be greater than 10 nm. In some implementations of the invention and as illustrated in FIG. 33, the depth of grooves 3310 may be less than a full thickness of ELR material 3210 of c-film 3200. In some implementations of the invention and as illustrated in FIG. 34, the depth of grooves 3310 may be substantially equal to the thickness of ELR material 3210 of c-film 3200. In some implementations of the invention, the depth of grooves 3310 may extend through ELR material 3210 of c-film 3200 and into substrate 3220 (not otherwise illustrated). In some implementations of the invention, the depth of grooves 3310 may correspond to a thickness of one or more units of ELR material 3210 (not otherwise illustrated). Grooves 3310 may be formed in primary surface 3230 using various techniques, such as, but not limited to, laser etching, or other techniques.

In some implementations of the invention, the length of grooves 3310 may correspond to the full length of c-film 3200. In some implementations of the inventions, grooves 3310 are substantially parallel to one another and to principal axis 3240. In some implementations of the invention, grooves 3310 may take on various configurations and/or arrangements in accordance with the various aspects of the invention. For example, grooves 3310 may extend in any manner and/or direction and may include lines, curves and/or other geometric shapes in cross-section with varying sizes and/or shapes along its extent.

While various aspects of the invention are described as forming grooves 3310 within primary surface 3230, it will be appreciated that bumps, angles, or protrusions that include appropriate surfaces of ELR material 3210 may be formed on substrate 3220 to accomplish similar geometries.

According to various implementations of the invention, c-film 3200 may be modified to form various modified c-films. For example, referring to FIG. 35, a modifying material 3520 (i.e., modifying material 1020, modifying material 1380) may be layered onto primary surface 3230 and into grooves 3310 formed within primary surface 3230 of an unmodified c-film (e.g., c-film 3200) and therefore onto various appropriate surfaces 3510 to form a modified c-film 3500. Appropriate surfaces 3510 may include any appropriate surfaces discussed above. While appropriate surfaces 3510 are illustrated in FIG. 35 as being perpendicular to primary surface 3230, this is not necessary as would be appreciated from this description.

Figure 35:
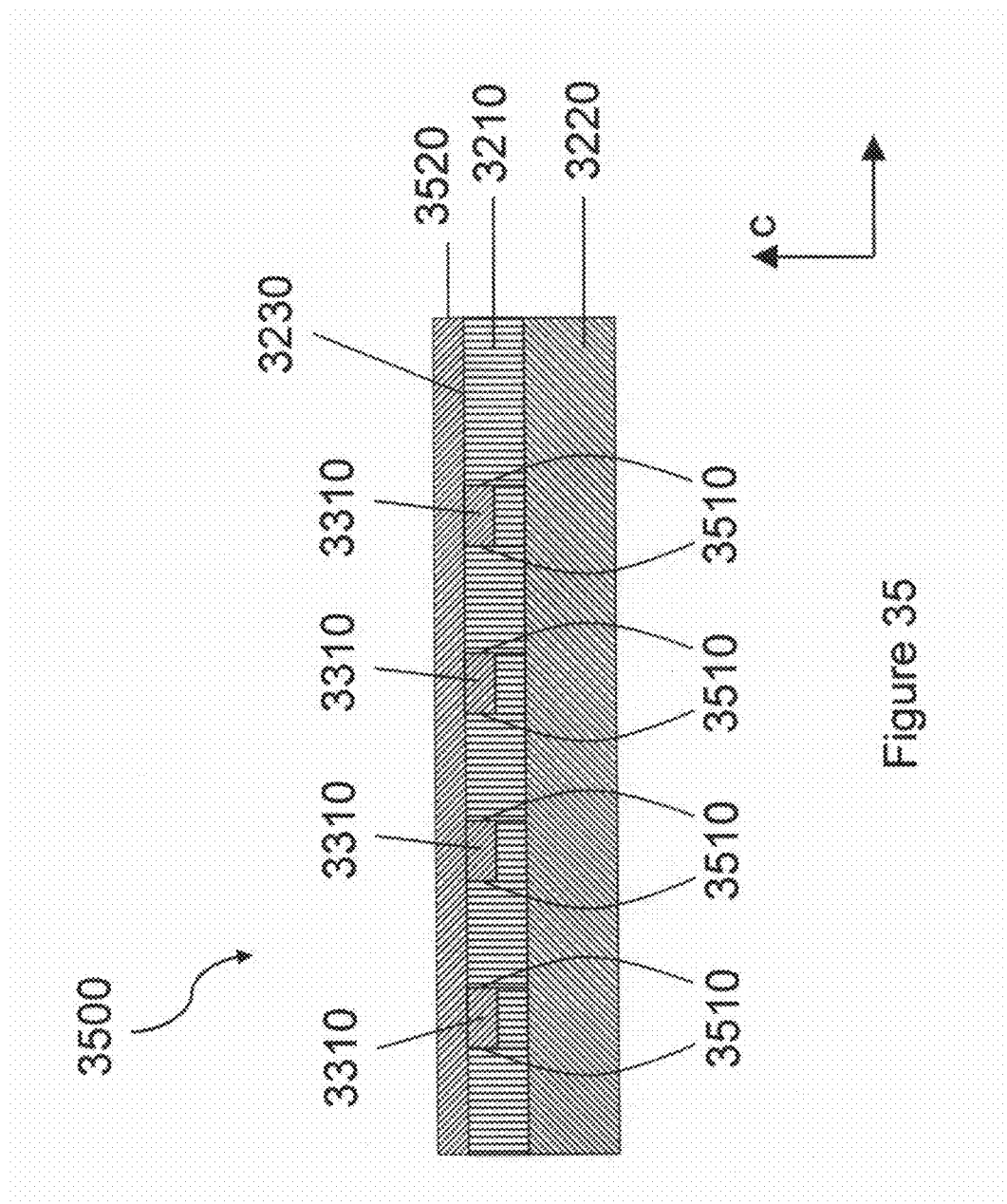
FIG. 35 illustrates a modifying material layered onto appropriate surfaces of ELR material according to various implementations of the invention.
Figure 36:
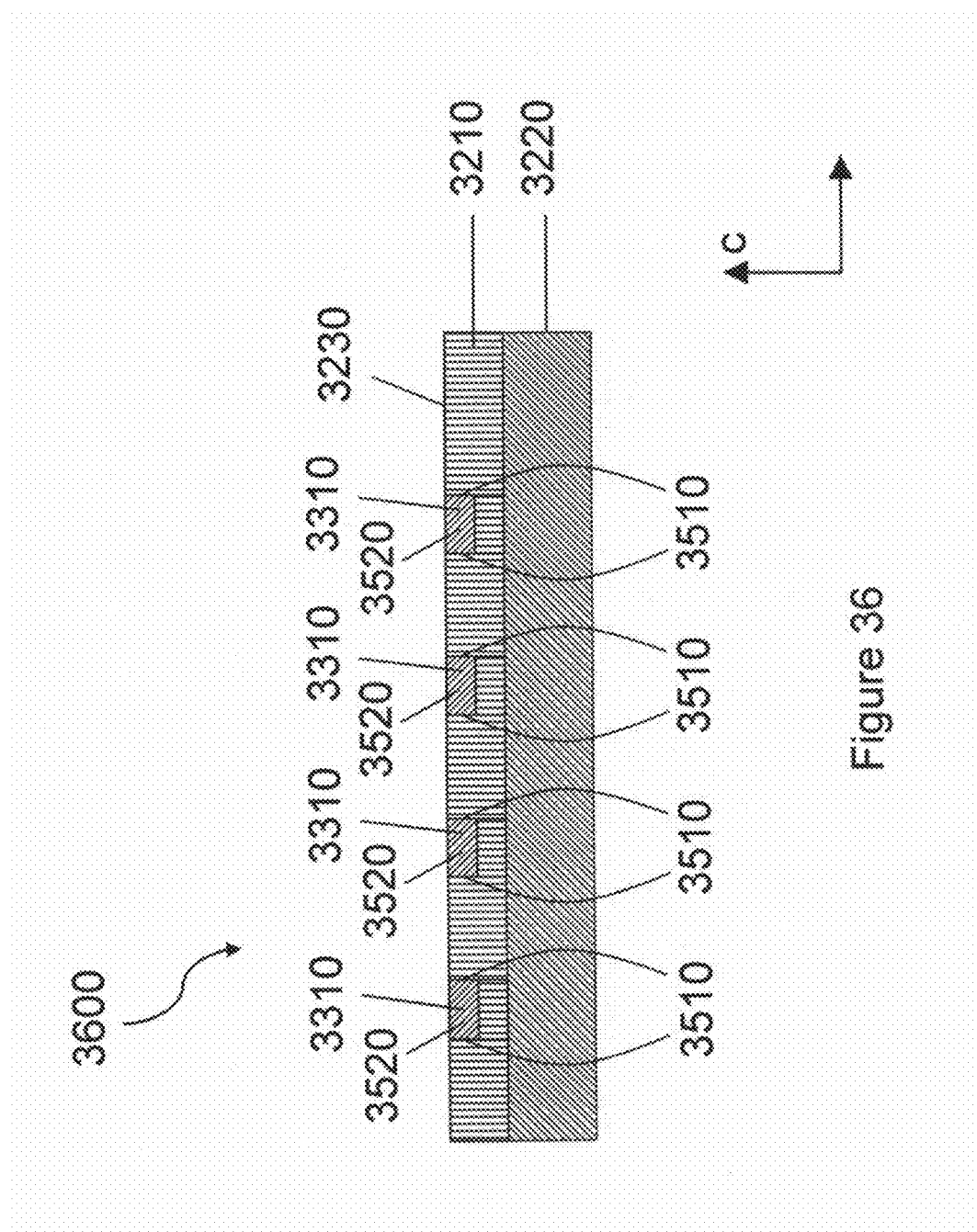
FIG. 36 illustrates a modifying material layered onto appropriate surfaces of ELR material according to various implementations of the invention.

In some implementations of the invention, modifying material 3520 may be layered onto primary surface 3230 and into grooves 3310 as illustrated in FIG. 35. In some implementations, such as illustrated in FIG. 36, modifying material 3520 may be removed from primary surface 3230 to form modified c-film 3600 using various techniques such that modifying material 3520 remains only in grooves 3310 (e.g., various polishing techniques). In some implementations, modified c-film 3600 may be accomplished by layering modifying material 3520 only in grooves 3310. In other words, in some implementations, modifying material 3520 may be layered only into grooves 3310 and/or onto appropriate surfaces 3510, without layering modifying material 3520 onto primary surface 3230 or may be layered such that modifying material 3520 does not bond or otherwise adhere to primary surface 3230 (e.g., using various masking techniques). In some implementations of the invention, various selective deposition techniques may be employed to layer modifying material 3520 directly onto appropriate surfaces 3510.

The thickness of modifying material 3520 in grooves 3310 and/or on primary surface 3230 may vary according to various implementations of the invention. In some implementations of the invention, a single unit layer of modifying material 3520 (i.e., a layer having a thickness substantially equal to a single unit of modifying material 3520) may be layered onto appropriate surfaces 3510 of grooves 3310 and/or on primary surface 3230. In some implementations of the invention, two or more unit layers of modifying material 3520 may be layered into onto appropriate surfaces 3510 of grooves 3310 and/or on primary surface 3230.

Modified c-films 3500, 3600 (i.e., c-film 3200 modified with modifying material 3520) in accordance with various implementations of the invention may be useful for achieving one or more improved operational characteristics over those of unmodified c-film 3200.

Figure 37:
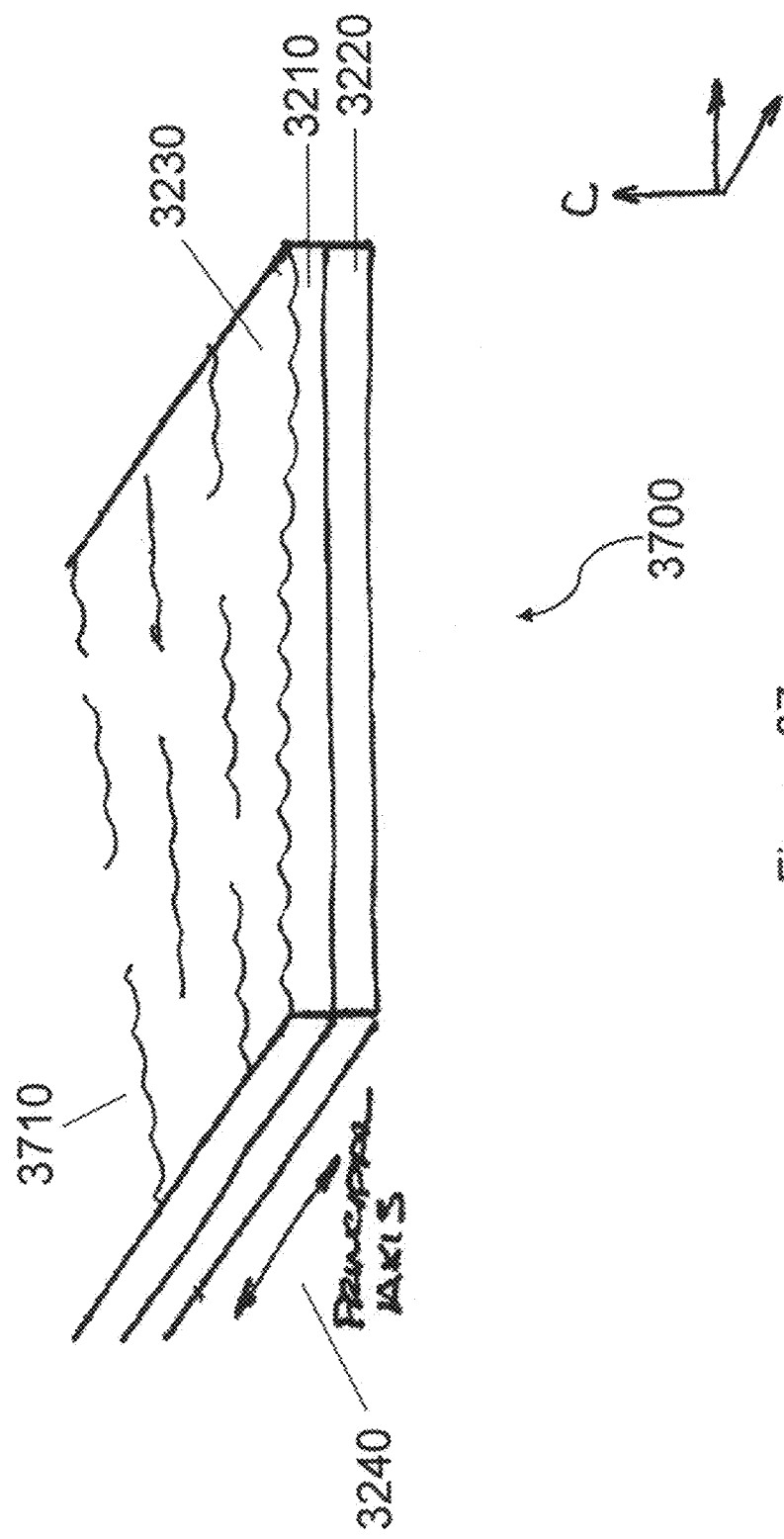
FIG. 37 illustrates a c-film with an etched surface including appropriate surfaces of ELR material according to various implementations of the invention.

As illustrated in FIG. 37, in some implementations of the invention, primary surface 3230 of unmodified c-film 3200 may be modified, via a chemical etch, to expose or otherwise increase an area of appropriate surfaces 3510 available on primary surface 3230. In some implementations of the invention, one manner of characterizing an increased area of appropriate surfaces 3510 within primary surface 3230 may be based on the root mean square (RMS) surface roughness of primary surface 3230 of c-film 3200. In some implementations of the invention, as a result of chemical etching, primary surface 3230 of c-film 3200 may include an etched surface 3710 having a surface roughness in a range of about 1 nm to about 50 nm. RMS surface roughness may be determined using, for example, Atomic Force Microscopy (AFM), Scanning Tunneling Microscopy (STM), or SEM and may be based on a statistical mean of an R-range, wherein the R-range may be a range of the radius (r) of a grain size as would be appreciated. After the chemical etch, an etched surface 3710 of c-film 3700 may correspond to appropriate surface 3510 of ELR material 3210.

Figure 38:
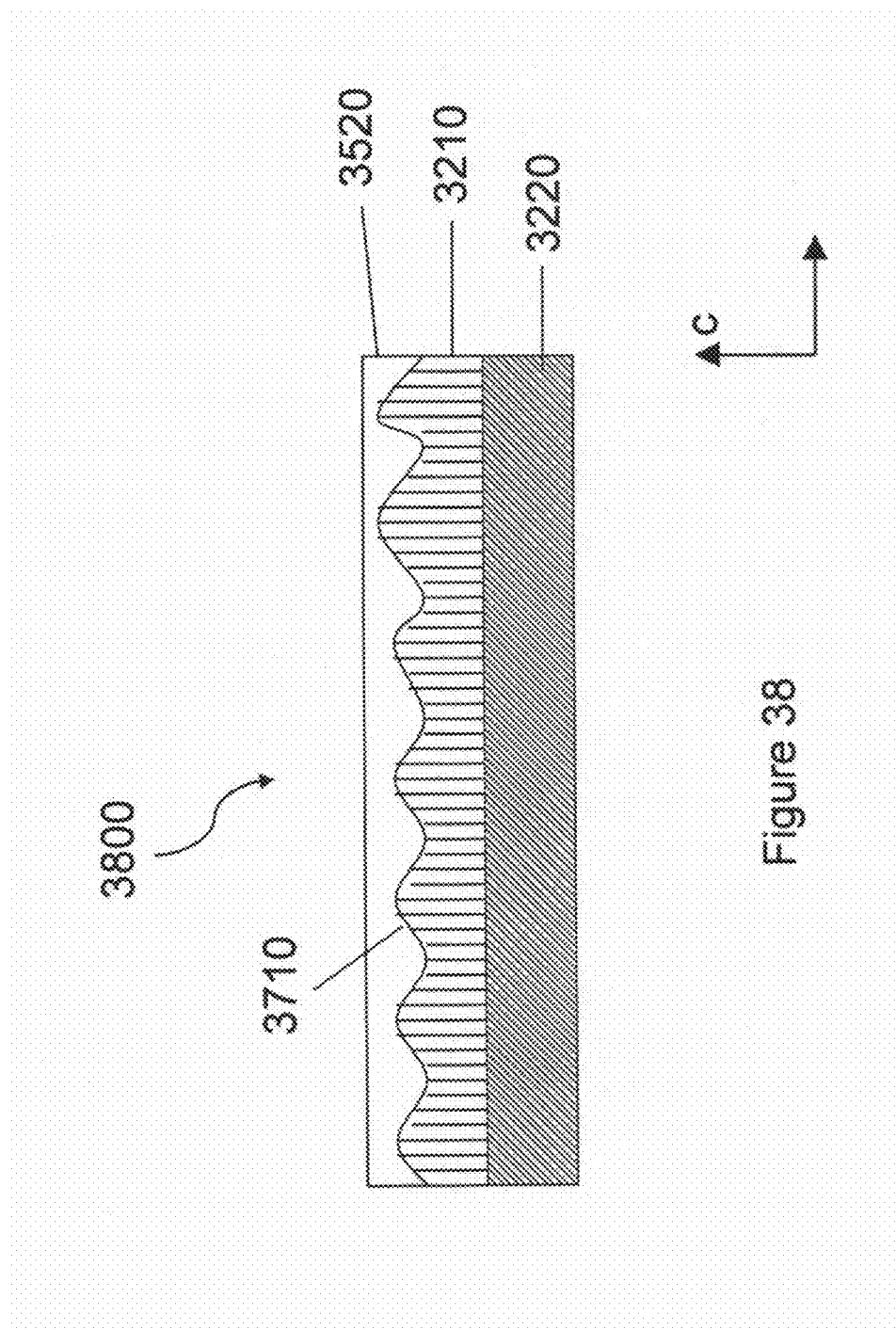
FIG. 38 illustrates a modifying material layered onto an etched surface of a c-film with appropriate surfaces of ELR material according to various implementations of the invention.

As illustrated in FIG. 38, after the chemical etch, modifying material 3520 may be layered on to etched surface 3710 of c-film 3700 to form a modified c-film 3800. Modifying material 3520 may cover substantially all of surface 3710 and the thickness of modifying material 3520 may vary in accordance with various implementations of the invention. In some implementations of the invention, a single unit layer of modifying material 3520 may be layered onto etched surface 3710. In some implementations of the invention, two or more unit layers of modifying material 3520 may be layered onto etched surface 3710.

Figure 39:
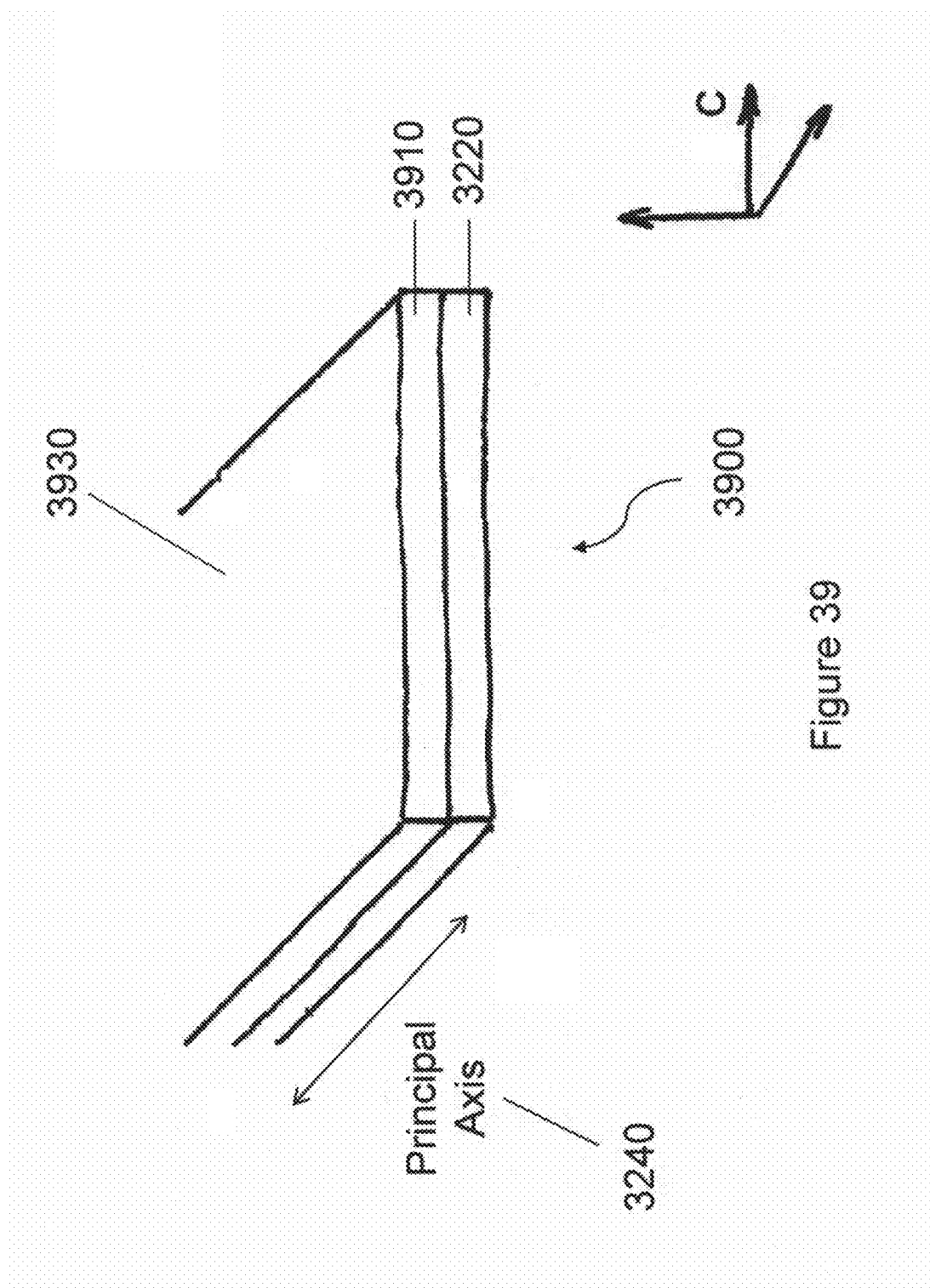
FIG. 39 illustrates an a-b film, including an optional substrate, with appropriate surfaces of ELR material according to various implementations of the invention.

In some implementations of the invention, films having orientations of crystalline structure of ELR material other than that of c-film 3200 may be used. For example, in reference to FIG. 39, and according to various implementations of the invention, instead of the c-axis oriented perpendicular to primary surface 3230 as with c-film 3200, a film 3900 may have the c-axis oriented perpendicular to the principal axis 3240 and a b-axis of ELR material 3910 oriented perpendicular to primary surface 3230. Similarly, a film 3900 may have the c-axis oriented perpendicular to the principal axis 3240 and an a-axis of ELR material 3910 oriented perpendicular to primary surface 3230. In some implementations of the invention, film 3900 may have the c-axis oriented perpendicular to the principal axis 3240 and any line parallel to the c-plane oriented along principal axis 3240. As illustrated in FIG. 39, in these implementations of the invention, film 3900 includes ELR material 3910 with the c-axis of its crystalline structure oriented perpendicular to principal axis 3240 and parallel to a primary surface 3930 and are generally referred to herein as a-b films 3900. While FIG. 39 illustrates the other two axes of the crystalline structure in a particular orientation, such orientation is not necessary as would be appreciated. As illustrated, a-b films 3900 may include an optional substrate 3220 (as with c-films 3200).

In some implementations of the invention, a-b film 3900 is an a-film, having the c-axis of the crystalline structure of ELR material 3910 oriented as illustrated in FIG. 39 and the a-axis perpendicular to primary surface 3930. Such a-films may be formed via various techniques including those described at Selvamanickam, V., et al., "High Current Y—Ba—Cu—O Coated Conductor using Metal Organic Chemical Vapor Deposition and Ion Beam Assisted Deposition," *Proceedings of the* 2000 *Applied Superconductivity Conference*, Virginia Beach, Virginia, Sep. 17-22, 2000, which is incorporated herein by reference in its entirety. In some implementations, a-films may be grown on substrates 3220 formed of the following materials: LGSO, $LaSrAlO_4$, $NdCaAlO_4$, $Nd_2CuO_4$, or $CaNdAlO_4$. Other substrate materials may be used as would be appreciated.

In some implementations of the invention, a-b film 3900 is a b-film, having the c-axis of the crystalline structure of ELR material 3910 oriented as illustrated in FIG. 39 and the b-axis perpendicular to primary surface 3930.

Figure 40:
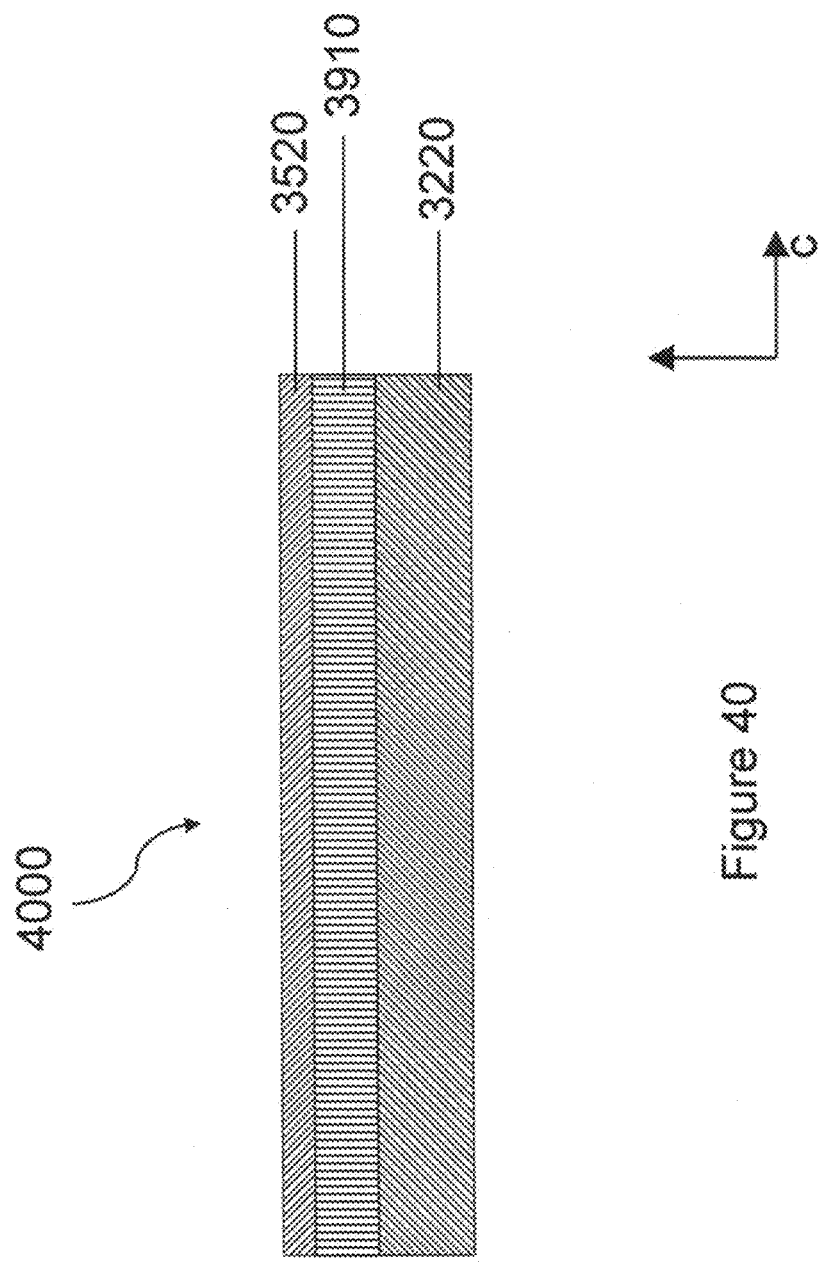
FIG. 40 illustrates a modifying material layered onto appropriate surfaces of ELR material of an a-b film according to various implementations of the invention.

According to various implementations of the invention, primary surface 3930 of a-b film 3900 corresponds to an appropriate surface 3510. In some implementations that employ a-b film 3900, forming an appropriate surface of ELR material 3910 may include forming a-b film 3900. Accordingly, for implementations of the invention that include a-b film 3900, modifying material 3520 may be layered onto primary surface 3930 of a-b film 3900 to create a modified a-b film 4000 as illustrated in FIG. 40. In some implementations of the invention, modifying material 3520 may cover primary surface 3930 of a-b film 3900 in whole or in part. In some implementations of the invention, the thickness of modifying material 3520 may vary as discussed above. More particularly, in some implementations of the invention, a single unit layer of modifying material 3520 may be layered onto primary surface 3930 of a-b film 3900; and in some implementations of the invention, two or more unit layers of modifying material 3520 may be layered onto primary surface 3930 of a-b film 3900. In some implementations of the invention, a-b film 3900 may be grooved or otherwise modified as discussed above with regard to c-film 3200, for example, to increase an overall area of appropriate surfaces 3510 of ELR material 3910 on which to layer modifying material 3520.

As would be appreciated, rather than utilizing a-b film 3900, some implementations of the invention may utilize a layer of ELR material 3210 having its crystalline structure oriented in a manner similar to that of a-b film 3900.

In some implementations of the invention (not otherwise illustrated) a buffer or insulating material may be subsequently layered onto modifying material 3520 of any of the aforementioned films. In these implementations, the buffer or insulating material and the substrate form a "sandwich" with ELR material 3210, 3910 and modifying material 3520 there between. The buffer or insulating material may be layered onto modifying material 3520 as would be appreciated.

Any of the aforementioned materials may be layered onto any other material. For example, ELR materials may be layered onto modifying materials. Likewise, modifying materials may be layered onto ELR materials. Further, layering may include combining, forming, or depositing one material onto the other material as would be appreciated. Layering may use any generally known layering technique, including, but not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering technique.

Figure 41:
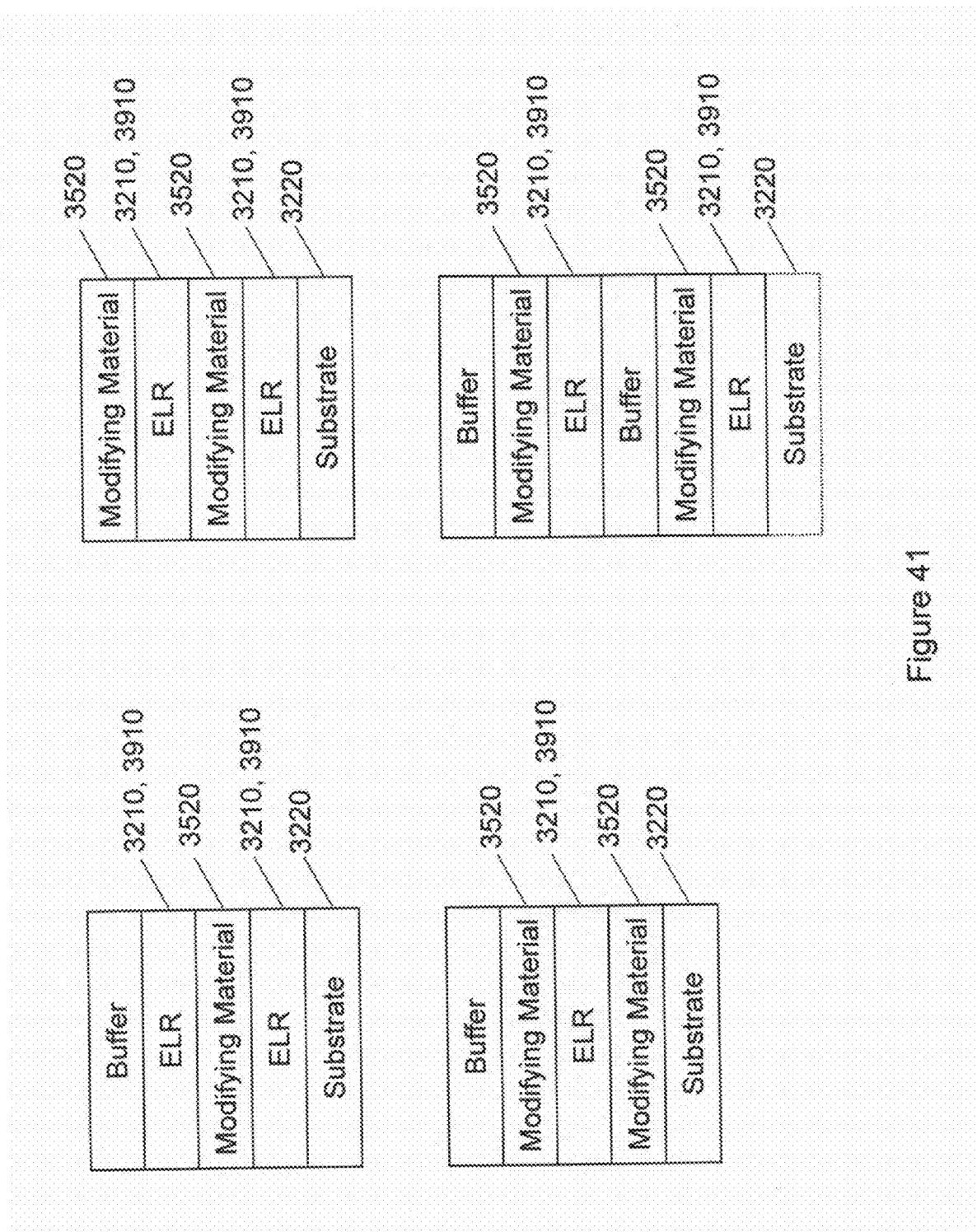
FIG. 41 illustrates various exemplary arrangements of layers of ELR material, modifying material, buffer or insulating layers, and/or substrates in accordance with various implementations of the invention.

Multiple layers of ELR material 3210, 3910, modifying material 3520, buffer or insulating layers, and/or substrates 1120 may be arranged in various implementations of the invention. FIG. 41 illustrates various exemplary arrangements of these layers in accordance with various implementations of the invention. In some implementations, a given layer may comprise a modifying material 3520 that also acts as a buffer or insulating layer or a substrate. Other arrangements or combinations of arrangements may be used as would be appreciated from reading this description. Furthermore, in some implementations of the invention, various layers of ELR material may have different orientations from one another in a given arrangement. For example, one layer of ELR material in an arrangement may have the a-axis of its crystalline structure oriented along the principal axis 3240 and another layer of the ELR material in the arrangement may have the b-axis of its crystalline structure oriented along the principal axis 3240. Other orientations may be used within a given arrangement in accordance with various implementations of the invention.

Figure 42:
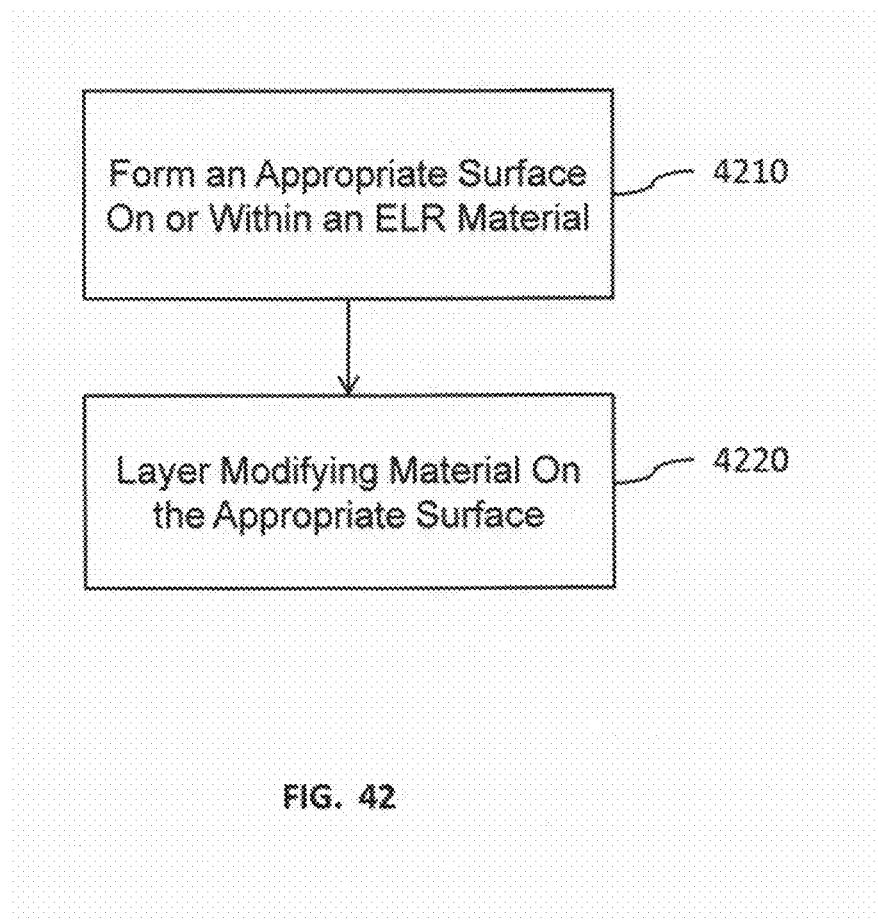
FIG. 42 illustrates a process for forming a modified ELR material according to various implementations of the invention.

FIG. 42 illustrates a process for creating a modified ELR material according to various implementations of the invention. In an operation 4210, an appropriate surface 3510 is formed on or within an ELR material. In some implementations of the invention where ELR material exists as ELR material 3210 of c-film 3200, appropriate surface 3510 is formed by exposing appropriate surface(s) 3510 on or within primary surface 3230 of a c-film 3200. In some implementations of the invention, appropriate surfaces of ELR material 3210 may be exposed by modifying primary surface 3230 using any of the wet or dry processing techniques, or combinations thereof, discussed above. In some implementations of the invention, primary surface 3230 may be modified by chemical etching as discussed above.

In some implementations of the invention where ELR material exists as ELR material 3910 of a-b film 3900 (with or without substrate 3220), appropriate surface 3510 is formed by layering ELR material 3910 (in a proper orientation as described above) onto a surface, which may or may not include substrate 3220.

In some implementations of the invention, appropriate surfaces 3510 include surfaces of ELR material parallel to the ab-plane. In some implementations of the invention, appropriate surfaces 3510 include faces of ELR material parallel to the b-plane. In some implementations of the invention, appropriate surfaces 3510 include faces of ELR material parallel to the a-plane. In some implementations of the invention, appropriate surfaces 3510 include one or more faces of ELR material parallel to different ab-planes. In some implementations of the invention, appropriate surfaces 3510 include one or more faces not substantially perpendicular to the c-axis of ELR material.

In some implementations of the invention, various optional operations may be performed. For example, in some implementations of the invention, appropriate surfaces 3510 or ELR material may be annealed. In some implementations of the invention, this annealing may be a furnace anneal or a rapid thermal processing (RTP) anneal process. In some implementations of the invention, such annealing may be performed in one or more annealing operations within predetermined time periods, temperature ranges, and other parameters. Further, as would be appreciated, annealing may be performed in the chemical vapor deposition (CVD) chamber and may include subjecting appropriate surfaces 3510 to any combination of temperature and pressure for a predetermined time which may enhance appropriate surfaces 3510. Such annealing may be performed in a gas atmosphere and with or without plasma enhancement.

In an operation 4220, modifying material 3520 may be layered onto one or more appropriate surfaces 3510. In some implementations of the invention, modifying material 3520 may be layered onto appropriate surfaces 3510 using various layering techniques, including various ones described above.

Figure 43:
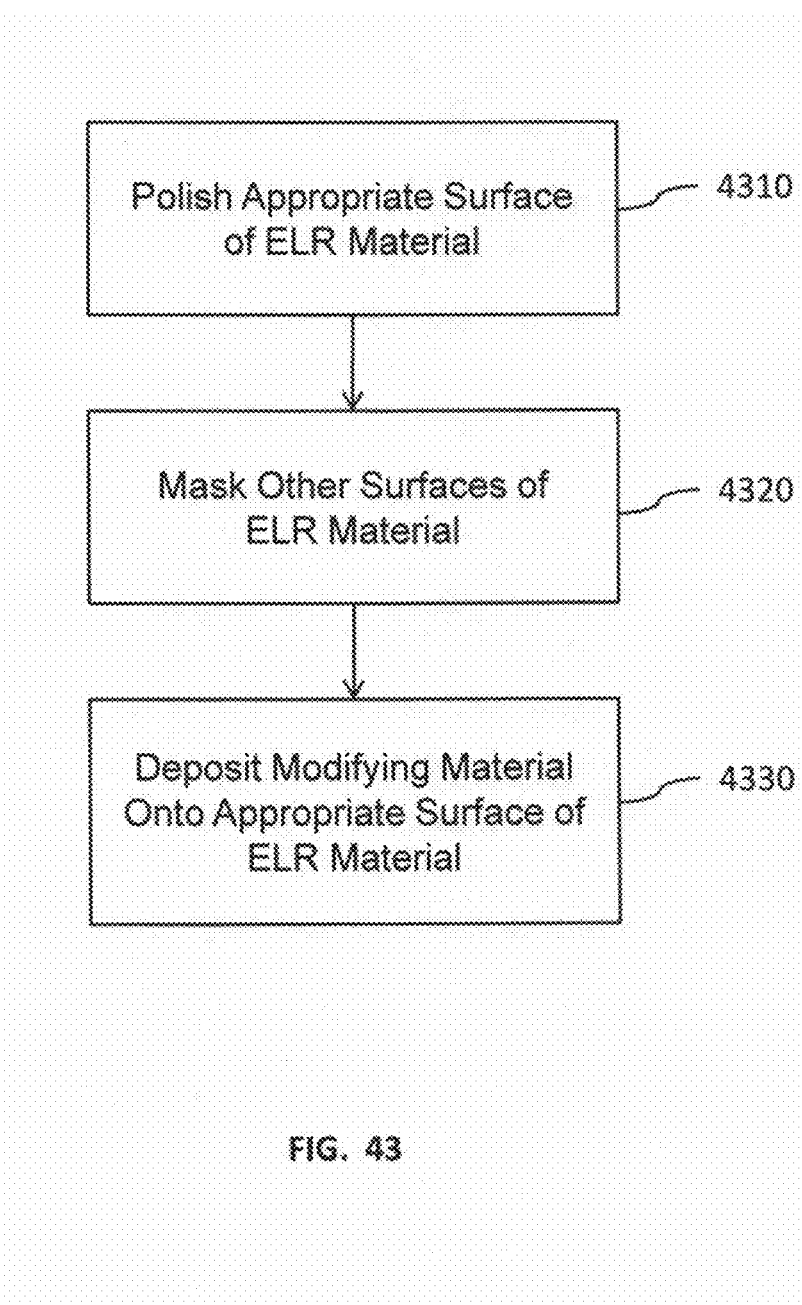
FIG. 43 illustrates an example of additional processing that may be performed according to various implementations of the invention.

FIG. 43 illustrates an example of additional processing that may be performed during operation 4220 according to various implementations of the invention. In an operation 4310, appropriate surfaces 3510 may be polished. In some implementations of the invention, one or more polishes may be used as discussed above.

In an operation 4320, various surfaces other than appropriate surfaces 3510 may be masked using any generally known masking techniques. In some implementations, all surfaces other than appropriate surfaces 3510 may be masked. In some implementations of the invention, one or more surfaces other than appropriate surfaces 3510 may be masked.

In an operation 4330, modifying material 3520 may be layered on to (or in some implementations and as illustrated in FIG. 43, deposited on to) appropriate surfaces 3510 using any generally known layering techniques discussed above. In some implementations of the invention, modifying material 3520 may be deposited on to appropriate surfaces 3510 using MBE. In some implementations of the invention, modifying material 3520 may be deposited on to appropriate surfaces 3510 using PLD. In some implementations of the invention, modifying material 3520 may be deposited on to appropriate surfaces 3510 using CVD. In some implementations of the invention, approximately 40 nm of modifying material 3520 may be deposited on to appropriate surfaces 3510, although as little as 1.7 nm of certain modifying materials 3520 (e.g., cobalt) has been tested. In various implementations of the invention, much smaller amounts of modifying materials 3250, for example, on the order of a few angstroms, may be used. In some implementation of the invention, modifying material 3520 may be deposited on to appropriate surfaces 3510 in a chamber under a vacuum, which may have a pressure of $5 \times 10^{-6}$ torr or less. Various chambers may be used including those used to process semiconductor wafers. In some implementations of the invention, the CVD processes described herein may be carried out in a CVD reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing MBE, PLD or CVD may be used.

Figure 44:
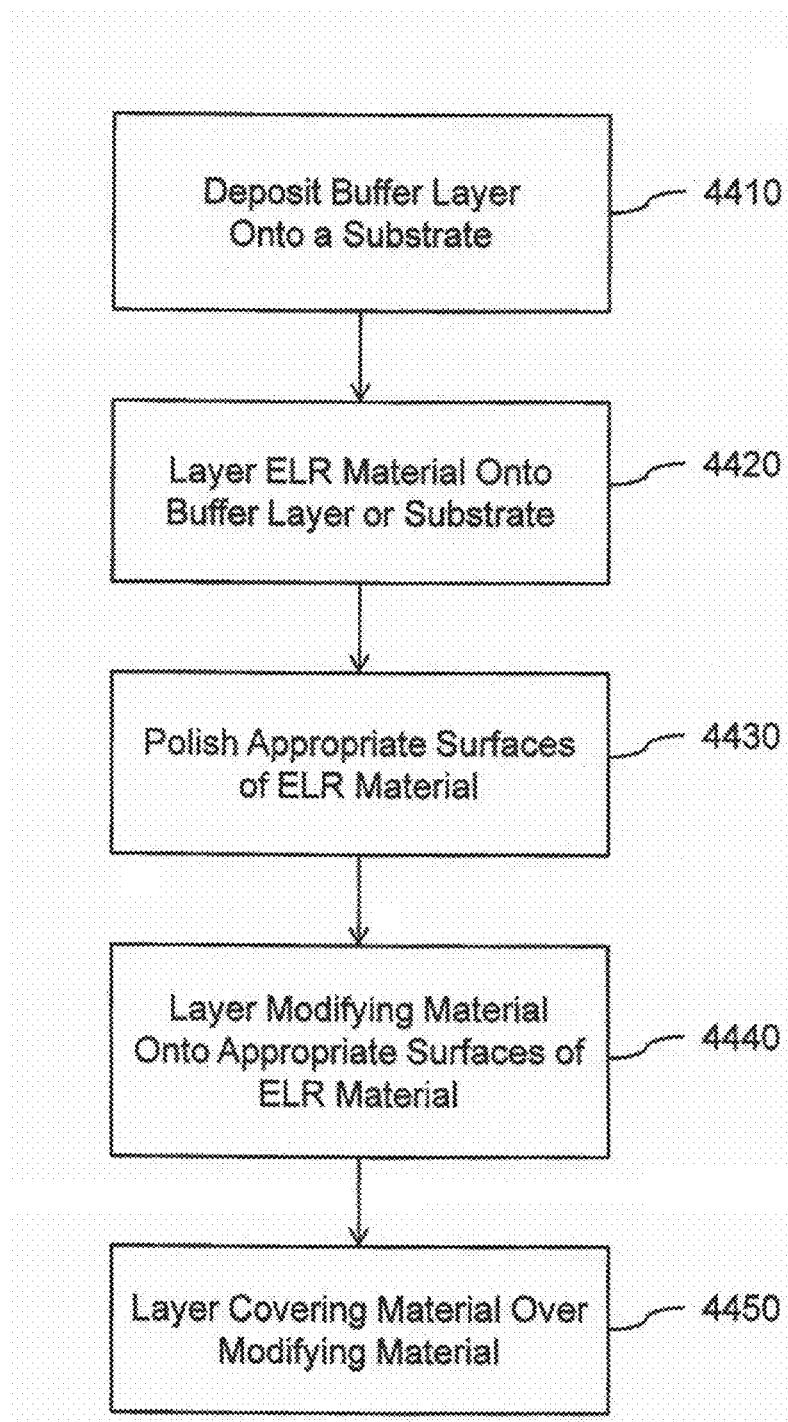
FIG. 44 illustrates a process for forming a modified ELR material according to various implementations of the invention.

FIG. 44 illustrates a process for forming a modified ELR material according to various implementations of the invention. In particular, FIG. 44 illustrates a process for forming and/or modifying an a-b film 3900. In an optional operation 4410, a buffer layer is deposited onto a substrate 3220. In some implementations of the invention, the buffer layer includes PBCO or other suitable buffer material. In some implementations of the invention, substrate 3220 includes LSGO or other suitable substrate material. In an operation 4420, ELR material 3910 is layered onto substrate 3220 with a proper orientation as described above with respect to FIG. 39. As would be appreciated, depending on optional operation 4410, ELR material 3910 is layered onto substrate 3220 or the buffer layer. In some implementations of the invention, the layer of ELR material 3910 is two or more unit layers thick. In some implementations of the invention, the layer of ELR material 3910 is a few unit layers thick. In some implementations of the invention, the layer of ELR material 3910 is several unit layers thick. In some implementations of the invention, the layer of ELR material 3910 is many unit layers thick. In some implementations of the invention, ELR material 3910 is layered onto substrate 3220 using an IBAD process. In some implementations of the invention, ELR material 3910 is layered onto substrate 3220 while subject to a magnetic field to improve an alignment of the crystalline structures within ELR material 3910.

In an optional operation 4430, appropriate surface(s) 3510 (which with respect to a-b films 3900, corresponds to primary surface 3930) of ELR material 3910 is polished using various techniques described above. In some implementations of the invention, the polishing is accomplished without introducing impurities onto appropriate surfaces 3510 of ELR material 3910. In some implementations of the invention, the polishing is accomplished without breaking the clean chamber. In an operation 4440, modifying material 3520 is layered onto appropriate surfaces 3510. In an optional operation 4450, a covering material, such as, but not limited to, silver, is layered over entire modifying material 3520.

The flowcharts, illustrations, and block diagrams of the figures illustrate the architecture, functionality, and operation of possible implementations of methods and products according to various implementations of the invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Furthermore, although the foregoing description is directed toward various implementations of the invention, it is noted that other variations and modifications will be apparent to those skilled in the art, and may be made without departing from the spirit or scope of the invention. Moreover, various features described in connection with one implementation of the invention may be used in conjunction or combination with various other features or other implementations described herein, even if not expressly stated above.

What is claimed is:

1. A method for improving operational characteristics of an ELR film, the ELR film comprising an ELR material having a crystalline structure, the method comprising:
   forming an appropriate surface on or within the ELR film, wherein the forming comprises layering the ELR material onto a substrate in a manner that orients a particular axis of the crystalline structure of the ELR material along a principal axis of the substrate, wherein the particular axis is a line within the c-plane of the crystalline structure of the ELR material;
   layering a modifying material onto the appropriate surface of the ELR film to create a modified ELR film, wherein the modified ELR film has improved operational characteristics over those of the ELR film without the modifying material.

2. The method of claim 1, wherein layering a modifying material onto an appropriate surface of the ELR film comprises depositing the modifying material onto the appropriate surface of the ELR material.

3. The method of claim 1, wherein layering a modifying material onto an appropriate surface of the ELR film comprises layering the modifying material onto a face of the ELR material that is not substantially parallel to a c-plane of the crystalline structure of the ELR material.

4. The method of claim 3, wherein layering a modifying material onto an appropriate surface of the ELR film comprises layering the modifying material onto a face of the ELR material that is parallel to an ab-plane of the crystalline structure of the ELR material.

5. The method of claim 4, wherein layering a modifying material onto appropriate surface of the ELR film comprises layering the modifying material onto a face of the ELR material that is parallel to an a-plane or a b-plane of the crystalline structure of the ELR material.

6. The method of claim 1, wherein layering a modifying material onto an appropriate surface of the ELR film comprises layering chromium, copper, bismuth, cobalt, vanadium, titanium, rhodium, beryllium, gallium, or selenium onto the appropriate surface of the ELR film.

7. The method of claim 1, wherein the particular axis is the a-axis or the b-axis.

8. The method of claim 7, wherein layering the ELR material onto a substrate comprises layering the ELR material onto MgO, $SrTiO_3$, $LaSrGaO_4$ or combinations thereof.

9. The method of claim 1, wherein the ELR material comprises a superconducting material.

10. The method of claim 9, wherein the superconducting material comprises a mixed-valence copper-oxide perovskite.

11. The method of claim 9, wherein the superconducting material comprises an iron pnictide or magnesium diboride.

12. A method for improving an operational characteristic of an ELR film, the ELR film having a principal axis longer than either of its other two axes, the ELR film having a primary surface having an area larger than either of its other orthogonal faces, the ELR film comprising an ELR material having a crystalline structure, the method comprising:
creating at least one groove in the primary surface of the ELR film, thereby exposing a face of the ELR material, the exposed face being a face parallel to an ab-plane of the crystalline structure of the ELR material; and
depositing a modifying material onto the exposed face.

13. The method of claim 12, wherein creating at least one groove in the primary surface of the ELR film comprises creating at least one groove having a depth substantially equal to a thickness of the ELR material.

14. The method of claim 12, wherein creating at least one groove in the primary surface of the ELR film comprises creating at least one groove having a depth less than a thickness of the ELR material.

15. The method of claim 12, wherein depositing a modifying material onto the exposed face comprises depositing a single unit layer of the modifying material onto the exposed face.

16. The method of claim 12, wherein depositing a modifying material onto the exposed face comprises depositing two or more unit layers of the modifying material onto the exposed face.

17. The method of claim 12, wherein the width of the at least one groove is greater than 10 nm.

18. The method of claim 12, wherein creating at least one groove in the primary surface of the ELR film comprises creating at least one groove in the primary surface of the film that is substantially in the direction of the principal axis of the ELR film.

19. A method for improving operational characteristics of an ELR film, the ELR film comprising an ELR material having a crystalline structure, the method comprising:
exposing an appropriate surface on or within the ELR film, wherein the exposing comprises etching a primary surface of the ELR film to increase a surface area of the primary surface;
layering a modifying material onto the appropriate surface of the ELR film to create a modified ELR film, wherein the modified ELR film has improved operational characteristics over those of the ELR film without the modifying material.

20. The method of claim 19, wherein layering a modifying material onto an appropriate surface of the ELR film comprises depositing the modifying material onto the appropriate surface of the ELR material.

21. The method of claim 19, wherein layering a modifying material onto an appropriate surface of the ELR film comprises layering the modifying material onto a face of the ELR material that is not substantially parallel to a c-plane of the crystalline structure of the ELR material.

22. The method of claim 21, wherein layering a modifying material onto an appropriate surface of the ELR film comprises layering the modifying material onto a face of the ELR material that is parallel to an ab-plane of the crystalline structure of the ELR material.

23. The method of claim 22, wherein layering a modifying material onto appropriate surface of the ELR film comprises layering the modifying material onto a face of the ELR material that is parallel to an a-plane or a b-plane of the crystalline structure of the ELR material.

24. The method of claim 19, wherein layering a modifying material onto an appropriate surface of the ELR film comprises layering chromium, copper, bismuth, cobalt, vanadium, titanium, rhodium, beryllium, gallium, or selenium onto the appropriate surface of the ELR film.

25. The method of claim 19, further comprising layering the ELR material onto a substrate comprised of MgO, $SrTiO_3$, $LaSrGaO_4$ or combinations thereof.

26. The method of claim 19, wherein etching comprises creating a pattern in a primary surface of the ELR film thereby exposing one or more appropriate surfaces of the ELR film.

27. The method of claim 26, wherein the creating comprises inscribing a groove in the primary surface of the ELR film.

28. The method of claim 27, wherein layering a modifying material onto an appropriate surface of the ELR film comprises depositing the modifying material into the groove.

29. The method of claim 19, wherein the ELR material comprises a superconducting material.

30. The method of claim 29, wherein the superconducting material comprises a mixed-valence copper-oxide perovskite.

31. The method of claim 29, wherein the superconducting material comprises an iron pnictide or magnesium diboride.

* * * * *